(12) United States Patent
Yamazaki et al.

(10) Patent No.: US 6,787,807 B2
(45) Date of Patent: Sep. 7, 2004

(54) SEMICONDUCTOR DEVICE

(75) Inventors: Shunpei Yamazaki, Tokyo (JP); Toru Mitsuki, Kanagawa-ken (JP); Kenji Kasahara, Kanagawa-ken (JP); Taketomi Asami, Kanagawa-ken (JP); Tamae Takano, Kanagawa-ken (JP); Takeshi Shichi, Kanagawa-ken (JP); Chiho Kokubo, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/882,265

(22) Filed: Jun. 18, 2001

(65) Prior Publication Data

US 2002/0038889 A1 Apr. 4, 2002

(30) Foreign Application Priority Data

Jun. 19, 2000 (JP) ...................................... 2000-183848
Mar. 1, 2001 (JP) ...................................... 2001-057201

(51) Int. Cl.$^7$ ......................... H01L 29/04; H01L 29/12; H01L 31/036

(52) U.S. Cl. .......................................... 257/65; 257/66

(58) Field of Search ............................. 257/55, 56, 64, 257/65, 66, 347, 627, 628

(56) References Cited

U.S. PATENT DOCUMENTS

| | | | |
|---|---|---|---|
| 4,766,477 A | 8/1988 | Nakagawa et al. | |
| 4,987,005 A | 1/1991 | Suzuki et al. | |
| 5,162,933 A | 11/1992 | Kakuda et al. | |
| 5,304,407 A | 4/1994 | Hayashi et al. | |

(List continued on next page.)

FOREIGN PATENT DOCUMENTS

| | | |
|---|---|---|
| EP | 0 984 317 A2 | 3/2000 |
| JP | 02-219234 A2 | 8/1990 |
| JP | 04-349619 A2 | 12/1992 |

(List continued on next page.)

OTHER PUBLICATIONS

AM–LCD 99—Jul. 14–16, 1999 Kogakuin University, Tokyo Japan; "Microtexture Analysis of Location Controlled Large Si Grain Formed by Excimer–Laser Crystallization Method" R. Ishihara et al.; pp. 99–102.

IEEE Electron Device Letters, pp. 160–162; vol. 17, No. 4, Apr. 1996 "Low Temperature Poly–Si Thin–Film Transistor Fabrication by Metal–Induced Lateral Crystallization" Seok–Woon Lee et al.

*Primary Examiner*—Thien F Tran
(74) *Attorney, Agent, or Firm*—Nixon Peabody LLP; Jeffrey L. Costellia

(57) ABSTRACT

The orientation of a crystalline semiconductor film obtained by crystallizing an amorphous semiconductor film is improved and a TFT formed from this crystalline semiconductor film is provided. In a semiconductor device whose TFT is formed from a semiconductor layer mainly containing silicon, the semiconductor layer has a channel formation region and an impurity region doped with an impurity of one type of conductivity. 20% or more of the channel formation region is the {101} lattice plane that forms an angle of equal to or less than 10 degree with respect to the surface of the crystalline semiconductor film, the plane being detected by an electron backscatter diffraction pattern method, 3% or less of the channel formation region is the {001} lattice plane that forms an angle of equal to or less than 10 degree with respect to the surface of the crystalline semiconductor film, 5% or less of the channel formation region is the {111} lattice plane that forms an angle of equal to or less than 10 degree with respect to the surface of the crystalline semiconductor film.

28 Claims, 31 Drawing Sheets

U.S. PATENT DOCUMENTS

| | | |
|---|---|---|
| 5,643,826 A | 7/1997 | Ohtani et al. |
| 5,686,980 A | 11/1997 | Hirayama et al. |
| 5,904,567 A | 5/1999 | Yamazaki |
| 5,923,962 A | 7/1999 | Ohtani et al. |
| 5,932,893 A | 8/1999 | Miyanaga et al. |
| 5,943,560 A | 8/1999 | Chang et al. |
| 5,977,560 A | 11/1999 | Banerjee et al. |
| 6,087,679 A * | 7/2000 | Yamazaki et al. ............ 257/65 |
| 6,107,639 A | 8/2000 | Yamazaki et al. |
| 6,107,654 A | 8/2000 | Yamazaki |
| 6,130,118 A | 10/2000 | Yamazaki |
| 6,180,957 B1 | 1/2001 | Miyasaka et al. |
| 6,285,042 B1 | 9/2001 | Ohtani et al. |
| 6,307,214 B1 | 10/2001 | Ohtani et al. |
| 6,307,220 B1 | 10/2001 | Yamazaki |
| 6,335,541 B1 | 1/2002 | Ohtani et al. |
| 6,348,368 B1 | 2/2002 | Yamazaki et al. |
| 2001/0014535 A1 | 8/2001 | Yamazaki |
| 2002/0008286 A1 | 1/2002 | Yamazaki et al. |
| 2002/0014625 A1 | 2/2002 | Asami et al. |
| 2002/0038889 A1 | 4/2002 | Yamazaki et al. |
| 2002/0043662 A1 | 4/2002 | Yamazaki et al. |

FOREIGN PATENT DOCUMENTS

| | | |
|---|---|---|
| JP | 07-130652 A | 5/1995 |
| JP | 08-078329 A | 3/1996 |
| JP | 11-204434 A2 | 7/1999 |
| JP | 11-284198 A2 | 10/1999 |
| JP | 11-307783 A2 | 11/1999 |
| JP | 11-345767 A2 | 12/1999 |
| TW | 251379 A | 7/1995 |
| TW | 310478 A | 7/1997 |

* cited by examiner

PLOTS OF ALL OF MEASUREMENT POINTS
IN MAPPING MEASURMENT

EXAMPLE OF TRANSLATING CONCENTRATION OF POINTS
OF FIG. 8A INTO CONTOUR

VIEW EXPLAINING FLUCTUATION OF <101> ORIENTATION OF CRYSTAL GRAIN

P ION IMPLANTATION

B DOPING

B DOPING

P-CHANNEL TFT 365    N-CHANNEL TFT 366

EEMOS CIRCUIT

EDMOS CIRCUIT

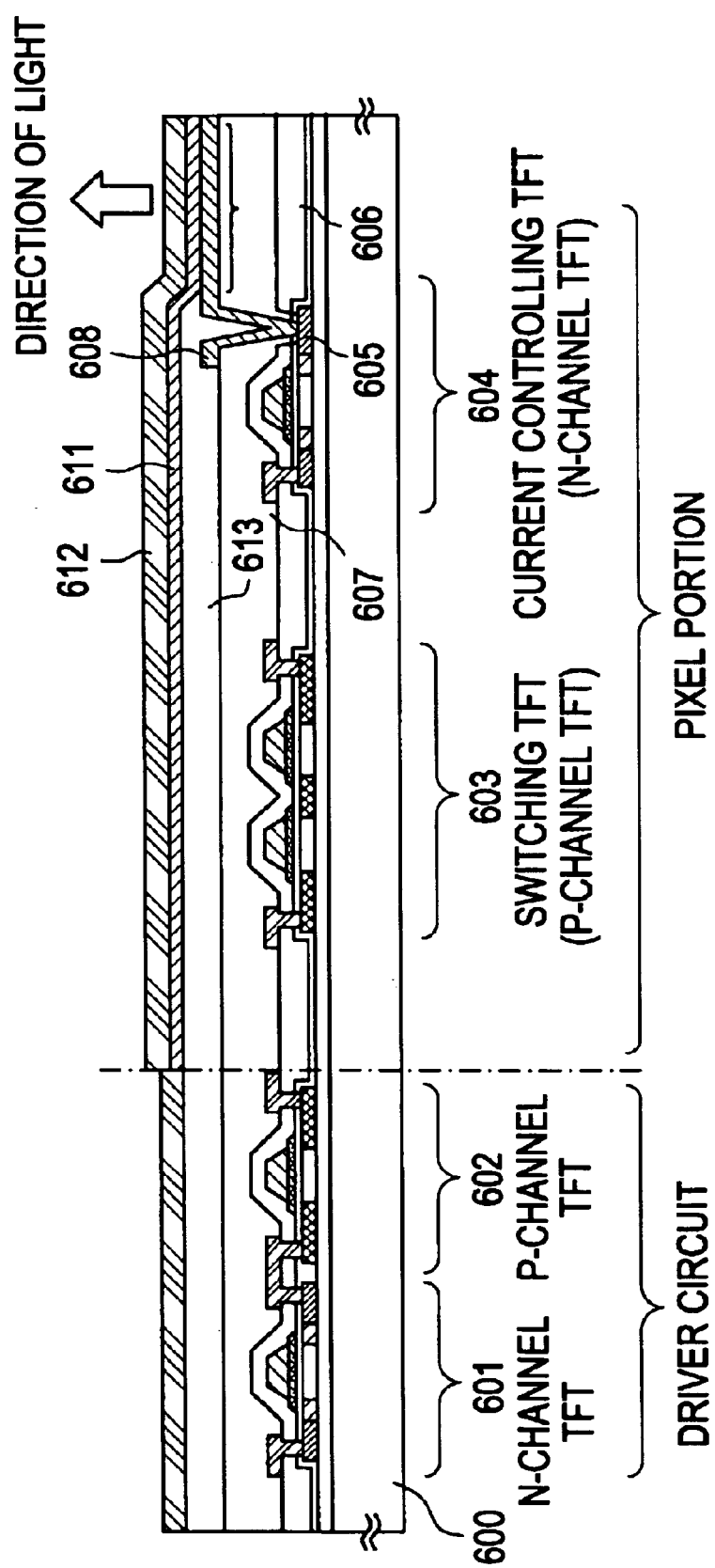

PROJECTING APPATUS (THREE PLATE TYPE)

LIGHT SOURCE OPTICAL SYSTEM

IN CASE OF FLAP ANGLE 0°

IN CASE OF FLAP ANGLE 60°

CRYSTALLIZATION

FORMATION OF BARRIER LATER AND
FORMATION OF SEMICONDUCTOR FILM

DOPING WITH NOBLE GAS

GETTERING

FORMATION OF SEMICONDUCTOR ISLAND

SEMICONDUCTOR DEVICE

BACKGROUND OF THE INVENTION

1. Field of the Invention

The present invent ion relates to a semiconductor device whose active region is formed from a semiconductor film constituted of a mass of crystals with various orientations (the film hereinafter is referred to as crystalline semiconductor film). Typical example of the crystalline semiconductor film is a polycrystalline silicon film. Specifically, the invention relates to a thin film transistor or a semiconductor device that has a circuit composed of the thin film transistor. The term semiconductor device herein refers to a device in general which utilizes semiconductor characteristics to function, and semiconductor integrated circuits, electro-optical devices and electronic equipment fall within this category.

2. Description of the Related Art

A technique has been developed to manufacture a thin film transistor (hereinafter referred to as TFT) from a crystalline semiconductor film with a thickness of several nm to several hundreds nm. TFTs are now established as practical switching elements for liquid crystal display devices, which has brought the recent success in forming a semiconductor integrated circuit on a glass substrate.

Silicon is a material of the crystalline semiconductor film that is suitable for a TFT. Used as this crystalline semiconductor film is a silicon film having a crystal structure (hereinafter referred to as crystalline silicon film). The crystalline silicon film is obtained by forming an amorphous silicon film on a glass or quarts substrate through deposition by plasma CVD or reduced pressure CVD and crystallizing the amorphous silicon film through heat treatment or laser light irradiation (will be called laser treatment in this specification).

When heat treatment is chosen, the amorphous silicon film has to be heated at a temperature of 600° C. or higher for 10 hours or longer to crystallize. Considering the productivity in manufacturing TFTs, it is difficult to say the method with the treatment temperature this high and the treatment time this long is a proper method. Taking a liquid crystal display device as an example of a product to which the TFTs are applied, a large-sized heat treatment furnace is required in order to accommodate the substrate as its surface area becomes larger. This not only increases energy consumption in manufacturing process but also makes it difficult to obtain uniform crystals over the large surface area. On the other hand, when laser treatment is chosen, obtaining crystals of uniform quality is still difficult because the output of a laser oscillator is not stable. The diversity in quality between crystals results in fluctuation in characteristic between TFTs, which in turn causes lowering of display quality of the liquid crystal display device or a display device whose pixel portion is composed of light emitting elements.

Another technique has been disclosed in which a metal element for promoting crystallization of silicon is introduced in an amorphous silicon film so that a crystalline silicon film is formed by heat treatment at a temperature lower than in the conventional heat treatment. For example, Japanese Patent Application Laid-open Nos. Hei 7-130652 and Hei 8-78329 show that a crystalline silicon film can be obtained by introducing a metal element such as nickel into an amorphous silicon film and heating the film at 550° C. for four hours.

However, a TFT manufactured by using the thus formed crystalline silicon film is still inferior in characteristics to a MOS transistor comprised of a single crystal silicon substrate. If a semiconductor film with a thickness of several nm to several hundreds nm is subjected to crystallization process on a material different from the film, such as glass or quartz, only a polycrystalline structure composed of masses of plural crystal grains is obtained. In the polycrystalline structure, carriers are trapped by an infinite number of defects found in crystal grains and in grain boundaries to limit the performance of the TFT.

In the crystalline silicon film formed by the above method of prior art, crystal orientation planes are arranged at random and the orientation ratio of a specific crystal orientation is low. The crystalline silicon film obtained by heat treatment or laser treatment has plural crystal grains deposited and tends to orient in {111} orientation, although the ratio of that part that is oriented to the {111} plane to the entire film does not exceed 20%.

When the orientation ratio is low, it is nearly impossible to keep the continuity of lattice in the grain boundaries where crystals of different orientations meet, and hence many dangling bonds will presumably be generated. The dangling bonds generated in the grain boundaries work as trap centers for carriers (electrons and holes) to degrade the carrier transportation characteristic. To elaborate, carriers are scattered or trapped in such film and the crystalline semiconductor film with scattered or trapped carriers is not expected to turn into a TFT that is high in field effect mobility. Furthermore, grain boundaries are arranged at random, meaning that a channel formation region cannot be formed from crystal grains of a specific crystal orientation. This can cause fluctuation in electric characteristics of TFTs.

SUMMARY OF THE INVENTION

The present invention has been made to solve the above problems and an object of the present invention is to improve the orientation of a crystalline semiconductor film obtained by crystallizing an amorphous semiconductor film and to provide a TFT formed from the crystalline semiconductor film.

In order to solve the above problems, according to a structure of the present invention, there is provided a semiconductor device having a thin film transistor formed of a crystalline semiconductor film that contains silicon as its main ingredient and germanium, characterized in that:

the crystalline semiconductor film has a channel formation region and an impurity region that is doped with an impurity of one type of conductivity;

20% or more of the channel formation region is the {101} lattice plane that forms an angle of equal to or less than 10 degree with respect to the surface of the crystalline semiconductor film, the plane being detected by an electron backscatter diffraction pattern method;

3% or less of the channel formation region is the {001} lattice plane that forms an angle of equal to or less than 10 degree with respect to the surface of the crystalline semiconductor film;

5% or less of the channel formation region is the {111} lattice plane that forms an angle of equal to or less than 10 degree with respect to the surface of the crystalline semiconductor film; and secondary ion mass spectroscopy is conducted on the channel formation region to reveal that the region contains less than $5 \times 10^{18}$ nitrogen atoms per $cm^3$, less than $5\times10^{18}$ carbon atoms per cm$^3$, and less than $1\times10^{19}$ oxygen atoms per cm$^3$.

Further, according to another structure of the present invention, there is provided a semiconductor device having a thin film transistor formed by doping an amorphous semiconductor film with a metal element and by subjecting it to heat treatment and laser treatment, the amorphous semiconductor film containing silicon as its main ingredient and germanium, characterized in that:

the crystalline semiconductor film has a channel formation region and an impurity region that is doped with an impurity of one type of conductivity;

20% or more of the channel formation region is the {101} lattice plane that forms an angle of equal to or less than 10 degree with respect to the surface of the crystalline semiconductor film, the plane being detected by an electron backscatter diffraction pattern method;

3% or less of the channel formation region is the {001} lattice plane that forms an angle of equal to or less than 10 degree with respect to the surface of the crystalline semiconductor film;

5% or less of the channel formation region is the {111} lattice plane that forms an angle of equal to or less than 10 degree with respect to the surface of the crystalline semiconductor film; and secondary ion mass spectroscopy is conducted on the channel formation region to reveal that the region contains less than $5\times10^{18}$ nitrogen atoms per cm$^3$, less than $5\times10^{18}$ carbon atoms per cm$^3$, and less than $1\times10^{19}$ oxygen atoms per cm$^3$.

Further, according to still another structure of the present invention, there is provided a semiconductor device whose pixel portion and driver circuit are formed on the same insulator, characterized in that:

thin film transistors in the pixel portion and in the driver circuit are all n-channel transistors;

each of the thin film transistors has a channel formation region formed of a crystalline semiconductor film that contains silicon as its main ingredient and germanium;

20% or more of the crystalline semiconductor film is the {101} lattice plane that forms an angle of equal to or less than 10 degree with respect to the surface of the crystalline semiconductor film, the plane being detected by an electron backscatter diffraction pattern method;

3% or less of the crystalline semiconductor film is the {001} lattice plane that forms an angle of equal to or less than 10 degree with respect to the surface of the crystalline semiconductor film;

5% or less of the crystalline semiconductor film is the {111) lattice plane that forms an angle of equal to or less than 10 degree with respect to the surface of the crystalline semiconductor film; and secondary ion mass spectroscopy is conducted on the crystalline semiconductor film to reveal that the film contains less than $5\times10^{18}$ nitrogen atoms per cm$^3$, less than $5\times10^{18}$ carbon atoms per cm$^3$, and less than $1\times10^{19}$ oxygen atoms per cm$^3$.

Moreover, according to still another structure of the present invention, there is provided a semiconductor device whose pixel portion and driver circuit are formed on the same insulator, characterized in that:

thin film transistors in the pixel portion and in the driver circuit are all p-channel transistors;

each of the thin film transistors has a channel formation region formed of a crystalline semiconductor film that contains silicon as its main ingredient and germanium;

20% or more of the crystalline semiconductor film is the {101} lattice plane that forms an angle of equal to or less than 10 degree with respect to the surface of the crystalline semiconductor film, the plane being detected by an electron backscatter diffraction pattern method;

3% or less of the crystalline semiconductor film is the {001} lattice plane that forms an angle of equal to or less than 10 degree with respect to the surface of the crystalline semiconductor film;

5% or less of the crystalline semiconductor film is the {111} lattice plane that forms an angle of equal to or less than 10 degree with respect to the surface of the crystalline semiconductor film; and secondary ion mass spectroscopy is conducted on the crystalline semiconductor film to reveal that the film contains less than $5\times10^{18}$ nitrogen atoms per cm$^3$, less than $5\times10^{18}$ carbon atoms per cm$^3$, and less than $1\times10^{19}$ oxygen atoms per cm$^3$.

Further, according to still another structure of the present invention, there is provided a semiconductor device whose pixel portion and driver circuit are formed on the same insulator, characterized in that:

the driver circuit is composed of an n-channel thin film transistor and a p-channel thin film transistor;

each of the n-channel and p-channel thin film transistors has a channel formation region formed of a crystalline semiconductor film that contains silicon as its main ingredient and germanium;

20% or more of the crystalline semiconductor film is the {101} lattice plane that forms an angle of equal to or less than 10 degree with respect to the surface of the crystalline semiconductor film, the plane being detected by an electron backscatter diffraction pattern method;

3% or less of the crystalline semiconductor film is the {001} lattice plane that forms an angle of equal to or less than 10 degree with respect to the surface of the crystalline semiconductor film;

5% or less of the crystalline semiconductor film is the 111} lattice plane that forms an angle of equal to or less than 10 degree with respect to the surface of the crystalline semiconductor film; and secondary ion mass spectroscopy is conducted on the crystalline semiconductor film to reveal that the film contains less than $5\times10^{18}$ nitrogen atoms per cm$^3$, less than $5\times10^{18}$ carbon atoms per cm$^3$, and less than $1\times10^{19}$ oxygen atoms per cm$^3$.

Furthermore, according to still another structure of the present invention, there is provided a semiconductor device whose pixel portion is formed on an insulator, characterized in that:

thin film transistors in the pixel portion each have a channel formation region formed of a crystalline semiconductor film that contains silicon as its main ingredient and germanium;

20% or more of the channel formation region is the {101} lattice plane that forms an angle of equal to or less than 10 degree with respect to the surface of the crystalline semiconductor film, the plane being detected by an electron backscatter diffraction pattern method;

3% or less of the channel formation region is the {001} lattice plane that forms an angle of equal to or less than 10 degree with respect to the surface of the crystalline semiconductor film;

5% or less of the channel formation region is the {111} lattice plane that forms an angle of equal to or less than 10 degree with respect to the surface of the crystalline semiconductor film; and secondary ion mass spectroscopy is conducted on the channel formation region to reveal that the region contains less than $5 \times 10^{18}$ nitrogen atoms per cm$^3$, less than $5 \times 10^{18}$ carbon atoms per cm$^3$, and less than $1 \times 10^{19}$ oxygen atoms per cm$^3$.

Besides, according to still another structure of the present invention, there is provided a semiconductor device whose pixel portion and driver circuit are formed on the same insulator, characterized in that:

the driver circuit includes a buffer composed of thin film transistors of one type of conductivity;

the buffer has a first one conductivity thin film transistor and a second one conductivity thin film transistor, the second one conductivity thin film transistor being connected to the first one conductivity thin film transistor in series and having as its gate a drain of the first one conductivity thin film transistor;

each of the first and second thin film transistors has a channel formation region formed of a crystalline semiconductor film that contains silicon as its main ingredient and germanium;

20% or more of the crystalline semiconductor film is the {101} lattice plane that forms an angle of equal to or less than 10 degree with respect to the surface of the crystalline semiconductor film, the plane being detected by an electron backscatter diffraction pattern method;

3% or less of the crystalline semiconductor film is the {001} lattice plane that forms an angle of equal to or less than 10 degree with respect to the surface of crystalline semiconductor film;

5% or less of the crystalline semiconductor film is the {111} lattice plane that forms an angle of equal to or less than 10 degree with respect to the surface of crystalline semiconductor film; and secondary ion mass spectroscopy is conducted on the crystalline semiconductor film to reveal that the film contains less than $5 \times 10^{18}$ nitrogen atoms per cm$^3$, less than $5 \times 10^{18}$ carbon atoms per cm$^3$, and less than $1 \times 10^{19}$ oxygen atoms per cm$^3$.

The crystalline semiconductor film used in the present invention is obtained by doping an amorphous semiconductor film that contains silicon as its main ingredient and germanium with a metal element and crystallizing the film through heat treatment, or through heat treatment plus laser light irradiation. The metal element to be used for the doping is one or more elements selected from the group consisting of Fe, Co, Ni, Ru, Rh, Pd, Os, Ir, Pt, Cu and Au. By doping the amorphous semiconductor film with the metal element(s) given above and then subjecting the film to heat treatment, a compound of silicon and the metal element(s) (silicide) is formed. The silicide diffuses throughout the film to advance crystallization.

At this point, germanium does not react with this compound but causes local distortion by merely existing around the compound. The distortion increases the critical radius of nuclear generation and, overall, acts to reduce the nuclear generation density. The distortion also works to limit orientation of crystals.

The concentration of germanium suitable for inducing such effects is found to be 0.1 atomic percent or more and 10 atomic percent or less, preferably 1 atomic percent or more and 5 atomic percent or less, as a result of experiments. When the concentration of germanium is higher than the above, natural nuclei as alloy materials of silicon and germanium are generated in a considerable number, making it impossible to raise the orientation ratio. (Natural nuclei are crystal nuclei generated not from the compound of silicon and the dopant metal element but from other compounds.) The germanium concentration lower than the above also cannot raise the orientation ratio because the distortions generated are not enough.

When an amorphous semiconductor film is crystallized, atoms are rearranged so that the volume of the film is reduced macroscopically. As a result, tensile stress is generated in the crystalline semiconductor film formed on the substrate. However, if the amorphous semiconductor film is doped with 0.1 to 10 atomic percent, preferably 1 to 5 atomic percent, of germanium that has an atomic radius larger than that of silicon, the volume shrinkage accompanying crystallization is reduced and the tensile stress to be generated is accordingly reduced. In short, doping with germanium in a given concentration can ease distortion in the crystalline semiconductor film.

The distribution of crystal orientation is obtained by electron backscatter diffraction pattern (hereinafter abbreviated as EBSP). EBSP is a method of analyzing the crystal orientation from backscatter of the primary electron by setting a dedicated detector in a scanning electron microscope. The measurement method by EBSP is illustrated in FIG. 6. An electron gun (Schottky type field emission electron gun) 101, a mirror 102 and a sample chamber 103 are structured in the same way as those in an ordinary scanning electron microscope. In EBSP measurement, a stage 104 is slanted about sixty degree and a sample 109 is placed thereon. A screen 105 of a detector 106 is inserted so as to face the sample in this state.

If an electron beam enters the sample having a crystal structure here, inelastic scattering takes place also in the rear. There can also be observed a linear pattern peculiar to the crystal orientation by Bragg diffraction in the sample (the pattern is commonly called a Kikuchi image). EBSP obtains the crystal orientation of the sample by analyzing the Kikuchi image projected onto the screen of the detector.

FIG. 7 shows a crystalline semiconductor film 122 having a polycrystalline structure and formed on a substrate 121. Having a polycrystalline structure means that crystal grains have crystal orientations different from one another. Information of the crystal orientation or orientation can be obtained for a planar sample by the mapping measurement in which the point the electron beam hits the sample is moved along and the orientation is analyzed every time the point moves. The thickness of the incident electron beam varies depending on the type of the electron gun attached to the scanning electron microscope. In the case of the Schottky field discharge type, the gun emits a very thin electron beam 123 with a diameter of 10 to 20 nm. The mapping measurement can provide more averaged information of the crystal orientation when the number of measurement points is greater and the area of the measurement range is wider. In a practical measurement, an area of 100×100 $\mu$m$^2$ is measured at about 10000 points (the distance between two points is 1 $\mu$m) to 40000 points (the distance between two points is 0.5 $\mu$m).

When the crystal orientation is obtained for all of the crystal grains from the mapping measurement, the crystal orientation state relative to the film can be expressed statistically. FIG. 8A shows an example of reverse pole diagram obtained by EBSP. A reverse pole diagram is often used to show the major orientation of a polycrystal, and it collectively illustrates correspondence between a specific face of the sample (here, the film surface) and a lattice plane.

The fan-shaped frame in FIG. 8A is the one generally called a standard triangle in which all indexes related to the cubic system are included. In FIG. 8A, the length corresponds to the angle in the crystal orientation. For instance, the distance between {001} and {101} is 45°, the distance between {101} and {111} is 35.26°, and the distance between {111} and {001} is 54.74°. The white dotted lines respectively indicate a range of offset angle of 5° and a range of offset angle of 10° relative to {101}.

FIG. 8A is obtained by plotting all of the measurement points (11655 points in this case) in the mapping measurement onto the standard triangle. The points are dense in the vicinity of {101}. FIG. 8B translates concentration of points of FIG. 8A into contour. This is an orientation distribution function values for expressing as contour the concentration (the density of the points in FIG. 8A) premised on random orientation. The numeric values here are scale factors (magnification) when assuming that the orientation of crystal grains is completely random, namely, when the points are evenly distributed throughout the standard triangle, and the values are dimensionless numbers.

If it is found that there is the major orientation toward a specific index (here, {101}), the level of the major orientation is easy to image when the quantity of crystal grains centered around the specific index is expressed in numeric values as above. For example, the orientation ratio is expressed by and obtained from the following equation when the orientation ratio is given as the ratio of the points present in the range of offset angle of 5° and the range of offset angle of 10° relative to {101} to the whole points in the reverse pole diagram of FIG. 8A shown as an example (the ranges are indicated by the white dotted lines in FIG. 8A).

{101} orientation ratio=(the number of the measured points within acceptable offset angle formed between {101} lattice plane and film surface)/(the number of the measured whole points) Equation 1

Alternatively, this ratio can be described as follows. When the points are distributed heavily around {101} as in FIG. 8A, it is expected in the actual film that the {101} orientation of the grains is substantially perpendicular to the substrate although there are some fluctuation in orientation as shown in FIG. 10. The acceptable error for the fluctuation angle is 5° and 10°. Then the number of crystal grains whose {101} orientation is smaller than the acceptable angle is counted to express the ratio of them in numeric values. For example, the {101} orientation of a certain crystal grain in FIG. 9 is not in the acceptable range of 5° but in the acceptable range of 10°. In obtaining data later in this specification, the acceptable offset angles are set to 5° and 10° and the ratio of crystal grains that fall within the acceptable ranges are calculated as described above.

In the reverse pole diagram shown as an example in FIG. 8A, the peaks respectively represent {101}, {111} and {001}, and the diagram shows that other plane orientations emerge when the offset angle with respect to {101} exceeds certain values. For example, the {112} orientation emerges when the offset angle with respect to {101} reaches 30°. Accordingly, when EBSP is used to determine the ratio of crystal orientations, it is necessary to set an acceptable offset angle for crystal grains that are distributed with fluctuation to such an angle as to exclude any possibility of erroneously counting other indexes in. Experientially, appropriate acceptable offset angle is 10° or less, or 5° or less. When data is collected with the acceptable offset angle set to the angle above, the ratio of crystal grains oriented in a specific orientation can be quantified.

BRIEF DESCRIPTION OF THE DRAWINGS

In the accompanying drawings:

FIG. 21 is a sectional structural view showing a driver circuit and a pixel portion of a display device in which the pixel portion is formed from light emitting elements;

DETAILED DESCRIPTION OF THE PREFERRED EMBODIMENTS

Figure 1A:
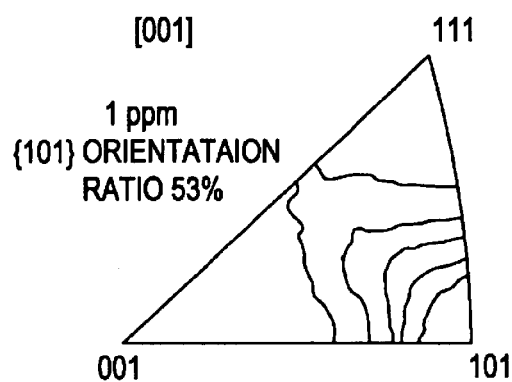
FIGS. 1A to 1D are reverse pole diagrams obtained by conducting an EBSP method on a crystalline semiconductor film of the present invention.
Figure 1B:
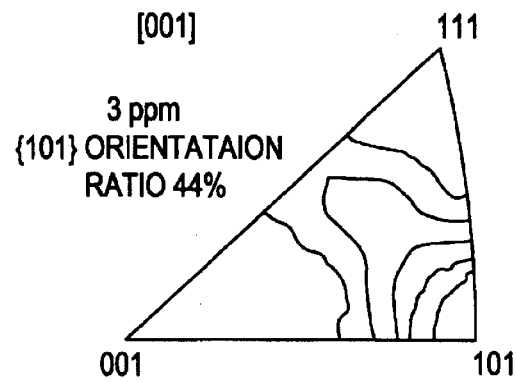
Figure 1C:
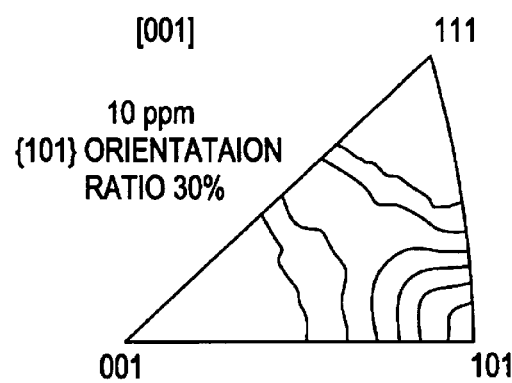
Figure 1D:
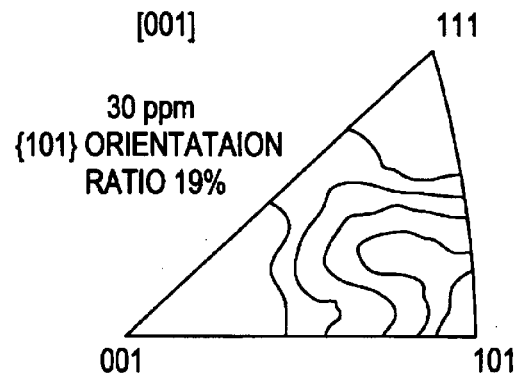

The present invention is characterized by forming a TFT from a crystalline semiconductor film in which the ratio of the {101} lattice plane orientation is high. The crystalline semiconductor film having a high {101} orientation ratio, which is to be formed on a substrate, is not obtained unless a specific semiconductor material is used. The specific semiconductor material mainly contains silicon and also contains 0.1 to 10 atomic percent (preferably 1 to 5 atomic percent) of germanium. A typical embodiment mode for obtaining the crystalline semiconductor film as such includes: preparing hydride gas, fluoride gas or chloride gas of silicon atom and germanium atom; forming an amorphous semiconductor film by plasma CVD or low pressure CVD with the prepared gas; introducing a metal element for promoting crystallization of the amorphous semiconductor film to the surface of the amorphous semiconductor film; and subjecting the film to heat treatment while utilizing the metal element to form a crystalline semiconductor film.

In the present invention, a substrate suitable for forming the crystalline semiconductor film thereon is a non-alkaline glass substrate such as alumina borosilicate substrate and a barium borosilicate substrate. Typically, a Corning #7059 glass substrate or a Corning #1737 glass substrate (product of Corning Incorporated) is used. A quartz substrate or a sapphire substrate may also be used. Alternatively, silicon, germanium, gallium, arsenic or other semiconductor substrate with an insulating film formed on its top surface may be used as the substrate.

If the above glass substrate is chosen as a substrate, a blocking layer is formed between the amorphous semiconductor film and the glass substrate from silicon nitride, silicon oxide, silicon oxynitride or the like. The blocking layer prevents an impurity element such as an alkaline metal element contained in the glass substrate from diffusing into the semiconductor film. For example, a silicon nitride film is formed by plasma CVD using $SiH_4$, $NH_3$ and $N_2$ as reaction gas. If a silicon oxynitride film is to be formed instead, $SiH_4$, $N_2O$ and $NH_3$ are used as reaction gas. The blocking layer is formed to a thickness of 20 to 200 nm.

The amorphous semiconductor film is formed by plasma CVD, low pressure CVD, or other appropriate method. When plasma CVD is employed, a reaction chamber is filled with reaction gas consisting of $SiH_4$ and $GeH_4$, or reaction gas consisting of $SiH_4$ and $GeH_4$ diluted with $H_2$. Then the substrate is brought in the reaction chamber and the reaction gas is decomposed through 1 to 200 MHz high frequency discharge to be deposited on the substrate as the amorphous semiconductor film. For the reaction gas, $SiH_4$ may be replaced by $Si_2H_6$ or $SiF_4$, and $GeH_4$ may be replaced by $GeF_4$. Similar reaction gas can be employed also when low pressure CVD is chosen. Preferably, the reaction gas is diluted by He and is deposited on the substrate at a temperature of 400 to 500° C. to form the amorphous semiconductor film. In any case, the gas used in the present invention is highly refined in order to reduce the concentration of impurity elements, such as oxygen, nitrogen and carbon, mixed in the amorphous semiconductor film during formation. The amorphous semiconductor film is formed to a thickness of 20 to 100 nm.

The amorphous semiconductor film used in the present invention contains silicon as its main ingredient and 0.1 atomic percent to 10 atomic percent of germanium (preferably 1 atomic percent to 5 atomic percent of germanium). The germanium content in the film can be adjusted by changing the mixing ratio of $SiH_4$ and $GeH_4$ that constitute typical reaction gas. Concentrations of nitrogen, carbon and oxygen contained in the amorphous semiconductor film are set to less than $5 \times 10^{18}$ atoms/cm$^3$, $5 \times 10^{18}$ atoms/cm$^3$ and $1 \times 10^{19}$ atoms/cm$^3$, respectively. Taking this precaution during crystallizing the amorphous semiconductor film eliminates the possibility of impairing electric characteristics of the crystalline semiconductor film formed.

A metal element is introduced to the surface of the thus formed amorphous semiconductor film in order to promote crystallization of the amorphous semiconductor film. The metal element is one or more elements selected from the group consisting of iron (Fe), nickel (Ni), cobalt (Co), ruthenium (Ru), rhodium (Rh), palladium (Pd), osmium (Os), iridium (Ir), platinum (Pt), copper (Cu), and gold (Au). The metal elements listed above can be used as the metal element for promoting crystallization of the amorphous semiconductor film in every mode of the present invention described in this specification. The above metal elements all provide the same effect at the same level, though nickel is the element that is typically used.

The metal elements are introduced to the entire surface of the amorphous semiconductor film, or in strips or dots suitably placed throughout the surface of the amorphous semiconductor film. In the former case, the surface of the amorphous semiconductor film to which the metal elements are to be introduced may be the substrate side surface or the surface opposite to the substrate. In the latter case, an insulating film is preferably formed on the amorphous semiconductor film so that the metal elements are introduced to the amorphous semiconductor film through openings formed in the insulating film. The size of the openings is not particularly limited, but a recommended width is 10 to 40 μm. The longitudinal length of the openings may be set to an arbitrary value within a range of several tens μm to several tens cm.

How to introduce the metal elements is not particularly limited as long as a film is formed from the metal elements on the surface of the amorphous semiconductor film or in the amorphous semiconductor film. Examples of the usable introduction method include sputtering, evaporation, plasma treatment (including plasma CVD), adsorption, and application of a metallic salt solution. In plasma treatment, metal elements sputtered from the cathode in glow discharge atmosphere by inert gas are used. Application of a metallic salt solution is advantageous,for it is simple and is easy to adjust concentration of the metal elements.

Various kinds of salts can be used for the metallic salt. Examples of the usable solvent include water; alcohols, aldehyde esters, ethers or other organic solvents; and a mixture of water and these organic solvents. The metallic salt may not always be dissolved completely in the solution. A solution in which a part of or the entirety of metallic salt is suspended may be used. Whatever method is employed, the metal elements have to be introduced to the surface of the amorphous semiconductor film or into the film while being dispersed.

After the metal elements are introduced by one of the above methods, the amorphous semiconductor film is crystallized utilizing the introduced metal elements. The crystallization is achieved by heat treatment or by irradiating the film with intense light such as laser light, ultraviolet ray, and infrared light. Heat treatment alone can provide a crystalline semiconductor film in which the major orientation is the {101} orientation. However, heat treatment is preferably followed by irradiation of intense light such as laser light. The laser treatment subsequent to the heat treatment repairs and eliminates crystal defects left in crystal grains, and hence is an effective measure to improve the quality of crystals formed.

The temperature in the heat treatment can range from 450 to 1000° C. One probable upper limit for the temperature is set by the heat resistance of the substrate used. In the case of a glass substrate, the upper temperature limit can be set based on the distortion point of the glass substrate. For example, when the glass substrate has a distortion point of 667° C., an appropriate upper temperature limit will be about 660° C. The time required for the heat treatment is suitably set while taking into consideration the heating temperature and conditions for the subsequent treatment (e.g., whether or not laser light irradiation treatment is carried out). Preferably, the heat treatment is conducted at 550 to 600° C. for four to twenty-four hours. If the heat treatment is followed by laser treatment, the heat treatment is conducted at 500 to 550° C. for four to eight hours. The heat treatment may be conducted in air or a hydrogen atmosphere, preferably, a nitrogen atmosphere or an inert gas atmosphere.

The laser treatment uses as a light source an excimer laser having a wavelength of 400 nm or less, or the second harmonic (wavelength: 532 nm) to the fourth harmonic (wavelength: 266 nm) of a YAG laser or of a $YVO_4$ laser. The laser light is focused by an optical system into a linear beam or spotlight. The energy density of the laser light upon irradiation is set to 100 to 700 $mJ/cm^2$. The focused laser beam is scanned over a given region of the substrate to process the region. Instead of the laser, a halogen lamp, a xenon lamp, a mercury lamp, a metal halide lamp, etc. may be used as the light source.

The mechanism of obtaining, through the above steps, the crystalline semiconductor film of the present invention in which the ratio of the {101} plane orientation is high is not so clear at present. However, the following inference can be made about the mechanism.

First, in crystallization, the heat treatment at 400 to 500° C. makes the metal element and silicon react to each other to form a silicide. The silicide serves as a crystal nuclear to start crystal growth later. For instance, nickel used as a typical metal element forms a nickel silicide (hereinafter referred to as $NiSi_2$). The structure of $NiSi_2$ is of fluorite, where a nickel atom is arranged between silicon lattices having the diamond structure. When the nickel atom is removed from $NiSi_2$, the silicon crystal structure is left. From the results of numerous experiments, it has been found that the nickel atom moves toward the amorphous silicon side. Supposedly, this is because the solid solution rate is higher in the amorphous silicon than in the crystalline silicon. Accordingly, a model is proposed in which formation of the crystalline silicon seems to advance as nickel moves in the amorphous silicon.

$NiSi_2$ does not have particular orientation. However, when the amorphous semiconductor film has a thickness of 20 to 100 nm, $NiSi_2$ can grow almost only in the direction parallel to the substrate surface. In this case, the energy of the interface between $NiSi_2$ and the {111} plane of the crystalline silicon is the minimum, which makes the {110} plane parallel to the surface of the crystalline silicon film. Therefore the grains are oriented mainly in the {110} lattice plane orientation. When the crystal growth direction is parallel to the substrate surface and a crystal grows into a pillar, the crystal may not always oriented in the {110} plane orientation because there is a degree of freedom in the rotation direction about the pillar-like crystal. Accordingly, other lattice planes could be deposited.

In order to enhance the ratio of the {101} lattice plane orientation in the crystalline semiconductor film, the present invention has found a measure of putting limitations on the rotation direction of the pillar-like crystal to reduce the degree of freedom; namely, to make the amorphous silicon contain 0.1 to 10 atomic percent of germanium. Needless to say, the presence of germanium is not the essential factor. The essential factor is, as mentioned before, to release the internal stress by breaching the silicon network or by influencing the silicon network in other ways, and this can be achieved by elements other than germanium.

Taking germanium as an example, observation has found that the amorphous silicon containing 0.1 to 10 atomic percent of germanium lowers the density of crystal nuclei generated. The observation result is shown in FIG. 15. FIG. 15 shows that the crystal nuclear density declines as the amount of $GeH_4$ used to dope the amorphous silicon film during its formation increases, in other words, as the concentration of germanium taken into the amorphous silicon film increases. When $NiSi_2$ serving as a crystal nuclei is formed, it is supposed that the crystal growth described above advances while germanium is being removed due to difference in interatomic distance. Therefore the presumption is that germanium segregates outside the pillar-like crystal to reduce the degree of freedom in the rotation direction about the pillar-like crystal by its presence. As a result, the crystalline semiconductor film in which the ratio of the {101} orientation is high can be obtained.

In order to enhance the ratio of the {101} lattice plane orientation in the crystalline semiconductor film, the present invention has found a measure of putting limitations on the rotation direction of the pillar-like crystal to reduce the degree of freedom; namely, to make the amorphous silicon contain 0.1 to 10 atomic percent of germanium.

Figure 5:
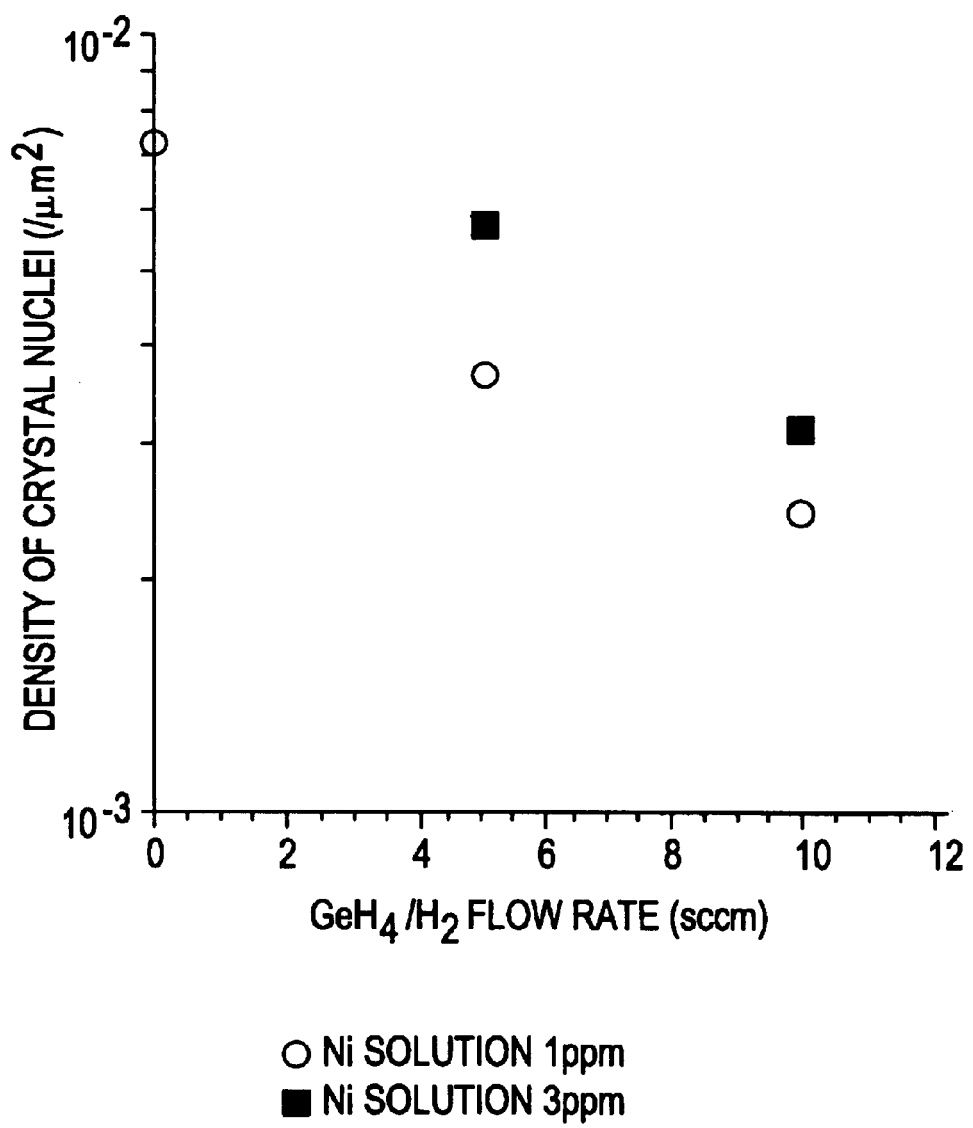
FIG. 5 is a graph showing the relation between the added quantity of $GeH_4$ and the density of crystal nuclei generated.
Figure 6:
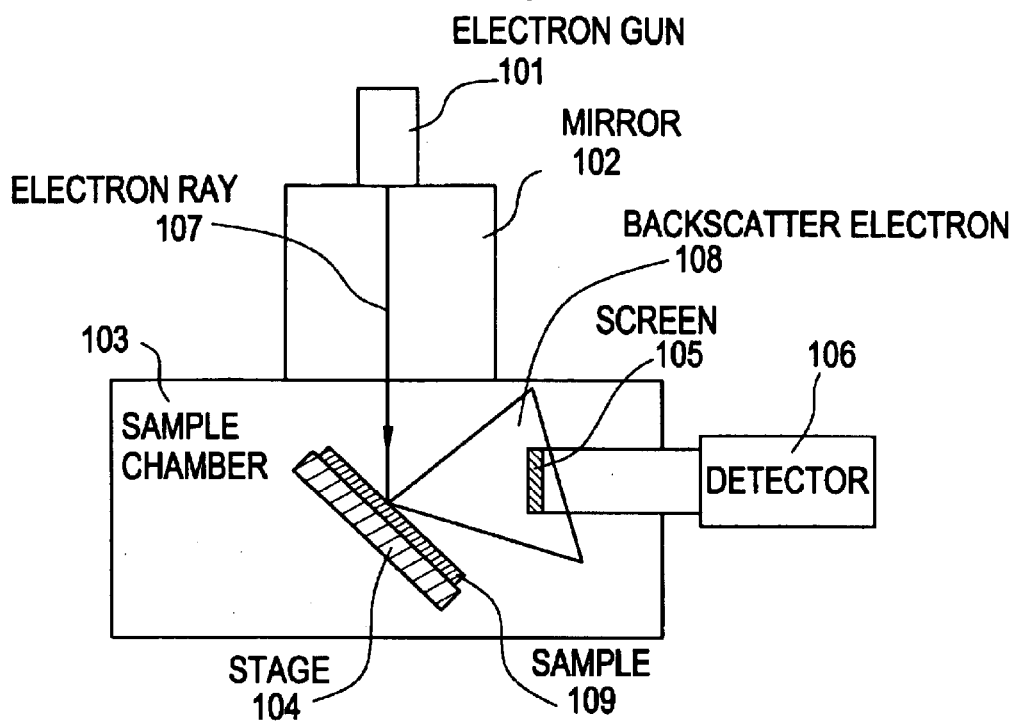
FIG. 6 is a diagram illustrating the structure of an EBSP device.
Figure 7:
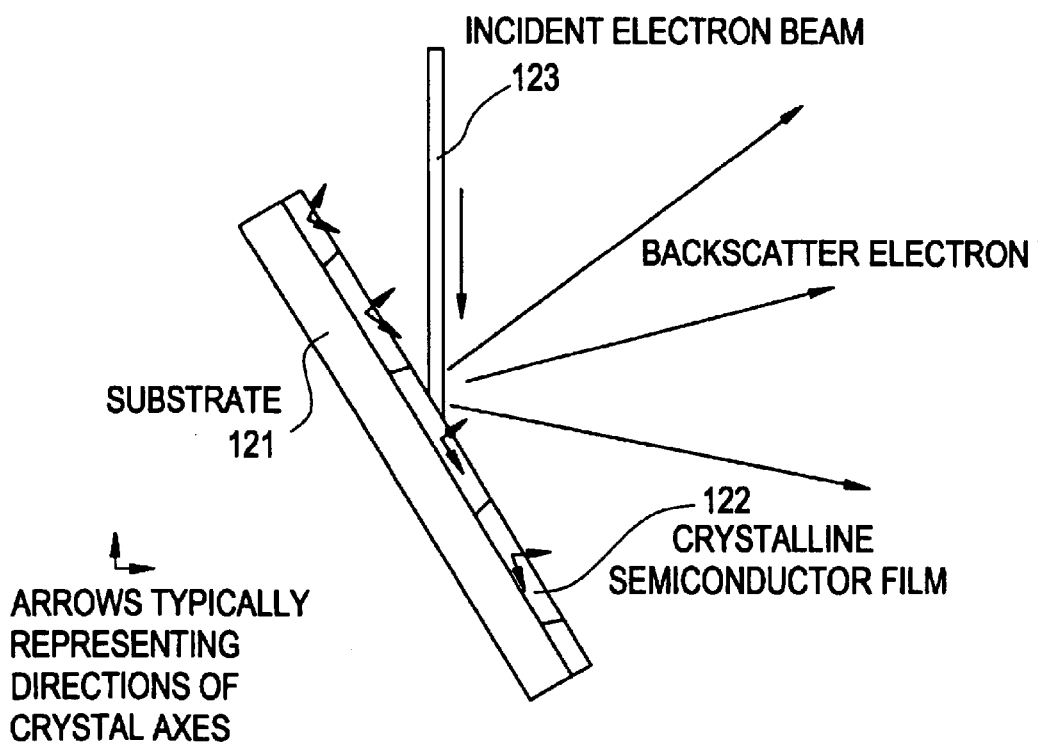
FIG. 7 is a diagram illustrating the concept of measuring a sample by EBSP.
Figure 8A:
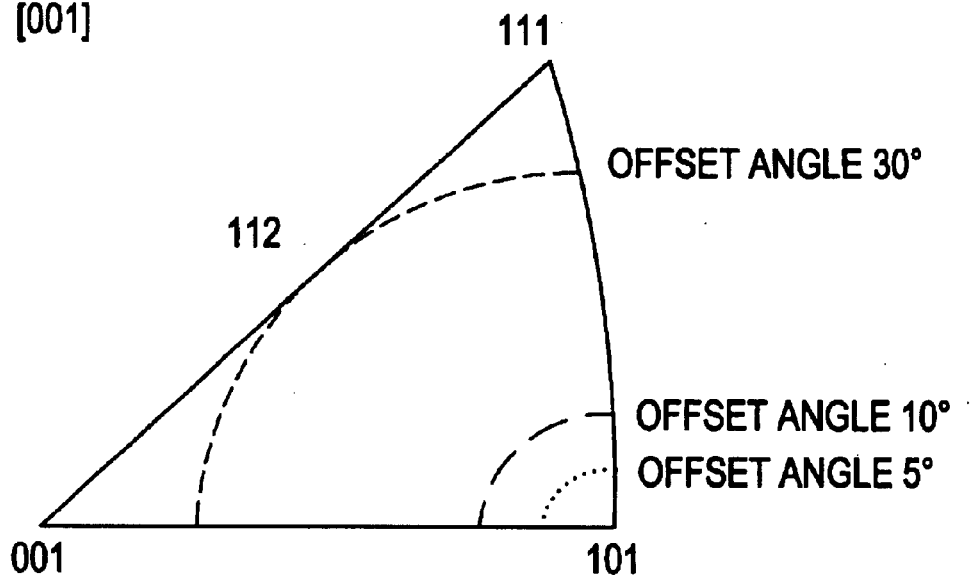
FIGS. 8A and 8B are examples of reverse pole diagrams obtained by EBSP data.
Figure 8B:
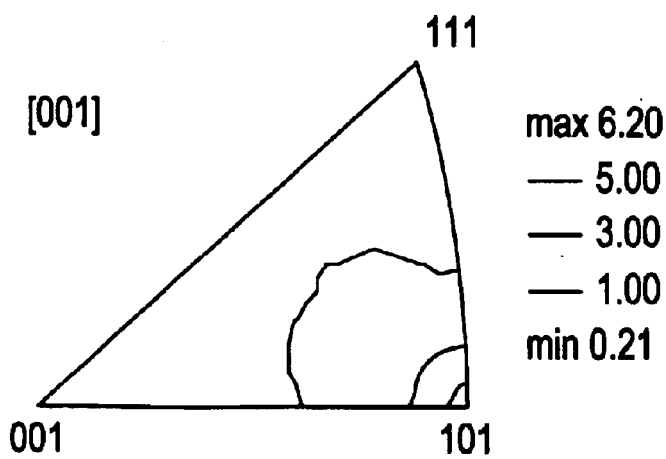
Figure 9:
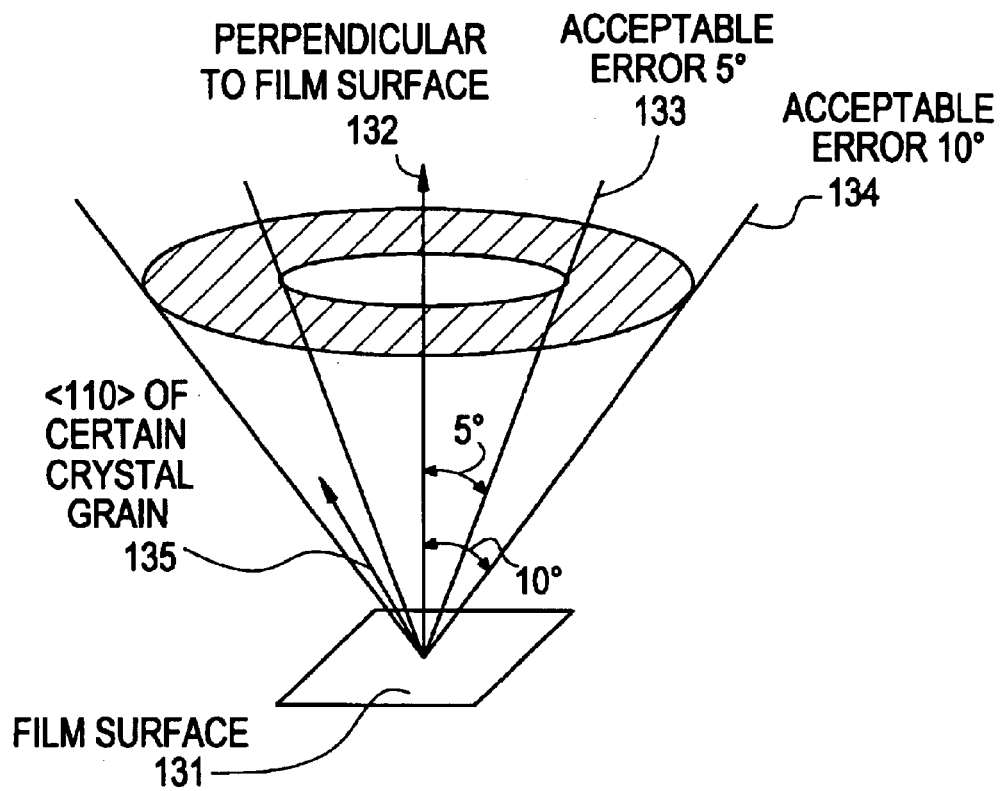
FIG. 9 is a diagram illustrating offset angles with respect to the {101} orientation.
Figure 10:
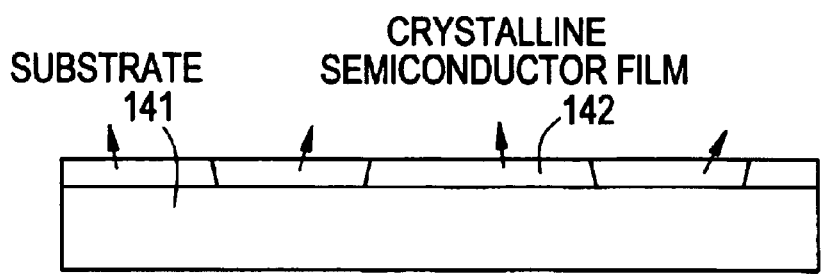
FIG. 10 is a diagram illustrating fluctuation in {101} orientation between crystal grains when the major orientation is in the vicinity of {101}.

First, observation has found that the amorphous silicon containing 0.1 to 10 atomic percent of germanium lowers the density of crystal nuclei generated. The observation result is shown in FIG. 5. FIG. 5 shows that the crystal nuclear density declines as the amount of $GeH_4$ used to dope the amorphous silicon film during its formation increases, in other words, as the concentration of germanium taken into the amorphous silicon film increases. When $NiSi_2$ serving as a crystal nuclei is formed, it is supposed that the crystal growth described above advances while germanium is being removed due to difference in interatomic distance. Therefore the presumption is that germanium segregates outside the pillar-like crystal to reduce the degree of freedom in the rotation direction about the pillar-like crystal by its presence. As a result, the crystalline semiconductor film in which the ratio of the {110} orientation is high can be obtained.

Described next is the relation between conditions for forming the crystalline semiconductor film in accordance with the present invention and the orientation of its crystals observed by EBSP. Table 1 shows conditions for forming an amorphous semiconductor film by plasma CVD. The high frequency power is set to 0.35 $W/cm^2$ (27 MHz) and is modulated into pulse discharge with a repetition frequency of 10 kHz (duty ratio: 30%) so as to be supplied to a cathode of a parallel flat type plasma CVD apparatus. In addition, common conditions including setting the reaction pressure to 33.25 Pa, the substrate temperature to 300° C., and the distance between electrodes to 35 mm, are provided.

TABLE 1

|  |  | SGN30 | SGN10 | SGN5 | SN |
|---|---|---|---|---|---|
| $SiH_4$ flow rate | [sccm] | 70 | 90 | 95 | 100 |
| $GeH_4$ ($H_2$ base 10%) flow rate | [sccm] | 30 | 10 | 5 | 0 |
| RF power | [$W/cm^2$] | 0.35 | 0.35 | 0.35 | 0.35 |
| pulse frequency | [KHz] | 10 | 10 | 10 | 10 |
| Duty | [%] | 30 | 30 | 30 | 30 |
| pressure | [Pa] | 33.25 | 33.25 | 33.25 | 33.25 |
| substrate temperature (Tsub) | [° C.] | 300 | 300 | 300 | 300 |
| electrodes gap (GAP) | [mm] | 35 | 35 | 35 | 35 |

In order to change the germanium content of the film relative to the silicon content, the mixture ratio of $SiH_4$ gas and $GeH_4$ gas which is diluted by $H_2$ to 10% is changed in terms of flow rate while keeping the total flowrate constant. In the film formation condition No. SGN30, the film formation condition No. SGN 10 and the film formation condition No. SGN5 out of the conditions shown in Table 1, the throughput of $GeH_4$ diluted by $H_2$ to 10% is changed to 30 SCCM, 10 SCCM and 5 SCCM, respectively. $SiH_4$ used has a purity of 99.9999% or more. $GeH_4$ used is a highly pure product in which the nitrogen content is 1 ppm or less, the hydrocarbon compound content is 1 ppm or less, and the $CO_2$ content is 2 ppm or less. In the condition No. SN, the film is not doped with $GeH_4$. The thickness of the amorphous semiconductor film formed is 50 nm in every sample.

Figure 4:
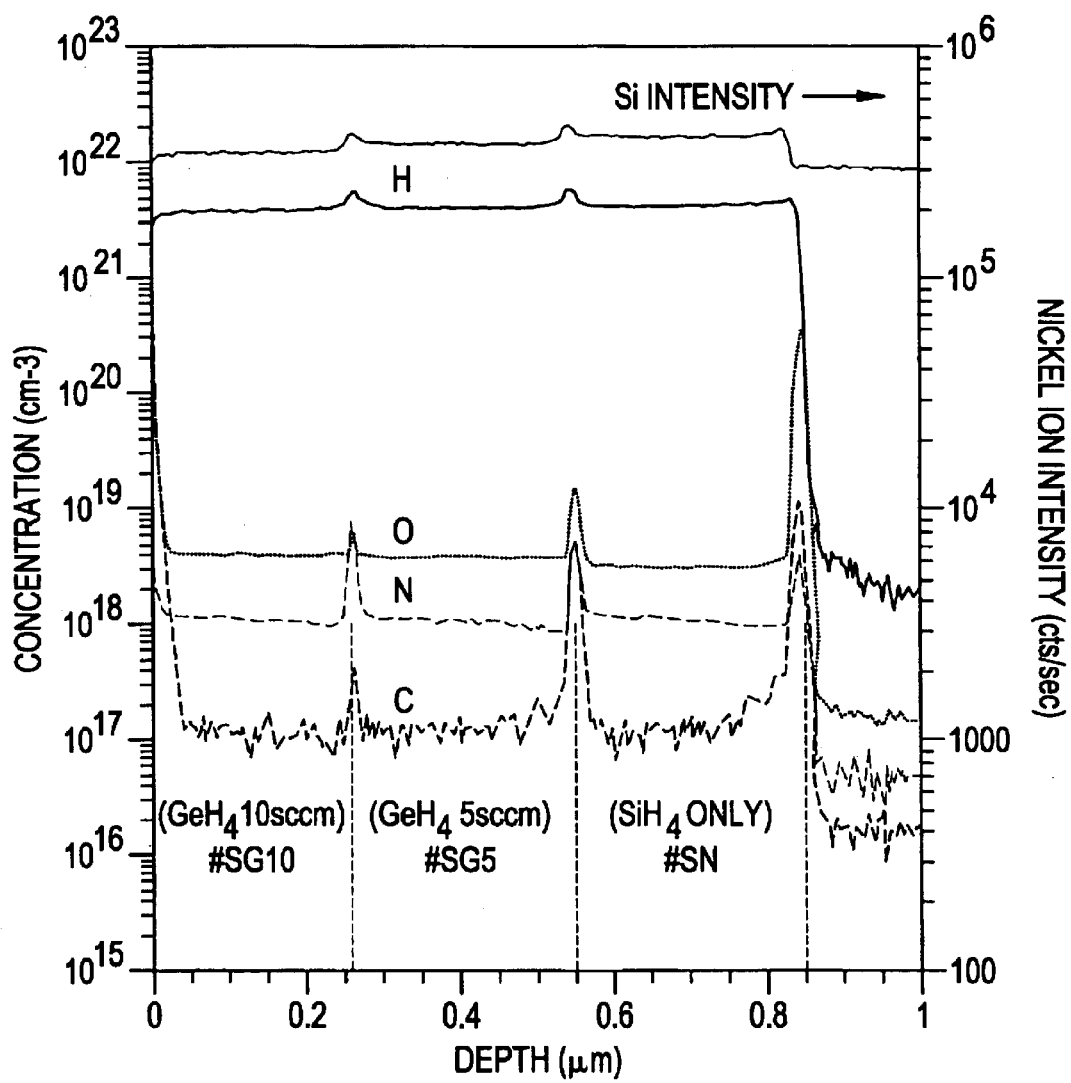
FIG. 4 is a graph of SIMS data showing the concentration of C, N and O in samples formed from $SiH_4$ gas, $GeH_4$ gas and $H_2$ gas.

The amorphous semiconductor film formed under those conditions contains nitrogen, carbon and oxygen in an amount measured by secondary ion mass spectroscopy (SIMS). FIG. 4 shows the result of the measurement. The sample used in the measurement is a silicon substrate on which a film formed under the condition No. SN, a film of No. SGN5 and a film of No. SGN10 are layered in this order. With any film formation condition, the nitrogen content, the carbon content and the oxygen content are less than $5\times10^{18}$ atoms/$cm^3$, less than $5\times10^{18}$ atoms/$cm^3$, and less than $1\times10^{19}$ atoms/$cm^3$, respectively.

The thus formed amorphous semiconductor film is crystallized by using nickel as the metal element and subjecting the film to heat treatment in a nitrogen atmosphere at 550° C. for four hours and then to laser treatment. Nickel is introduced by applying an aqueous solution containing nickel acetate through a spinner. In the laser treatment, an XeCl excimer laser (wavelength: 308 nm) is used, the irradiation energy density is set to 300 to 600 mJ/$cm^2$, and the overlapping ratio is set to 90 to 95%. The laser treatment is for crystallizing a portion of the film crystallized by the heat treatment which remains amorphous and for repairing defects in crystal grains.

The defects remaining in the crystalline semiconductor film can effectively be reduced by hydrogenating the film so that the film contains about 0.01 to 1 atomic percent of hydrogen. The hydrogenation is achieved by heat treatment in an atmosphere containing hydrogen at a temperature of 350 to 500° C. Alternatively, the film may be hydrogenated using hydrogen generated by plasma. If the film is formed by deposition of fluoride such as $SiF_4$ and $GeF_4$, fluorine on the order of 0.001 to 1 atomic percent remains in the film to serve as an element for repairing the defects.

Figure 3:
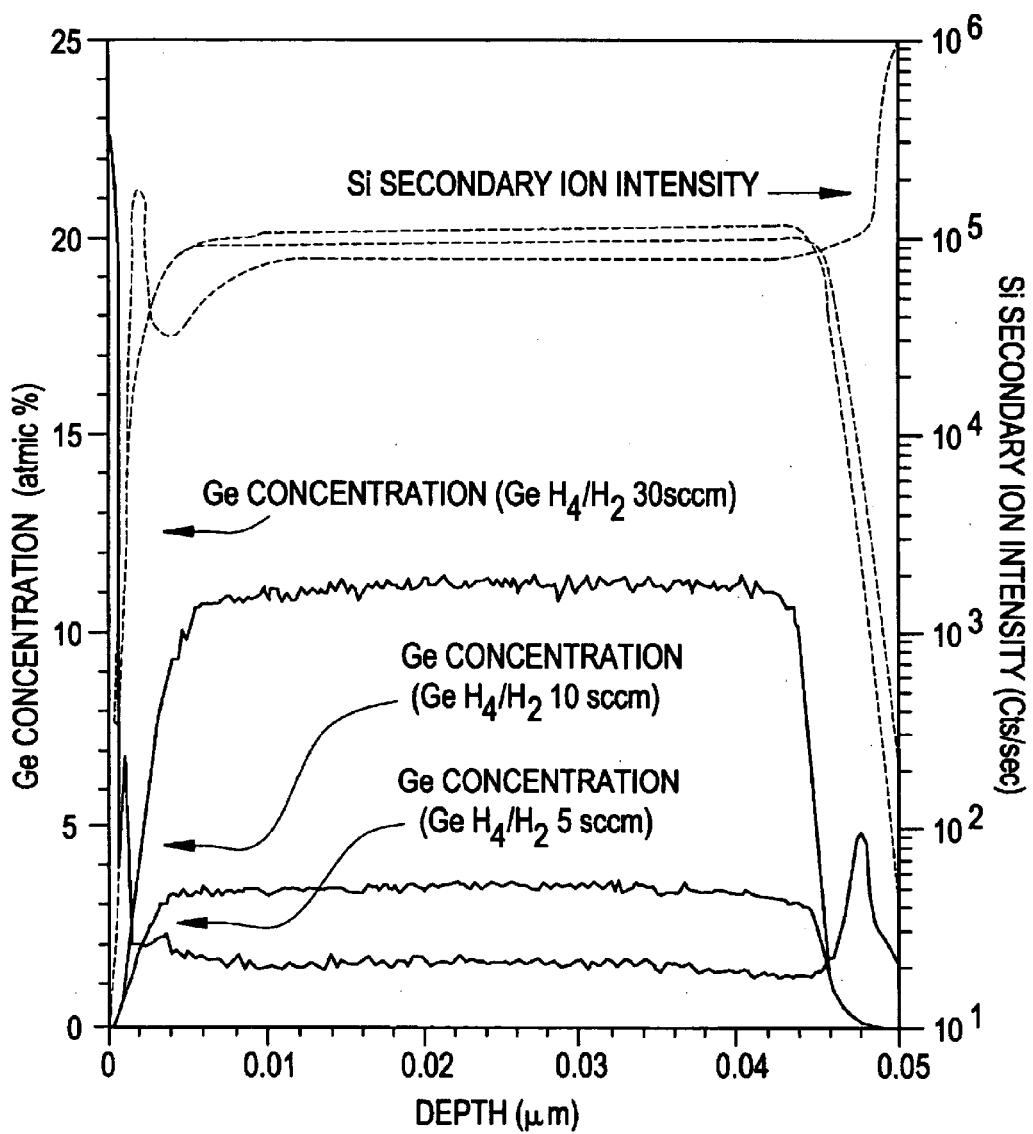
FIG. 3 is a graph showing the results of measuring the Ge concentration in a crystalline semiconductor film by SIMS.

FIG. 3 shows the results of measurement by SIMS for determining the germanium concentration in the crystallized films of No. SGN5, No. SGN10 and No. SGN30. The germanium content relative to the silicon content is 1.5 atomic percent in the case of No. SGN5, 3.5 atomic percent in the case of No. SGN10, and 11.0 atomic percent in the case of No. SGN30. Converting it into flow rate of $GeH_4$ relative to $SiH_4$, the germanium content in the film is three to four times greater than the silicon content. This is because $GeH_4$ is decomposed by glow discharge with energy smaller than the energy required to decompose $SiH_4$.

Figure 2:
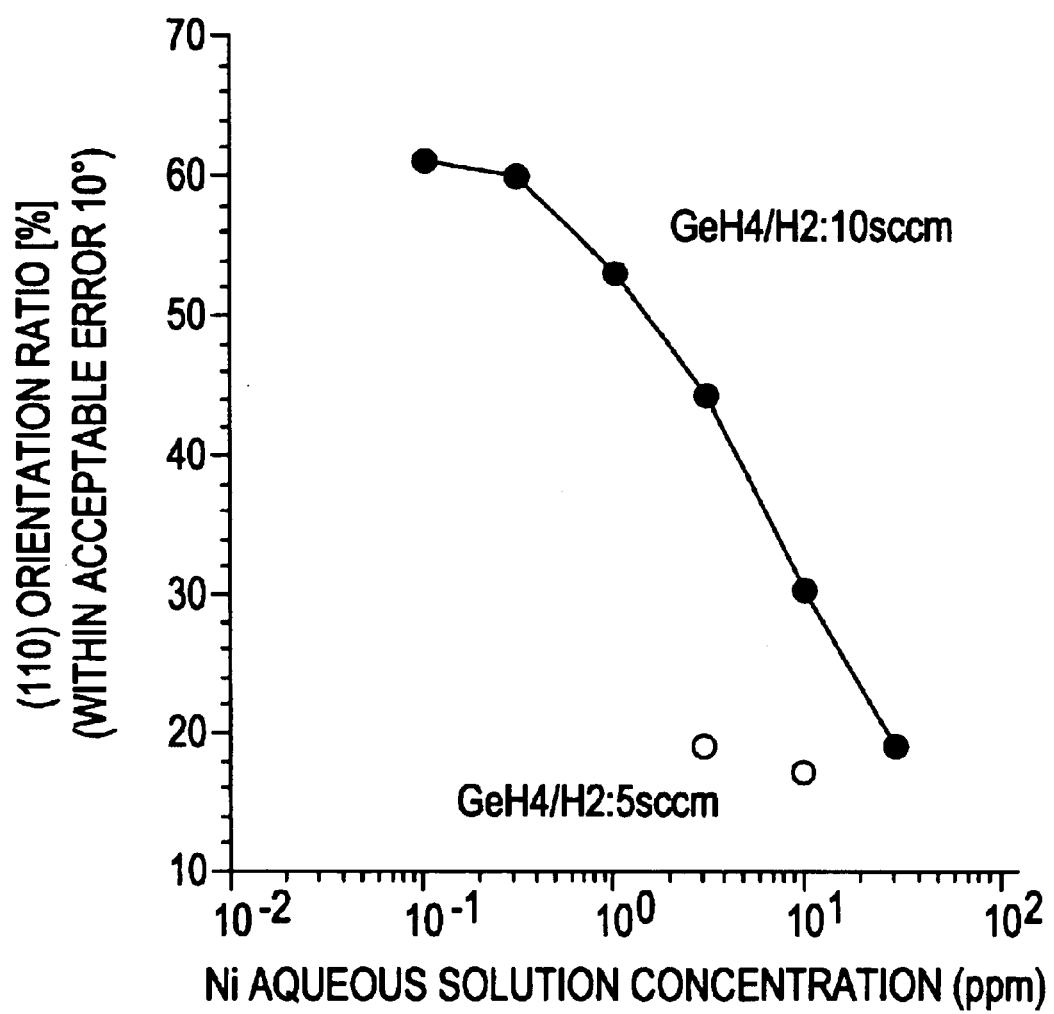
FIG. 2 is a graph showing the relation between the Ni solution concentration and the {101} orientation ratio.
Figure 36:
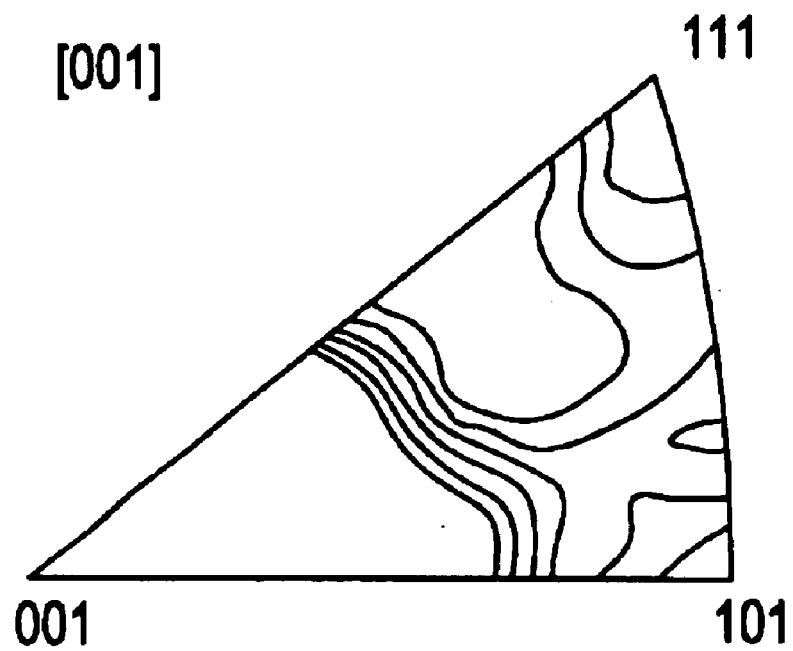
FIG. 36 is a reverse pole diagram obtained by conducting the EBSP method on a crystalline semiconductor film.

Details about the crystal orientation is obtained from EBSP. FIGS. 1A to 1D are reverse pole diagrams of a crystalline silicon film obtained by crystallizing an amorphous silicon film that is formed under the condition No. SGN10 shown in Table 1 when nickel concentration in the nickel acetate containing aqueous solution for the doping is varied within a range of 1 to 30 ppm. The film is crystallized through heat treatment at 580° C. for four hours. Most of the crystals in the film are oriented in the {101} orientation whereas some other crystals are oriented in the {311} plane orientation that is in the middle of the {001} orientation and the {111} orientation. The ratio of the {101} orientation depends on the concentration of nickel, and the {101} orientation ratio is raised as the nickel concentration is lowered. FIG. 2 is a graph showing the nickel concentration dependency of the {101} orientation ratio when the dose of $GeH_4$ is 5SCCM and 10 SCCM. The {101} orientation ratio expresses strong correlation with the nickel concentration under the condition No. SGN10, and the {101} orientation reaches 61% when the nickel aqueous solution concentration is 0.1 ppm. The results are shown in Table 2. FIG. 36 is a reverse pole diagram of a crystalline silicon film formed under the condition No. SN, and the {101} orientation ratio in this case is 12%.

TABLE 2

|  | Ni aquaous solution concentration (ppm) | | | | | |
|---|---|---|---|---|---|---|
|  | 0.1 | 0.3 | 1 | 3 | 10 | 30 |
| {101} orientation ratio (%) | 61 | 60 | 53 | 44 | 30 | 19 |

Table 3 shows the results of obtaining the ratio of the {101} lattice plane that forms an angle of equal to or less than 5° with respect to the surface of the film and the ratio of the {101} plane that forms an angle of equal to or less than 10° with respect to the surface of the film for each sample on the basis of the reverse pole diagrams. The same ratio is obtained for the {001}, {111} and {113} lattice planes and shown in Table 3. In Table 3, a film No. HS is high in {113} orientation ratio and {111} orientation ratio with the {113} orientation ratio being 18% (in the case that the angle is 10° or less) and the {111} orientation ratio being 12% (in the case that the angle is 10° or less). A film No. SN is high in {101} orientation ratio and {311} orientation ratio. The {311} plane provides greater number of lattice planes that are equivalent in terms of symmetry than any other planes. Therefore the ratio of the {311} orientation is that much high in a polycrystal where the orientation is random.

TABLE 3 unit: %

| sample | {101} | | {001} | | {111} | | {113} | |
|---|---|---|---|---|---|---|---|---|
| | 10° | 5° | 10° | 5° | 10° | 5° | 10° | 5° |
| #SGN30 | 19 | 1 | 8 | 2 | 7 | 3 | 19 | 5 |
| #SGN10 | 31 | 14 | 1 | 0 | 3 | 1 | 10 | 3 |
| #SGN5 | 20 | 6 | 1 | 0 | 3 | 0 | 12 | 3 |
| #SN | 12 | 3 | 1 | 0 | 7 | 2 | 15 | 3 |
| #HS | 4 | 1 | 10 | 3 | 12 | 6 | 18 | 4 |

Some tendencies are recognized also in a film No. SGN30, a film No. SGN10 and a film No. SGN 5 that are doped with germanium when comparing the samples. The tendencies indicate that the crystal orientation varies depending upon the concentration of germanium contained in the film. The tendency the most notable about the film No. SGN10 and the film No. SGN5 is that the ratio of the {101} lattice plane orientation is higher than the ratio of the other lattice plane orientations. In the film No. SGN10, the ratio of crystals with an offset angle of equal to or less than 10° is 31% and the ratio of crystals with an offset angle of equal to or less than 5° is 14%. In the film No. SGN5, the ratio of crystals with an offset angle of equal to or less than 10° is 20% and the ratio of crystals with an offset angle of equal to or less than 5° is 6%. Such a high {101} lattice plane orientation ratio can provide novel effects that cannot be obtained from the other germanium-less samples.

However, it is shown that the {101} lattice plane orientation ratio is reduced when the content of germanium in the film No. SGN30 declines to reach 11 atomic percent. Also, the {101} lattice plane orientation ratio declines by 20% when the germanium content in the film No. SGN5 is lowered to reach 1.5 atomic percent. Accordingly, the results indicate that there is an appropriate range for the concentration of germanium contained in an amorphous silicon film to increase the ratio of the {101} orientation. The appropriate concentration range is 0.1 atomic percent to 10 atomic percent, preferably, 1 atomic percent to 5 atomic percent.

Needless to say, the crystalline semiconductor film highly oriented in the {101} lattice plane orientation is obtained not solely by setting the concentration of germanium for doping to 0.1 to 10 atomic percent but by synergism. For the synergism, the concentration of elements contained in the film, namely, oxygen, nitrogen and carbon, is set to less than $1 \times 10^{19}$ atoms/cm$^3$, and the thickness of the film is set to 20 to 100 nm so that crystals grow mainly in the direction parallel to the substrate surface.

The structure of the thus obtained crystalline semiconductor film is assessed by X-ray diffraction. In X-ray diffraction, the diffraction intensity is measured while scanning at an angle of diffraction of 2θ. From the measurement of 2θ at which the intensity reaches its peak and from Bragg's formula (2d sinθ=λ, λ is the wavelength of the X-ray), lattice spacing d can be obtained. If the 2θ scan is slowed to determine the peak position precisely, information about distortion applied to the lattice can also be obtained.

Figure 34:
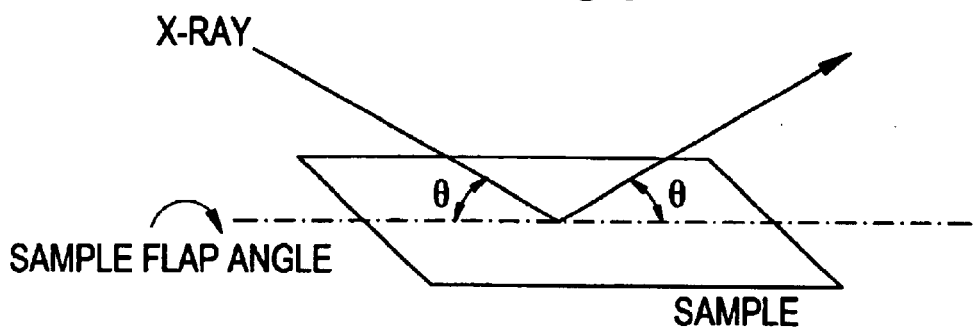
FIG. 34 is a diagram illustrating X-ray diffraction measurement and sample flap angle.
Figure 35A:
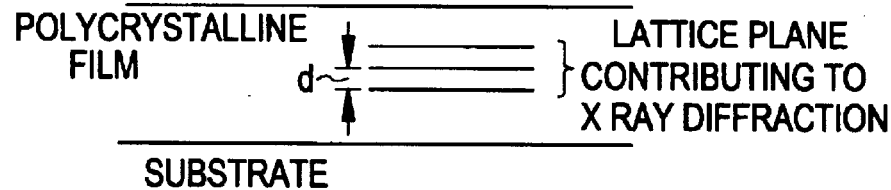
FIGS. 35A and 35B are diagrams illustrating sample flap angle and a lattice plane that contributes to diffraction.
Figure 35B:
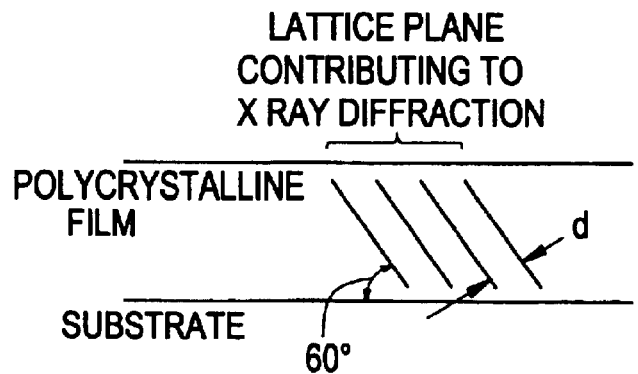

The measurement is made on the crystalline silicon film No. SN shown in Table 3 and on a crystalline semiconductor film containing germanium in order to compare d values of the films. Both films are formed on quartz substrates. The films are each formed to a thickness of 54 nm. In crystallizing the films, an aqueous solution containing 10 ppm of nickel acetate is used and heat treatment is conducted at 500° C. for an hour and then at 580° C. for eight hours. The measurement is made on the lattice plane parallel to the film as well as the lattice plane that forms an angle of 60° with respect to the film by giving a flap angle to the samples as shown in FIG. 34. This is schematically shown in FIGS. 35A and 35B. The measurement precision is increased when 2θ in diffraction is larger. The diffraction that can be measured is different between the two samples due to the difference in orientation. Then the diffraction with the largest 2θ is determined for each sample through preliminary measurement, and real measurement is made on these diffractions. The diffractions used in the real measurement are (440) in the crystalline silicon film containing germanium (sample A) and (220) in the crystalline silicon film (sample B).

When a flap angle is given, the value of 2θ gains systematic shift peculiar to the x-ray optical system of the device. Although this shift is small, a precise measurement like this is not allowed to ignore the influence of the shift. Therefore measurement of 2θ value is made in advance on a standard sample (tungsten powder having no orientation) at a flap angle of 0° and at a flap angle of 60°, so that the degree of shift in the standard sample can be used for correction of the other samples. The measurement results of the standard sample is shown in Table 4. Here, a diffraction having 2θ close to the index in the real measurement of the polycrystalline samples is chosen. To be specific, the (440) diffraction (2θ is around 106°) is measured for the sample A and hence correction is made using the (310) diffraction (2θ=100.628°) of tungsten. On the other hand, the (220) diffraction (2θ =around 47°) is measured for the sample B and hence correction is made using (110) diffraction (2θ= 40.2444°) of tungsten.

TABLE 4

| measured index | Psi [°] | 2θ [°] | Δ2θ [°] |
|---|---|---|---|
| 310 | 0 | 100.628 | −0.008 |
| | 60 | 100.62 | |
| 110 | 0 | 40.2444 | 0.0254 |
| | 60 | 40.2698 | |

The results of measuring the sample A and the sample B are shown in Table 5. From the comparison based on a flap angle Psi, it can be seen that the d value is larger when Psi is 0° than when Psi is 60°. This is true for both of the sample A and sample B. Therefore the lattice has a distortion extending horizontally with respect to the films. When converting it into a lattice constant a to compare the two samples with one another, the difference in d value between the case of 0° and the case of 60° is merely 0.00164 nm in the sample A whereas the difference is as large as 0.00272 nm in the sample B. Accordingly, it can be said that the distortion in the film after crystallization can be relieved by mixing germanium in the amorphous semiconductor film during its formation.

TABLE 5

| sample | measured index | Psi[°] | 2θ[°] | 2θ[°] after amendment | d[nm] | a[nm] | Δa[nm] |
|---|---|---|---|---|---|---|---|
| A | 440 | 0 | 106.9092 |  | 0.096093 | 0.54359 |  |
|  |  | 60 | 106.4369 | 106.4449 | 0.096384 | 0.54523 | 0.00164 |
| B | 220 | 0 | 47.4447 |  | 0.191894 | 0.54276 |  |
|  |  | 60 | 47.2188 | 47.1934 | 0.192857 | 0.54548 | 0.00272 |

The crystalline semiconductor film in which the ratio of the {101} lattice plane orientation is high is suitable for forming a channel formation region that determines characteristics of an element, such as a channel formation region of a TFT and a photo-electric conversion layer of a photovoltaic element.

Next, a method of manufacturing the crystalline silicon film containing germanium as above will be described in detail with reference to the drawings.

Embodiment Mode 1

Figure 11A:
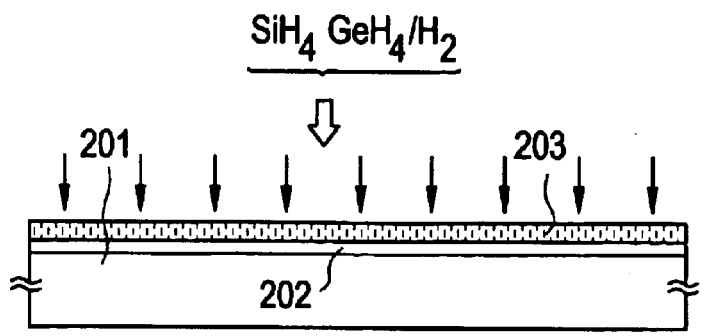
FIGS. 11A to 11D are diagrams illustrating a method of manufacturing a crystalline semiconductor film according to the present invention.

The method of manufacturing a crystalline semiconductor film in accordance with illustration of FIGS. 11A to 11D is to crystallize an amorphous silicon film containing germanium by doping the entire surface of the amorphous silicon film with a metal element for promoting crystallization of silicon. In FIG. 11A, a glass substrate, typically, the Corning #1773 glass substrate (product of Corning Incorporated), is used for a substrate 201. On the surface of the substrate 201, a silicon oxynitride film is formed as a blocking layer 202 from $SiH_4$ and $N_2O$ by plasma CVD to a thickness of 100 nm. The blocking layer 202 is provided to prevent an alkaline metal contained in the substrate from diffusing into a semiconductor film to be formed on the blocking layer.

An amorphous silicon film 203 containing germanium is formed by plasma CVD. $SiH_4$ gas and $GeH_4$ gas which is diluted by $H_2$ to 10% is introduced in a reaction chamber and decomposed by glow discharge to be deposited on the substrate 201. Details of the formation conditions are as shown in Table 1. The condition employed here is the condition No. SGN5 or the condition No. SGN 10, or a condition that falls between the two. The thickness of the amorphous silicon film 203 containing germanium is set to 50 nm. In order to reduce impurities such as oxygen, nitrogen and carbon in the amorphous silicon film 203 containing germanium as much as possible, $SiH_4$ of 99.9999% or higher purity and $GeH_4$ of 99.99% or higher purity are used. Specifications of the plasma CVD apparatus to be used are as follows. The reaction chamber has a volume of 13 L. A compound molecular pump having an exhaust rate of 300 l/sec is provided on the first stage of the reaction chamber and a dry pump having an exhaust rate of 40 $m^3$/hr is provided on the second stage of the reaction chamber so as to prevent reverse diffusion of evaporated organic material from the exhaust system side. The pumps also enhance the attained vacuum in the reaction chamber to let the least possible amount of impurity element mix in the amorphous semiconductor film during its formation.

Figure 11B:
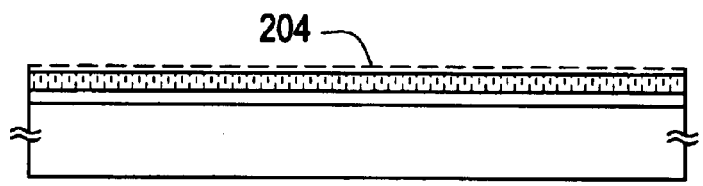

As shown in FIG. 11B, a nickel acetate solution containing 10 ppm of nickel by weight is applied by spinner to form a nickel containing layer 204. In order to make sure the solution permeates the filmwell, the surface of the amorphous silicon film 203 containing germanium is treated. As the surface treatment, a very thin oxide film is formed using an aqueous solution containing ozone, the oxide film is etched using a mixture of hydrofluoric acid and hydrogen peroxide to form a clean surface, and a very thin oxide film is again formed by treatment using an aqueous solution containing ozone. With the oxide film formed as above, the nickel acetate solution can be applied uniformly to the silicon surface, which is inherently hydrophobic.

Figure 11C:
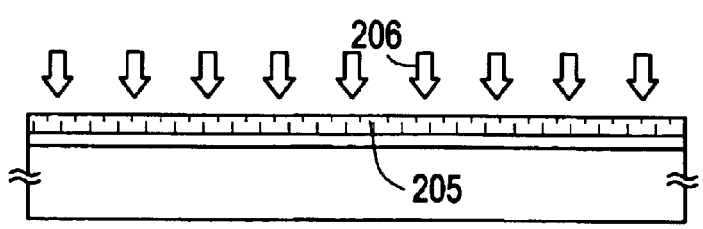
Figure 11D:
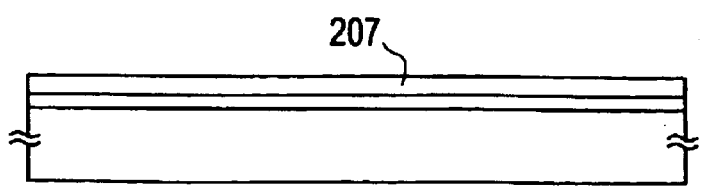

Next, heat treatment is conducted at 500° C. for an hour so that hydrogen is released from the amorphous silicon film containing germanium. Then the film is subjected to heat treatment at 550° C. for four hours to crystallize the film. Thus a crystalline semiconductor film 205 shown in FIG. 11C is formed.

In order to enhance the crystallization rate (the ratio of crystalline components to the total volume of the film) and repair defects remaining in crystal grains, the crystalline semiconductor film 205 is subjected to laser treatment in which the film is irradiated with laser light 206. The laser used is an excimer laser having a wavelength of 308 nm and oscillating at 30 Hz. The laser light is collected by an optical system into a beam of 400 to 600 $mJ/cm^2$, and laser treatment is conducted with the overlapping ratio set to 90 to 95%. Thus a crystalline semiconductor film 207 shown in FIG. 11D can be obtained.

Embodiment Mode 2

Figure 12A:
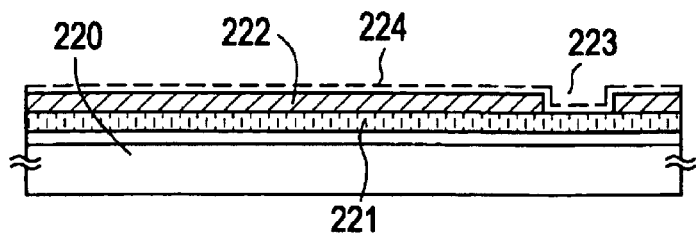
FIGS. 12A to 12C are diagrams illustrating a method of manufacturing a crystalline semiconductor film according to the present invention.
Figure 12B:
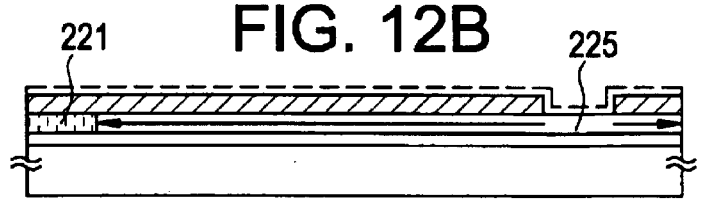
Figure 12C:
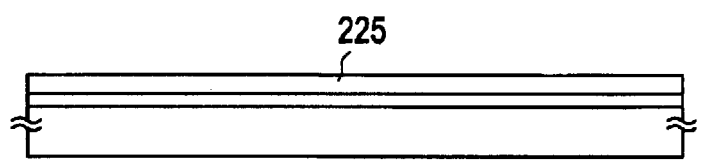

A method of selectively introducing a metal element for promoting crystallization of an amorphous semiconductor film will be described with reference to FIGS. 12A to 12C. In FIG. 12A, a substrate 220 may be the aforementioned glass substrate or a quartz substrate. When the glass substrate is employed, a blocking layer is formed as in Embodiment Mode 1.

An amorphous silicon film 221 containing germanium may be formed by plasma CVD as in Embodiment Mode 1, or by introducing germanium through ion implantation or ion doping. The film may also be formed by low pressure CVD in which $Si_2H_6$ and $GeH_4$ are decomposed at a temperature of 450 to 500° C.

A silicon oxide film 222 with a thickness of 150 nm is formed on the amorphous silicon film 221 containing germanium. The method of forming the silicon oxide film is not limited. For example, the film is formed through discharge in which a mixture of tetraethyl ortho silicate (TEOS) and $O_2$ is used, and the reaction pressure is set to 40 Pa, the substrate temperature is set to 300 to 400° C., the high frequency (13.56 MHz) power density is set to 0.5 to 0.8 $W/cm^2$.

Next, an opening 223 is formed in the silicon oxide film 222 and a nickel acetate solution containing 10 ppm of nickel by weight is applied to the film. A nickel containing layer 224 is thus formed and the only part of the nickel containing layer that is in contact with the amorphous silicon film 221 containing germanium is at the bottom of the opening 223.

The film is crystallized by heat treatment at 500 to 650° C. for four to twenty-four hours, for example, at 570° C. for fourteen hours. In this case, a part of the amorphous silicon film that is in contact with nickel is crystallized first and the crystallization advances from that part in the direction parallel to the substrate surface. A crystalline silicon film 225 is thus formed. The crystalline silicon film is masses of rod-like or needle-like crystals, and each crystal grows with a specific directivity when viewed macroscopically. The silicon oxide film 222 is then removed to complete the crystalline silicon film 225.

Embodiment Mode 3

The crystalline silicon film formed in accordance with the method described in Embodiment Mode 1 or 2 still has the metal element that has been utilized in crystallization. Although not distributed in the film uniformly, the metal element remains in a concentration over $1 \times 10^{19}$ atoms/cm$^3$ on the average. The film in this state can be used for a channel formation region of a TFT and other various semiconductor devices, of course, but it is preferred to remove the metal element from the film by gettering.

Figure 13A:
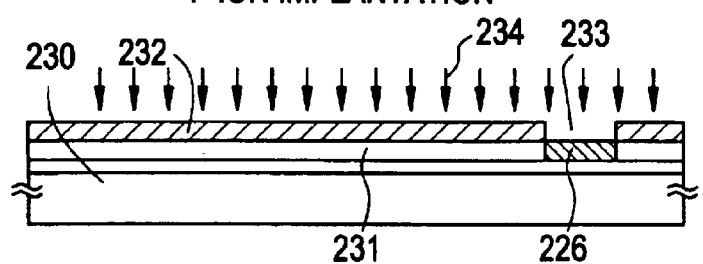
FIGS. 13A to 13C are diagrams illustrating a method of manufacturing a crystalline semiconductor film according to the present invention.
Figure 13B:
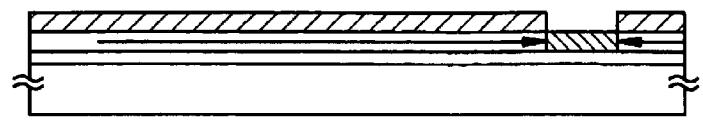

An example of the gettering method according to this embodiment mode will be described with reference to FIGS. 13A to 13C. In FIG. 13A, the glass substrate of Embodiment Mode 1 or a quartz substrate is employed as a substrate 230. When the glass substrate is used, a blocking layer is formed similar to Embodiment Mode 1. A crystalline silicon film 231 can be formed by the method described in Embodiment Mode 1 or the method described in Embodiment Mode 2. On the surface of the crystalline silicon film 231, a silicon oxide film 232 to serve as a mask is formed to a thickness of 150 nm. An opening 233 is formed in the silicon oxide film to expose a part of the crystalline silicon film. If the film is formed in accordance with Embodiment Mode 2, the silicon oxide film 222 shown in FIG. 12A can be used for the film 232 as it is, proceeding to the step of this embodiment mode after the step of FIG. 12B is completed. Then the film is doped with phosphorus by ion doping to form a phosphorus-doped region 235 that contains phosphorus in a concentration of $1 \times 10^{19}$ to $1 \times 10^{22}$ atoms/cm$^3$.

Thereafter, heat treatment is conducted in a nitrogen atmosphere at 550 to 800° C. for five to twenty-four hours for example, at 600° C. for twelve hours. Through the heat treatment, the phosphorus-doped region 235 works as a gettering site as shown in FIG. 13B, and the catalytic element remained in the crystalline silicon film 231 is segregated in the phosphorus-doped region 235.

Figure 13C:
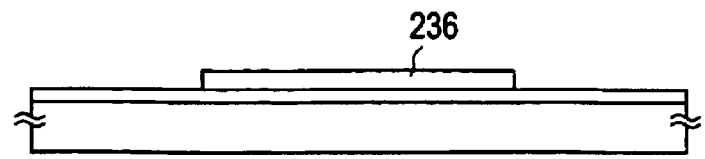

After that, the silicon oxide film 232 that has served as a mask and the phosphorus-doped region 235 are removed by etching as shown in FIG. 13C. Thus obtained is a crystalline silicon film 236 in which the concentration of the metal element used in the crystallization step is reduced to less than $1 \times 10^{17}$ atoms/cm$^3$.

Now, a description will be given on examples of manufacturing a TFT from the crystalline silicon film containing germanium as above. Needless to say, the present invention is not limited to the following embodiments.

Embodiment 1

Figure 15A:
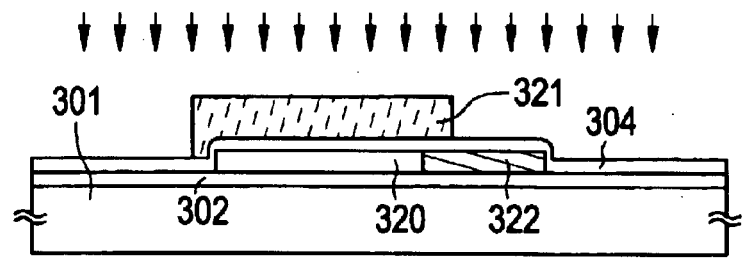
FIGS. 15A to 15D are diagrams illustrating a process of manufacturing an n-channel TFT.
Figure 15B:
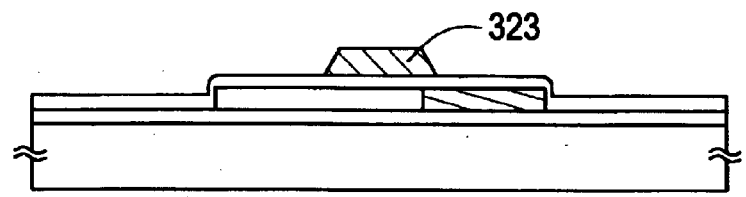
Figure 15C:
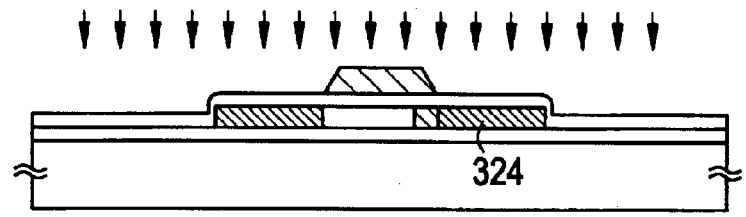
Figure 15D:
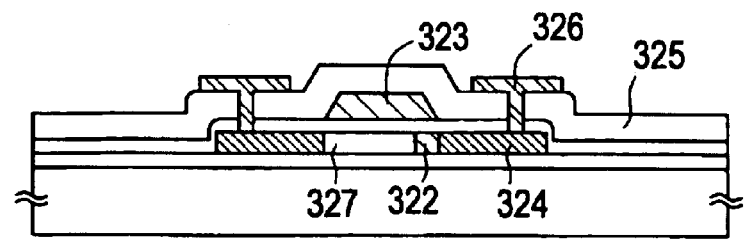

This embodiment describes an example of manufacturing an n-channel TFT, and the description will be made with reference to FIGS. 15A to 15D. In FIG. 15A, a crystalline silicon film containing germanium is formed on a substrate 301. The crystalline silicon film containing germanium, which is denoted by 320, may be formed in accordance with any one of the methods of Embodiment Modes 1 to 3. In manufacturing a TFT from the film, the film is etched and divided into island-like films having given sizes in order to separate elements. When the substrate 301 is a glass substrate, a blocking layer 302 is formed. An insulating film 304 to be utilized as a gate insulating film in the TFT is formed to a thickness of 30 to 200 nm.

For the blocking layer 302, a silicon oxynitride film is formed by plasma CVD using SiH$_4$ and N$_2$O to a thickness of 50 to 200 nm. Alternatively, the blocking layer may have a two-layer structure in which a silicon oxynitride film formed from SiH$_4$, NH$_3$ and N$_2$O by plasma CVD to a thickness of 50 nm and a silicon oxynitride film formed from SiH$_4$ and N$_2$O to a thickness of 100 nm are layered. The two-layer structure may instead be obtained by layering a silicon nitride film and a silicon oxide film that is formed using TEOS.

A mask 321 is then formed from resist through light exposure process, so that the semiconductor film 320 is doped with an n type impurity element (donor) by ion implantation or ion doping. A third impurity region 322 thus formed contains the donor in a concentration of $1 \times 10^{17}$ to $2 \times 10^{19}$ atoms/cm$^3$.

On the insulating film 304, a gate electrode 323 is formed from a conductive material composed of one or more elements selected from the group consisting of tantalum, tungsten, titanium, aluminum and molybdenum. The gate electrode 323 partially overlaps the third impurity region 322 with the gate insulating film interposed therebetween.

Thereafter, the semiconductor film is doped with an n type impurity element (donor) using the gate electrode 323 as a mask, whereby a fourth impurity region 324 is formed in a self-aligning manner. The impurity concentration in the fourth impurity region 324 is set to $1 \times 10^{17}$ to $2 \times 10^{19}$ atoms/cm An interlayer insulating film 325 is then formed using a silicon nitride film or a silicon oxynitride film formed by plasma CVD. Heat treatment at a temperature of 350 to 500° C., which is necessary to activate the impurity element that has been used to dope the semiconductor film, is conducted after the interlayer insulating film 325 is formed. Through the heat treatment, hydrogen contained in the silicon nitride film or the silicon oxynitride film is released to diffuse into the crystalline silicon film 320 containing germanium. As a result, defects in the crystalline silicon film can be repaired by hydrogen. When a source and drain electrode 326 is formed, a TFT is completed.

The crystalline silicon film 320 has a channel formation region 327, a lightly doped drain (LDD) region 322 that is the third impurity region, and a source or drain region 324 that is the fourth impurity region. The channel formation region 327 is formed of the crystalline silicon film of the present invention in which germanium is contained and the ratio of the {101} orientation is high. The channel formation region 327 shows excellent interface characteristics regarding the interface with the gate insulating film, has reduced defect density in grain boundaries and inside crystal grains, and can provide high field effect mobility. The LDD region 322 is formed so as to overlap the gate electrode 322, thereby alleviating the concentration of electric field at the edge of the drain and preventing degradation due to hot carriers. The single drain structure or the LDD structure may of course be chosen instead to form the n-channel TFT. The TFT fabricated in accordance with the present invention can be used as a TFT for manufacturing an active matrix liquid crystal display device or a display device whose pixel portion is composed of light emitting elements, or as a TFT constituting a thin film integrated circuit that is to replace the conventional LSI formed from a semiconductor substrate.

Embodiment 1 may have an additional step of doping the channel formation region with a slight amount of impurity element in order to control the threshold voltage of the TFT. As shown in Embodiment Modes, employing the crystalline silicon film with a high {101} lattice plane orientation ratio lowers the possibility of carriers, which flow across crystal grains, being trapped or scattered due to defects in grain boundaries. Therefore the field effect mobility can be increased and the sub-threshold coefficient can be reduced. In addition, ON current is increased to enhance the current driving ability.

The n-channel TFT of this embodiment may also be used to form a basic logic circuit such as a NAND circuit and a NOR circuit, or a more intricate logic circuit (such as a signal divider circuit, an operation amplifier and a γ correction circuit).

Embodiment 2

Figure 14A:
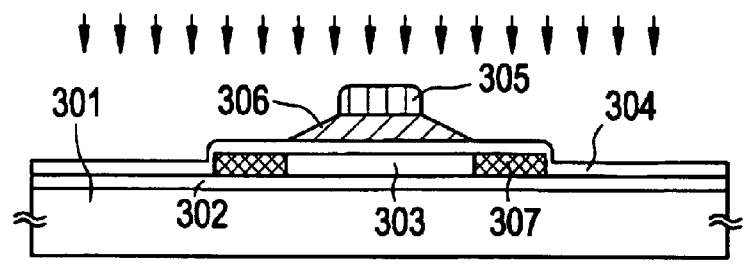
FIGS. 14A to 14D are diagrams illustrating a process of manufacturing a p-channel TFT.

This embodiment gives a description on an example of manufacturing a p-channel TFT with reference to FIGS. 14A to 14D. In FIG. 14A, a crystalline silicon film containing germanium is formed on a substrate 301. The crystalline silicon film containing germanium, which is denoted by 303, may be formed in accordance with any one of the methods of Embodiment Modes 1 to 3. In manufacturing a TFT from the film, the film is etched and divided into island-like films having given sizes in order to separate elements. When the substrate 301 is a glass substrate, a blocking layer 302 is formed.

An insulating film 304 to be utilized as a gate insulating film is formed on the semiconductor film 303 to a thickness of 30 to 200 nm. The insulating film 304 may be a silicon oxynitride film formed by plasma CVD from $SiH_4$ and $N_2O$, or a silicon oxynitride film formed by plasma CVD from TEOS and $N_2O$. In this embodiment, the former is chosen and the thickness thereof is set to 70 nm.

Formed on the insulating film 304 is a conductive film composed of one or more elements selected from the group consisting of tantalum (Ta), tungsten (W), titanium (Ti), aluminum (Al) and molybdenum (Mo). A resist mask 305 is then formed through light exposure process, so that the conductive film is etched by dry etching to form a first shape conductive film 306. The first shape conductive film is tapered around the edge. Etching conditions are set suitably. For example, if the conductive film is a W film, the film is etched properly by using mixture gas of $CF_4$ and $Cl_2$ and biasing the substrate to negative. Then a first impurity region 307 that is to constitute a source and drain region is formed. The impurity region 307 is formed through ion doping using an element belonging to Group 13 in the periodic table, typically boron. The impurity concentration in the first impurity region 307 is set to $1\times10^{20}$ to $2\times10^{21}$ atoms/cm$^3$.

Figure 14B:
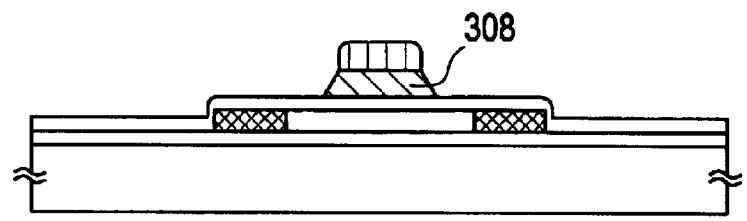

Next, the first shape conductive film 306 is etched so that its edge is trimmed as shown in FIG. 14B. A second shape conductive film 308 is thus obtained. According to the structure of this embodiment, the second shape conductive film serves as a gate electrode. The gate electrode is formed through two etching steps and the etching conditions are set suitably. For example, if the conductive film is a W film, the edge of the film is tapered properly by using mixture gas of $CF_4$ and $Cl_2$ and biasing the substrate to negative. When oxygen is mixed with $CF_4$ and $Cl_2$, anisotropic etching can be performed on the W film with preferable selectivity regarding the base.

Figure 14C:
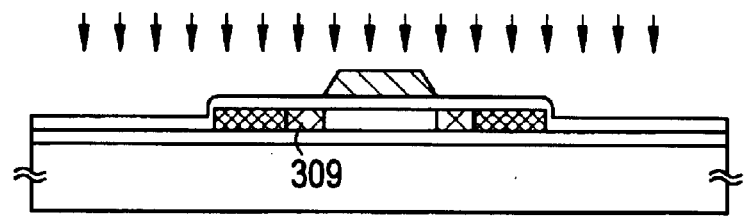
Figure 14D:
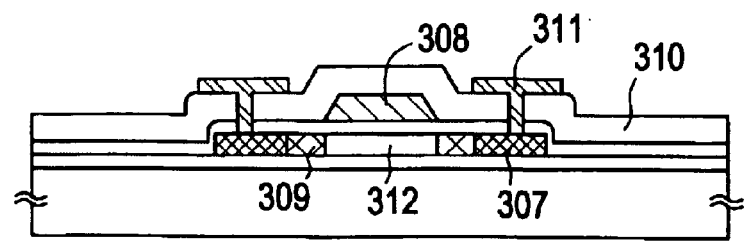

Thereafter, the semiconductor film is doped with a p type impurity element (acceptor) using the second shape conductive film 308 as a mask, whereby a second impurity region 309 is formed in a self-aligning manner as shown in FIG. 14C. The impurity concentration in the second impurity region 309 is set to $1\times10^{17}$ to $2\times10^{19}$ atoms/cm$^3$.

An interlayer insulating film 310 is then formed using a silicon nitride film or a silicon oxynitride film formed by plasma CVD. Heat treatment at a temperature of 350 to 500° C., which is necessary to activate the impurity element that has been used to dope the semiconductor film, is conducted after the interlayer insulating film 310 is formed. Through the heat treatment, hydrogen contained in the silicon nitride film or the silicon oxynitride film is released to diffuse into the crystalline silicon film 303 containing germanium. As a result, defects in the crystalline silicon film can be repaired by hydrogen. When a source and drain electrode 311 is formed, a TFT is completed.

The crystalline silicon film 303 has a channel formation region 312, an LDD region 309 that is the second impurity region, and a source or drain region 304 that is the first impurity region. The channel formation region 312 is formed of the crystalline silicon film of the present invention in which germanium is contained and the ratio of the {101} orientation is high. The channel formation region 312 shows excellent interface characteristics regarding the interface with the gate insulating film, has reduced defect density in grain boundaries and inside crystal grains, and can provide high field effect mobility. Although the p-channel TFT has the LDD structure here, it of course may have the single drain structure or a structure in which the LDD region overlaps the gate electrode. The TFT fabricated in accordance with the present invention can be used as a TFT for manufacturing an active matrix liquid crystal display device or a display device whose pixel portion is composed of light emitting elements, or as a TFT constituting a thin film integrated circuit that is to replace the conventional LSI formed from a semiconductor substrate.

Embodiment 2 may have an additional step of doping the channel formation region with a slight amount of impurity element in order to control the threshold voltage of the TFT. As shown in Embodiment Modes, employing the crystalline silicon film with a high {101} lattice plane orientation ratio lowers the possibility of holes, which flow across crystal grains, being trapped or scattered due to defects in grain boundaries even in a p-channel TFT. Therefore the field effect mobility can be increased and the sub-threshold coefficient can be reduced. In addition, ON current is increased to enhance the current driving ability.

The p-channel TFT of this embodiment may also be used to form a basic logic circuit, or a more intricate logic circuit (such as a signal divider circuit, a D/A converter, an operation amplifier and a γ correction circuit). The TFT also can constitute a memory or a microprocessor. For instance, a driver circuit of a liquid crystal device may be composed solely of p-channel TFTs of the present invention.

Embodiment 3

Figure 16A:
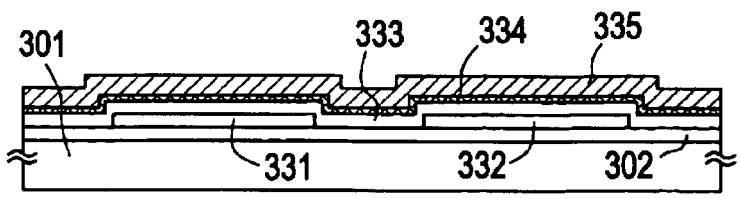
FIGS. 16A to 16G are diagrams illustrating a process of manufacturing a TFT having a CMOS structure.

A description given in this embodiment with reference to FIGS. 16A to 16G is about an example of manufacturing a CMOS TFT obtained by combining an n-channel TFT and a p-channel TFT complementarily. In FIG. 16A, a crystalline silicon film containing germanium is formed on a substrate 301. The crystalline silicon film containing germanium may be formed in accordance with any one of the methods of Embodiment Modes 1 to 3. In manufacturing a TFT from the film, the film is etched and divided into island-like semiconductor films 331 and 332 having given sizes in order to separate elements. When the substrate 301 is a glass substrate, a blocking layer 302 is formed.

For the blocking layer 302, a silicon oxynitride film is formed by plasma CVD using $SiH_4$ and $N_2O$ to a thickness of 50 to 200 nm. Alternatively, the blocking layer may have a two-layer structure in which a silicon oxynitride film formed from $SiH_4$, $NH_3$ and $N_2O$ by plasma CVD to a thickness of 50 nm and a silicon oxynitride film formed from $SiH_4$ and $N_2O$ to a thickness of 100 nm are layered. The two-layer structure may instead be obtained by layering a silicon nitride film and a silicon oxynitride film that is formed using TEOS.

The blocking layer 302 and an amorphous semiconductor film to be formed on the blocking layer may both be formed by plasma CVD. Therefore these layers can be formed in succession in the same reaction chamber of a single chamber CVD apparatus, or in a multi-chamber CVD apparatus where the substrate is moved from one reaction chamber to another reaction chamber. In either case, the blocking layer and the amorphous semiconductor film are formed without being exposed to the air, thereby keeping the interface between the two clean.

An insulating film 333 to be utilized as a gate insulating film is formed by plasma CVD or sputtering to a thickness of 40 to 150 nm. In this embodiment, a silicon oxynitride film with a thickness of 70 nm is formed as the film 333. A material particularly preferable as the gate insulating film is a silicon oxynitride film formed from $SiH_4$, $N_2O$ and $O^2$, for the fixed charge density in this film is low. The gate insulating film is not limited to the silicon oxynitride film given above, of course, but it may be a single layer of insulating film such as a silicon oxide film and a tantalum oxide film, or a laminate of those insulating films.

A first conductive film 334 and a second conductive film 335 for forming gate electrodes are formed on the insulating film 333. In this embodiment, the first conductive film 334 is a tantalum nitride film or a titanium film with a thickness of 50 to 100 nm whereas the second conductive film 335 is a tungsten film with a thickness of 100 to 300 nm. These materials are stable in heat treatment conducted in a nitrogen atmosphere at 400 to 600° C., and does not increase the resistivity much.

Figure 16B:
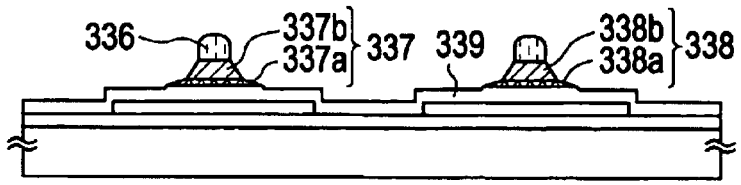

Next, a resist mask 336 is formed as shown in FIG. 16B to conduct first etching treatment for forming the gate electrodes. The etching method is not limited to a particular method but, preferably, the ICP (inductively coupled plasma) etching is employed. In the etching treatment, $CF_4$ and $Cl_2$ are mixed as etching gas, and plasma is generated by giving RF (13.56 MHz) power of 500 W to a coiled electrode at a pressure of 0.5 to 2 Pa, preferably 1 Pa. RF (13.56 MHz) power of 100 W is also given to the substrate side (sample stage) so that substantially negative self-bias voltage can be applied. In the case where mixture of $CF_4$ and $Cl_2$ is used, the tungsten film and the tantalum nitride film or the titanium film are etched at almost the same rate.

Under the etching conditions given above, the edges of the films can be tapered owing to the shape of the resist mask and the effect of the bias voltage applied to the substrate side. The angle of the tapered portion is set to 15 to 45 20 .

In order to etch the films without leaving any residue on the gate insulating film, the etching time is prolonged by about 10 to 20%. The selective ratio of the silicon oxynitride film to the W film is 2 to 4 (typically, 3), and hence the exposed surface of the silicon oxynitride film is etched by about 20 to 50 nm through the over-etching treatment. Through the first etching treatment, first shape conductive layers 337 and 338 (first conductive layers 337a and 338a and second conductive layers 337b and 338b) are formed from the first conductive film and the second conductive film. Denoted by 339 is a gate insulating film and a region of the gate insulating film which is not covered with the first shape conductive layers is etched and thinned by about 20 to 50 nm.

Then first doping treatment is performed to dope the film with an n type impurity (donor). The doping is made by ion doping or ion implantation. In ion doping, the dose is set to $1\times10^{13}$ to $5\times10^{14}$ atoms/cm$^2$. Used as the impurity element for imparting the n type conductivity is a Group 15 element, typically phosphorus (P) or arsenic (As). In this case, the first shape conductive layers 337 and 338 serve as masks against the element used for the doping and the acceleration voltage is adjusted appropriately (20 to 60 keV, for example). The impurity element thus passes through the gate insulating film 339 to form fifth impurity regions 340 and 341. The phosphorus (P) concentration in first impurity regions 725 to 729 is set to $1\times10^{20}$ to $1\times10^{21}$ atoms/cm$^3$.

Figure 16C:
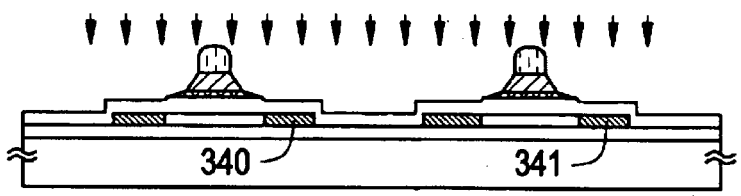

Second etching treatment is then conducted as shown in FIG. 16C. In this etching treatment, ICP etching is employed, $CF_4$ and $Cl_2$ and $O_2$ are mixed as etching gas, and plasma is generated by giving RF (13.56 MHz) power of 500 W to a coiled electrode at a pressure of 1 Pa. RF (13.56 MHz) power of 50 W is also given to the substrate side (sample stage) so that a self-bias voltage lower than that of the first etching treatment can be applied. The tungsten film is subjected to anisotropic etching under these conditions so that the tantalum nitride film or the titanium film serving as the first conductive layers is remained. In this way, second shape conductive layers 342 and 343 (first conductive films 342a and 343a and second conductive films 342b and 343b) are formed. Denoted by 346 is a gate insulating film and a region of the gate insulating film which is not covered with the second shape conductive layers 342 and 343 is further etched and thinned by about 20 to 50 nm.

Figure 16D:
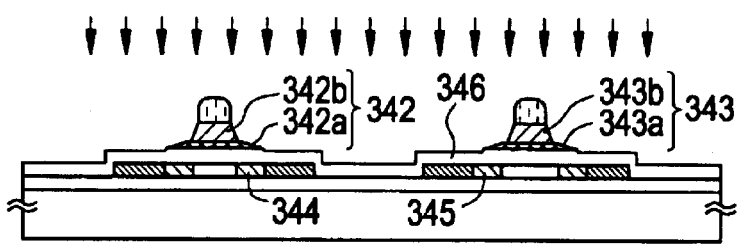

Then second doping treatment is carried out as shown in FIG. 16D. This time, the film is doped with an n type impurity (donor) in a dose smaller than in the first doping treatment at a high acceleration voltage. For example, the acceleration voltage is set to 70 to 120 keV and the dose is set to $1\times10^{13}$ atoms/cm$^3$. As a result, impurity regions are formed inside the first impurity regions that have been formed in the island-like semiconductor films in FIG. 16C. In the second doping treatment, the second conductive films 342b and 343b are used as masks against the impurity element and the impurity element reaches regions below the first conductive films 342a and 343a. Thus formed are sixth impurity regions 344 and 345 that overlap the first conductive films 342a and 343a, respectively. Since the remaining second conductive layers 342b and 343b have almost the same thickness, the concentration difference along the second conductive layers is not large and the concentration in the sixth impurity regions is $1\times10^{17}$ to $1\times10^{19}$ atoms/cm$^3$.

Figure 16E:
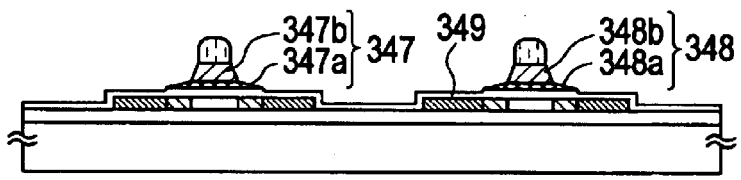

As shown in FIG. 16E, third etching treatment is then conducted to etch the gate insulating film 346. As a result, the second conductive films are also etched and their edges are trimmed to reduce the size of the films. Third shape conductive layers 347 and 348 are thus formed. A region denoted by 349 in FIG. 16E is a remaining part of the gate insulating film.

Figure 16F:
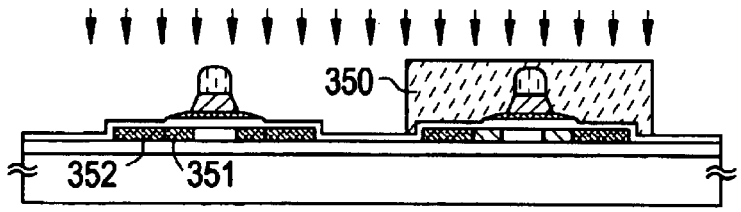
Figure 16G:
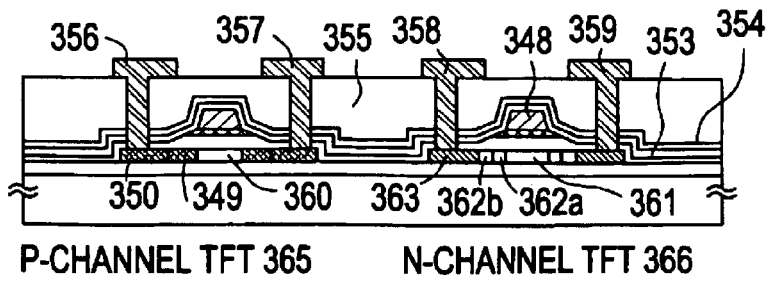

Then a resist mask 350 is formed as shown in FIG. 16F so that the island-like semiconductor film 331 for forming the p-channel TFT is doped with a p type impurity (acceptor). Typically, boron (B) is used. The impurity concentration in seventh impurity regions 351 and 352 is set to $2\times10^{20}$ to $2\times10^{21}$ atoms/cm$^3$. Thus the regions are doped with boron in a concentration 1.5 to 3 times higher than the concentration of phosphorus that has already been contained in the regions, thereby inverting the conductivity of the regions.

The impurity regions are formed in each island-like semiconductor film through the above steps. The third shape conductive layers 347 and 348 serve as gate electrodes. Thereafter, as shown in FIG. 16E, a protective insulating film 353 is formed from a silicon nitride film or a silicon oxynitride film by plasma CVD. The impurity elements used to dope the island-like semiconductor films are then activated for controlling the conductivity type. The activation is preferably made by thermal annealing that uses an annealing furnace. Laser annealing or rapid thermal annealing (RTA) may be employed instead. Thermal annealing is conducted in a nitrogen atmosphere having an oxygen concentration of 1 ppm or less, preferably 0.1 ppm or less, at 400 to 700° C., typically 400 to 600° C. In this embodiment, the film is subjected to heat treatment at 500° C. for four hours.

A silicon nitride film 354 is formed and subjected to heat treatment at 350 to 500° C. Hydrogen is released from the silicon nitride film 354 as a result and hydrogen diffuses to the island-like semiconductor films. The island-like semiconductor films are thus hydrogenated.

An interlayer insulating film 355 is formed of an organic insulating material such as polyimide and acrylic in order to level the surface. A silicon oxide film formed by plasma CVD using TEOS may of course be adopted instead, but it is desirable to choose the above organic insulating material from the viewpoint of better levelness.

Contact holes are formed next, so that source or drain wirings 356 to 359 are formed from Al, Ti, Ta or the like.

A p-channel TFT 365 has a channel formation region 360, and has the seventh impurity regions 349 and 350 that function as source regions or drain regions. An n-channel TFT 366 has a channel formation region 361; a sixth impurity region 362a overlapping the gate electrode that is formed of the third shape conductive layer 348 (gate overlapped drain: GOLD region); a sixth impurity region 362b formed outside the gate electrode (LDD region); and a fifth impurity region 363 functioning as a source region or a drain region.

Through the above steps, a CMOS TFT in which an n-channel TFT and a p-channel TFT are combined complementarily can be obtained. In the n-channel TFT, the LDD region is formed between the channel formation region and the drain region to avoid concentration of electric field at the edge of the drain. The CMOS TFT as such can be used to form a driver circuit of an active matrix liquid crystal display device or of a display device whose pixel portion is composed of light emitting elements. Other than this use, the n-channel TFT or the p-channel TFT as above can be applied to a transistor for forming a pixel portion. The TFT may also be used as a TFT constituting a thin film integrated circuit that is to replace the conventional LSI formed from a semiconductor substrate.

As shown in Embodiment Modes, employing the crystalline silicon film with a high {101} lattice plane orientation ratio lowers the possibility of carriers, which flow across crystal grains, being trapped or scattered due to defects in grain boundaries. Therefore the field effect mobility can be increased and the sub-threshold coefficient can be reduced. In addition, ON current is increased to enhance the current driving ability.

Using the CMOS circuit of this embodiment in combination, a basic logic circuit or a more intricate logic circuit (such as a signal divider circuit, a D/A converter, an operation amplifier and a γ correction circuit) can be formed. It also can constitute a memory or a microprocessor.

Embodiment 4

Figure 17:
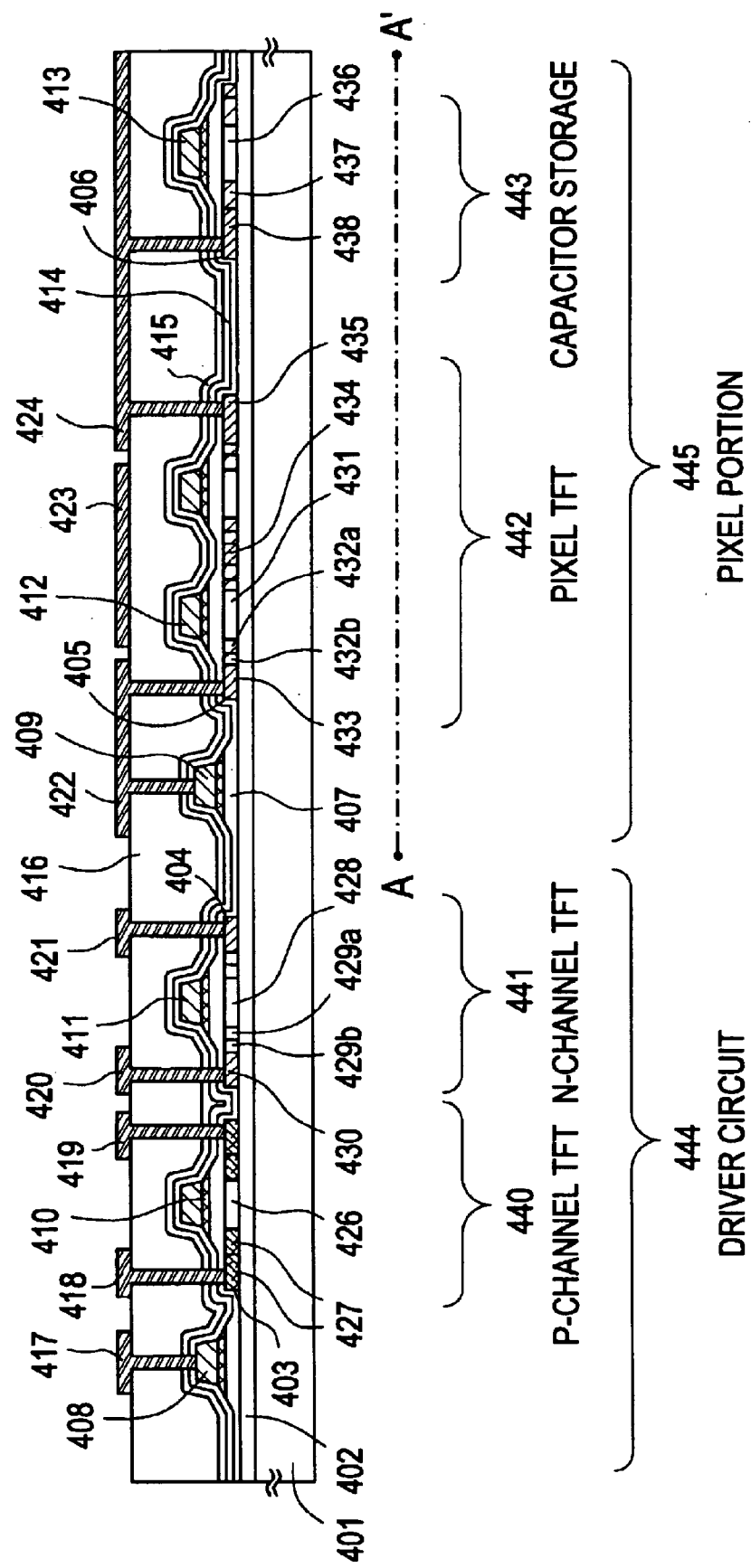
FIG. 17 is a diagram illustrating a structure in which a driver circuit TFT and a pixel portion TFT are formed on the same substrate.
Figure 18:
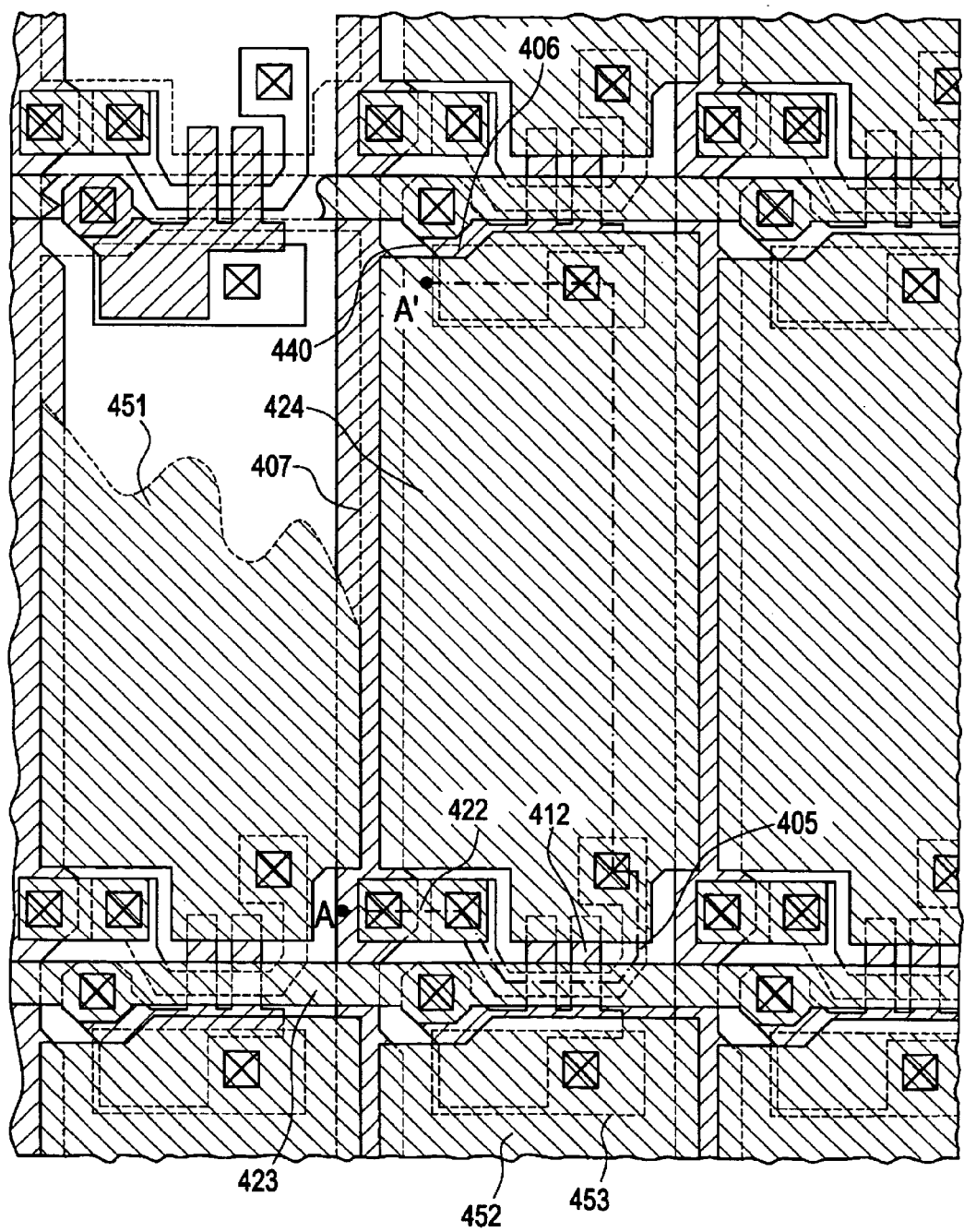
FIG. 18 is a top view of the pixel structure in a pixel portion.

This embodiment gives a description on an example of the structure of a monolithic liquid crystal display device with reference to FIGS. 17 and 18. A monolithic liquid crystal display device is a device in which a pixel portion and a driver circuit are formed on the same substrate. The crystalline silicon film of the present invention which contains germanium is used to form an active region of a switching TFT for the pixel portion and active regions of n-channel and p-channel TFTs for the driver circuit. The crystalline silicon film containing germanium may be formed in accordance with any one of the methods of Embodiment Modes 1 to 3.

A substrate 401 in FIG. 17 is preferably a glass substrate such as barium borosilicate glass substrate or an alumino borosilicate glass substrate. A quartz substrate maybe used instead. When the substrate 401 is a glass substrate, a blocking layer 402 is formed.

The structure is not limited for a switching pixel TFT 442 in a pixel portion 445 and for an n-channel TFT 441 and a p-channel TFT 440 of a driver circuit 444. The description of this embodiment is made taking as an example a TFT formed in accordance with Embodiment 3. Needless to say, a TFT according to Embodiment 1 or a TFT according to Embodiment 2 may also be employed.

In the driver circuit 444, wirings 408 and 417, and source or drain wirings 418 to 421 are formed. In the pixel portion 445, a pixel electrode 424, a gate wiring 423, a connection electrode 422 and a source wiring 409 are formed.

The p-channel TFT 453 of the driver circuit 444 has, in a semiconductor film 403, a channel formation region 426 and a seventh impurity region 427 that functions as a source region or a drain region.

The n-channel TFT 441 has, in a semiconductor film 404, a channel formation region 428; a sixth impurity region 429a overlapping a gate electrode that is formed of a third shape conductive layer 411 (GOLD region); a sixth impurity region 429b formed outside the gate electrode (LDD region); and a fifth impurity region 430 functioning as a source region or a drain region.

The pixel TFT 442 has, in a semiconductor film 405, a channel formation region 431; a sixth impurity region 432a overlapping a gate electrode that is formed of a third shape conductive layer 412 (GOLD region); a sixth impurity region 432b formed outside the gate electrode (LDD region); and fifth impurity regions 433, 434 and 435 functioning as source regions or drain regions. A semiconductor film 406 functions as one of electrodes of a capacitor storage 443, and has a sixth impurity region 437, a fifth impurity region 438 and a region 436 that is not doped with an impurity.

In the pixel portion 445, the source wiring 409 is electrically connected through the connection electrode 422 to the source or drain region 433 of the pixel TFT 442. The gate wiring 423 is electrically connected to the third shape conductive layer 412 that functions as a gate electrode. The pixel electrode 424 is connected to the source or drain region 435 of the pixel TFT 442 and to the impurity region 438 of the semiconductor film 406 that is one of electrodes of the capacitor storage 443.

The sectional view of the pixel portion 445 in FIG. 17 is taken along the line A–A' in FIG. 18. The third shape conductive layer 412 functioning as a gate electrode doubles as one of electrodes of a capacitor storage of an adjacent pixel, and partially overlaps a semiconductor film 453 that is connected to a pixel electrode 452 to form a capacitance. The source wiring 407, the pixel electrode 424 and an adjacent pixel electrode 451 are arranged such that the ends of the pixel electrodes 424 and 451 are placed on the source wiring 407 to form an overlapping portion. The overlapping portion blocks stray light and enhances light-shielding property of the device.

Embodiment 5

In such a case of n-channel type TFT, elements belonging to the group 15 in the periodic table (preferably, phosphorus) or elements belonging to the group 13 in the periodic table (preferably, boron) may be added to the semiconductor in the channel forming region to selectively fabricate the enhancement type and depletion type.

In a case where an NMOS circuit is formed by combining the n-channel TFTs, it is formed as a combination of enhancement-type TFTs (hereinafter referred to as "EEMOS circuit") or a combination of depletion-type and enhancement-type TFTs (hereinafter referred to as "EDMOS circuit").

Figure 19A:
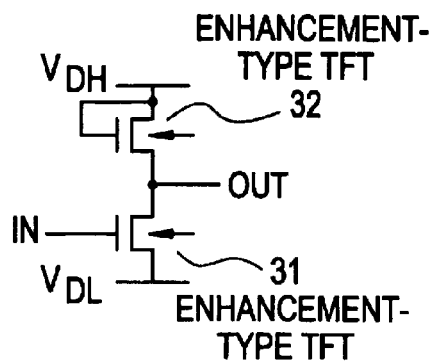
FIGS. 19A and 19B are diagrams showing the structure of an NMOS circuit.
Figure 19B:
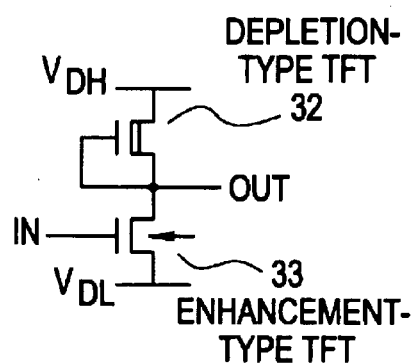

FIG. 19A shows an example of the EEMOS circuit, and FIG. 19B shows an example of the EDMOS circuit. Each of components 31 and 32 shown in FIG. 19A is an E-type NTFT. Components 33 shown in FIG. 19B is an E-type NTFT and 34 is a depletion type of n-channel TFT (hereinafter referred to as "D-type NTFT"), respectively.

In FIGS. 19A and 19B, $V_{DH}$ designates a power supply line to which a positive voltage is applied (positive power supply line), and $V_{DL}$ designates a power supply line to which a negative voltage is applied (negative power supply line). The negative power supply line may be a ground-potential power supply line (grounded power supply line).

Figure 20A:
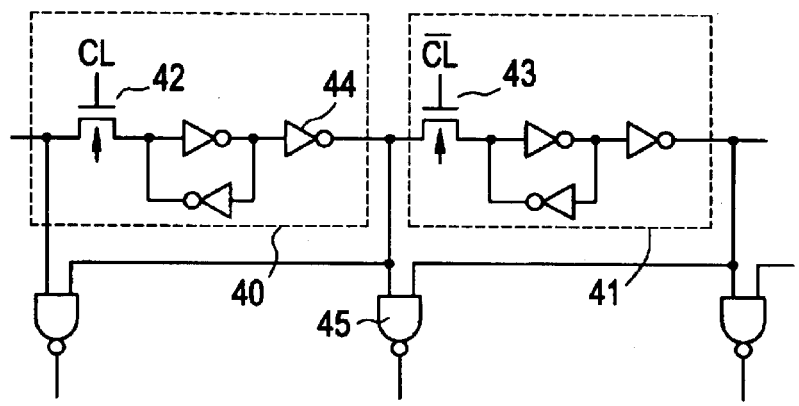
FIGS. 20A and 20B are diagrams showing the structure of a shift register.
Figure 20B:
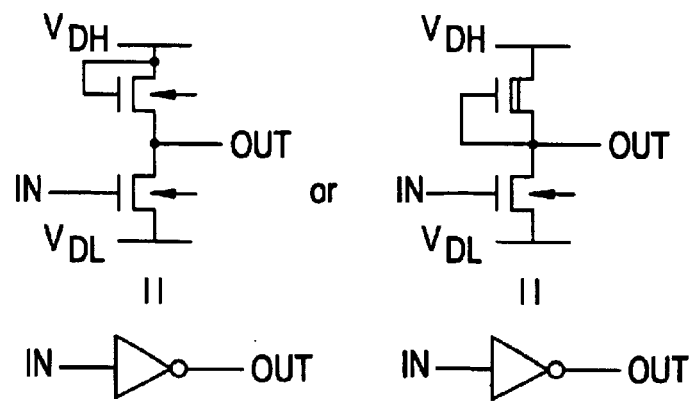

FIG. 20 shows an example of a shift register formed by using the EEMOS circuit shown in FIG. 19A or the EDMOS circuit shown in FIG. 19B. Portions 40 and 41 of FIG. 20 are flip-flop circuits. Components 42 and 43 are E-type NTFTs. A clock signal (CL) is input to the gate of the E-type NTFT 42, and a clock signal (CL-bar) of the opposite polarity is input to the gate of the E-type NTFT 43. A symbol indicated by 44 represents an inverter circuit. To form this inverter circuit, the EEMOS circuit shown in FIG. 19A or the EDMOS circuit shown in FIG. 19B is used, as shown in FIG. 19B. Therefore all of driver circuits of the liquid crystal display device can be structured by n-channel type TFT.

Embodiment 6

Figure 22A:
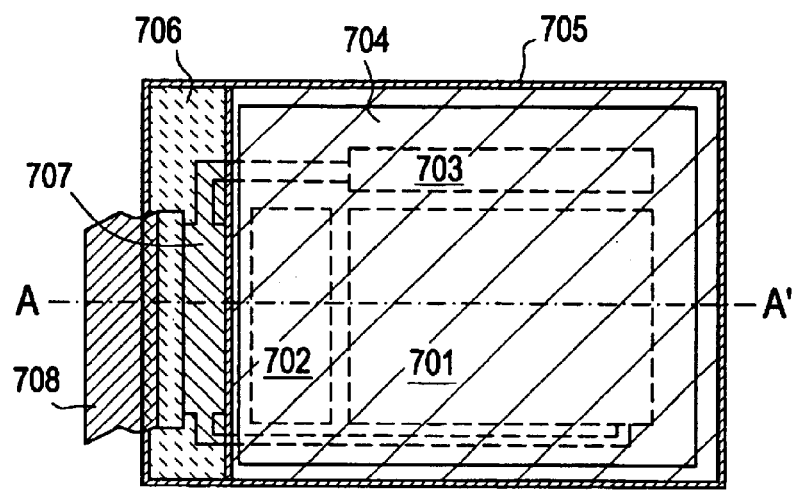
FIGS. 22A and 22B are respectively a top view and a sectional view of pixels in a display device in which a pixel portion is formed from light emitting elements.
Figure 22B:
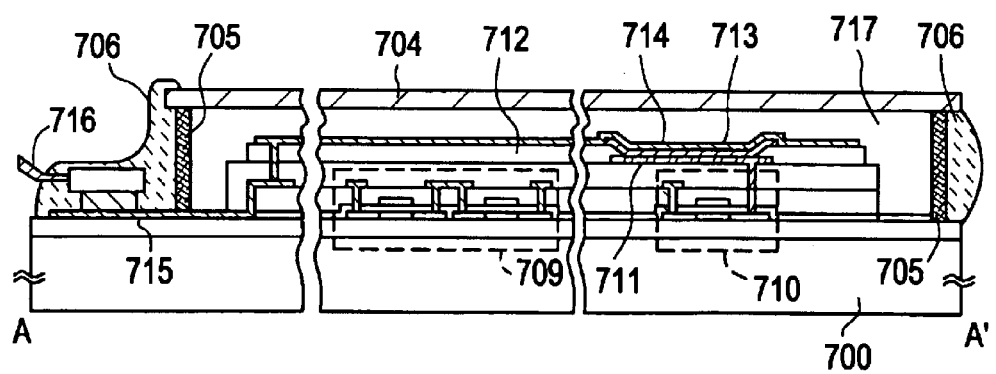

The description given below with reference to FIG. 21 and FIGS. 22A and 22B is about an example of manufacturing a display device composed of light emitting elements that provide electroluminescence (hereinafter abbreviated as EL) from TFTs formed in accordance with Embodiments 1 to 5. EL defined here refers to either light emission by singlet excitation (fluorescence) or light emission by triplet excitation (phosphorescence), or both.

FIG. 21 shows an example of a light emitting device in which a pixel portion and a driver circuit for driving the pixel portion are formed on the same insulator (the device shown is not sealed yet). In FIG. 21, a CMOS circuit that is the basic unit is shown as the driver circuit and only one pixel is shown in the pixel portion. This CMOS circuit is obtained in accordance with Embodiment 3.

In FIG. 21, an insulator is denoted by 600. Formed on the insulator 600 are: an n-channel TFT 601; a p-channel TFT 602; a switching TFT 603 that is a p-channel TFT; and a current controlling TFT 604 that is an n-channel TFT. The TFTs in this embodiment are all reversed stagger TFTs.

The n-channel TFT 601 and the p-channel TFT 602 are as described in Embodiment 3 and hence the explanations thereof are omitted here. The switching TFT 603 has a structure in which two channel formation regions are formed between a source region and a drain region (double gate structure). The explanation of the switching TFT is also omitted because it can easily be understood if the description on the structure of the p-channel TFT in Embodiment 2 is consulted. The TFT of this embodiment is not limited to the double gate structure but may take the single gate structure in which one channel formation region is formed or the triple gate structure in which three channel formation regions are formed.

A contact hole is formed in a first interlayer insulating film 606 on a drain region 605 of the current controlling TFT 604 before a second interlayer insulating film 607 is formed. This is to facilitate the etching process when a contact hole is formed in the second interlayer insulating film 607. The contact hole formed in the second interlayer insulating film 607 reaches the drain region 605, and a pixel electrode 608 connected to the drain region 605 is provided. The pixel electrode 608 is an electrode functioning as a cathode of a light emitting element, and is formed of a conductive film containing an element that belongs to Group 1 or 2 in the periodic table. In this embodiment, a conductive film of a compound of lithium and aluminum is used.

Denoted by 613 is an insulating film formed to cover the end of the pixel electrode 608, and the insulating film is called herein as a bank. The bank 613 may be formed of an insulating film containing silicon or a resin film. When a resin film is used, carbon particles or metal particles are put in the resin film so that the resistivity of the resin film is changed to $1 \times 10^6$ to $1 \times 10^{12}$ Ωm (preferably $1 \times 10^8$ to $1 \times 10^{10}$ Ωm). This prevents puncture upon film formation.

A light emitting element 609 is composed of the pixel electrode (cathode) 608, an EL layer 611 and an anode 612. The anode 612 is formed of a conductive film having a large work function, typically, an oxide conductive film. Examples of the usable oxide conductive film include an indium oxide film, a tin oxide film, a zinc oxide film, and a compound film of these oxides.

The EL layer in this specification refers to a laminate obtained by combining a light emitting layer with a hole injection layer, a hole transportation layer, a hole blocking layer, an electron transportation layer, an electron injection layer, or an electron blocking layer.

A known organic EL material or a known inorganic EL material can be used for the EL layer. Organic EL materials can be divided into low molecular weight (monomer-based) materials and high molecular weight (polymer-based) materials, and both types can be used. A thin film formed from a light emitting material that emits light (fluorescence)

by singlet excitation (singlet compound) or a thin film formed from a light emitting material that emits light (phosphorescence) by triplet excitation (triplet compound) may be used for the EL layer.

Though not shown, it is effective to form a passivation film so as to cover the light emitting element 609 completely after the anode 612 is formed. For the passivation film, an insulating film such as a carbon film, a silicon nitride film or a silicon oxynitride film is formed. The passivation film may be a single layer or laminate of these insulating films.

Described next with reference to FIGS. 22A and 22B is the display device that has finished the process up through the sealing (or enclosing) step for protecting the light emitting element.

FIG. 22A is a top view of the display device that has finished the process up through the step of sealing the light emitting element. FIG. 22B is a sectional view taken along the line A–A' in FIG. 22A. A pixel portion, a source side driver circuit and a gate side driver circuit are indicated by the dotted lines and denoted by 701, 702 and 703, respectively. Denoted by 704 is a cover member, 705, a first sealing member, and 706, a second sealing member.

Reference symbol 708 denotes a wiring for transmitting a signal to be inputted to the source side driver circuit 702 and the gate side driver circuit 703. The wiring 708 receives a video signal or a clock signal from an FPC (flexible printed circuit) 708 that serves as an external input terminal. Although only the FPC is shown here, a printed wiring board (PWB) may be attached to the FPC.

Next, the sectional structure of the device will be described with reference to FIG. 22B. A pixel portion and a source side driver circuit 709 are formed on an insulator 700. The pixel portion is composed of a plurality of pixels each having a current controlling TFT 710 and a pixel electrode 711 that is electrically connected to a drain of the TFT 710. The source side driver circuit 709 is composed of a CMOS circuit in which an n-channel TFT and a p-channel TFT are combined. A polarizing plate (typically a circular polarizing plate) may be bonded to the insulator 700.

A bank 712 is formed on each end of the pixel electrode 711. On the pixel electrode 711, an EL layer 713 and an anode 714 of the light emitting element are formed. The anode 714 also functions as a wiring shared by all the pixels, and is electrically connected to an FPC 716 through a connection wiring 715. All of the elements in the pixel portion and in the source side driver circuit 709 are covered with a passivation film (not shown).

The cover member 704 is bonded by the first sealing member 705. A spacer may be provided to ensure the distance between the cover member 704 and the EL element. A gap 717 is formed in a space defined by the first sealing member 705. The first sealing member 705 is desirably formed of a material that does not transmit moisture or oxygen. It is effective to place, in the gap 717, a substance having a hygroscopic effect or a substance having an anti-oxidizing effect.

It is appropriate to cover the front surface and the back surface of the cover member 704 with protective films made of carbon films (specifically, diamond-like carbon films) each having a thickness of 2 to 30 nm. The carbon films (not shown here) mechanically protect the surfaces of the cover member 704 as well as prevent permeance of oxygen and moisture.

After the cover member 704 is bonded, the second sealing member 706 is formed so as to cover the exposed surface of the first sealing member 705. The second sealing member 706 may be formed from the same material as the first sealing member 705.

The light emitting element is thus sealed by the structure above, thereby cutting the light emitting element off from the surroundings completely. This prevents moisture, oxygen and other external substances that accelerate degradation of the EL layer through oxidization from entering the element. Accordingly, a display device of high reliability can be obtained.

Embodiment 7

Figure 23A:
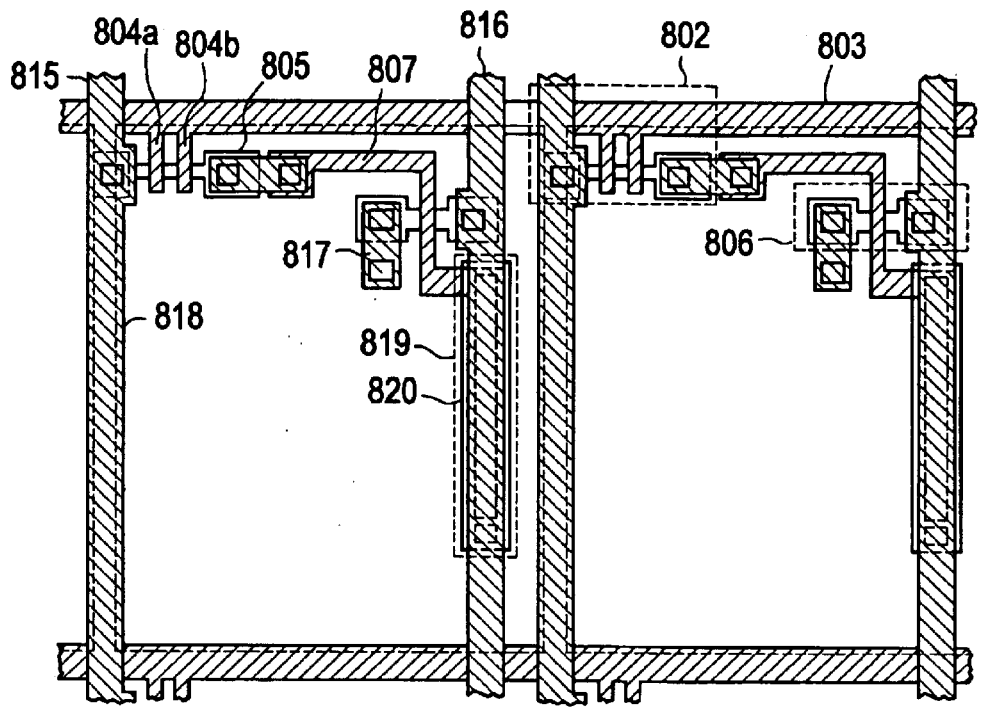
FIGS. 23A and 23B are respectively a top view and a circuit diagram of a display device in which a pixel portion is formed from light emitting elements.
Figure 23B:
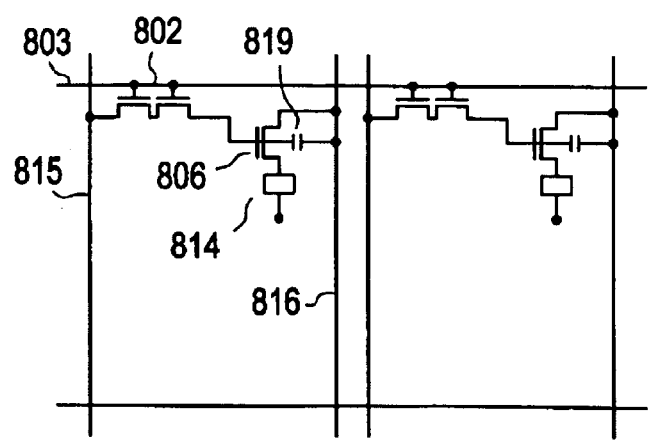

This embodiment gives more detailed descriptions on the pixel portion of the display device obtained in Embodiment 4. The top structure of the pixel portion is shown in FIG. 23A whereas the circuit diagram thereof is shown in FIG. 23B. Common reference symbols are used in FIG. 23A and FIG. 23B to be cross-referred.

A switching TFT 802 has a source connected to a source wiring 815 and has a drain connected to a drain wiring 805. The drain wiring 805 is electrically connected to a gate electrode 807 of a current controlling TFT 806. The current controlling TFT 806 has a source electrically connected to a current supply line 816 and has a drain electrically connected to a drain wiring 817. The drain wiring 817 is electrically connected to a pixel electrode (cathode) 818 indicated by the dotted line.

A capacitor storage is formed here in a region denoted by 819. The capacitor storage 819 is composed of a semiconductor film 820 that is electrically connected to the current supply line 816, an insulating film (not shown) on the same layer as the gate insulating film, and the gate electrode 807. A capacitor composed of the gate electrode 807, the same layer (not shown) as the first interlayer insulating film, and the current supply line 816 may also be used as a capacitor storage.

Embodiment 8

Figure 24:
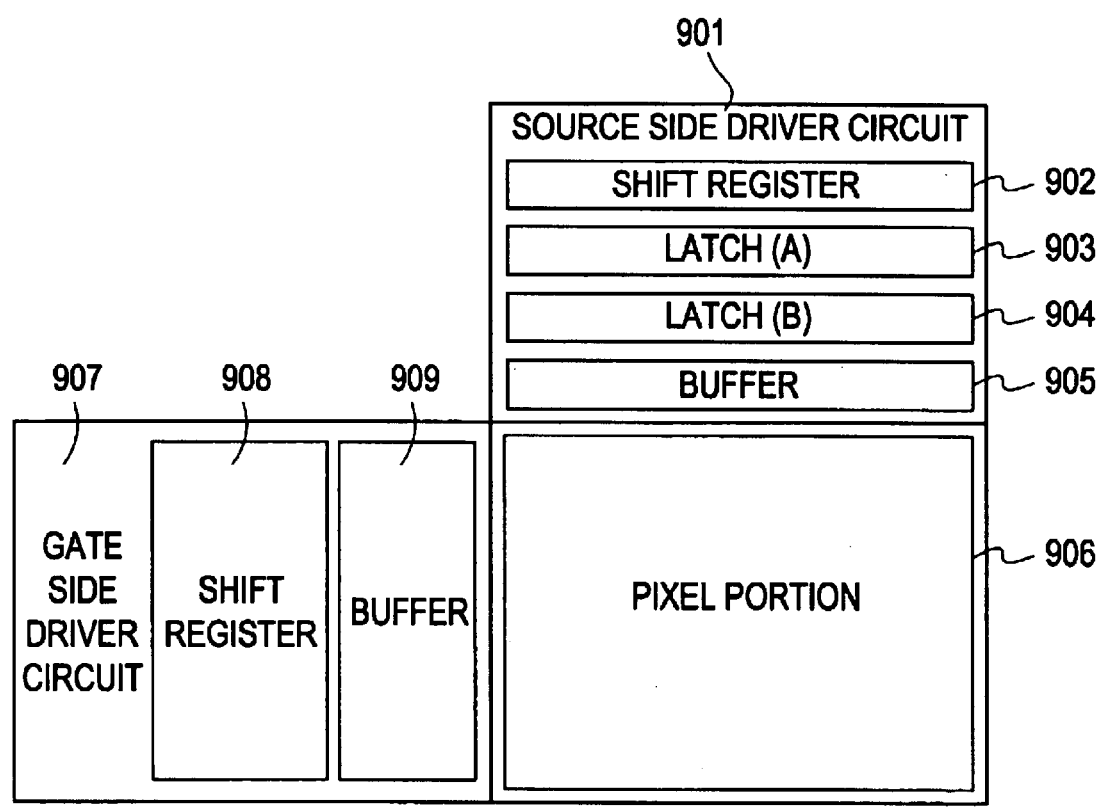
FIG. 24 is a circuit block diagram showing a digitally-driven display device.

This embodiment shows an example of the circuit structure of the display device described in Embodiment 4 or 5 with reference to FIG. 24. The circuit structure shown in this embodiment is for digital driving. The structure according to this embodiment has a source side driver circuit 901, a pixel portion 906 and a gate side driver circuit 907. The driver circuit herein is a generic term for a source side driver circuit and a gate side driver circuit.

The source side driver circuit 901 is provided with a shift register 902, a latch (A) 903, a latch (B) 904, and a buffer 905. In the case of analog driving, a sampling circuit (transfer gate) is provided in place of the latches (A) and (B). The gate side driver circuit 907 is provided with a shift register 908 and a buffer 909.

In this embodiment, the pixel portion 906 includes a plurality of pixels, each of which is provided with a light emitting element. It is preferable that a cathode of the light emitting element is electrically connected to a drain of a current controlling TFT.

The source side driver circuit 901 and the gate side driver circuit 907 are composed of n-channel TFTs or p-channel TFTs obtained in accordance with Embodiments 1 to 3.

Though not shown, another gate side driver circuit may be added opposite the gate side driver circuit 907 across the pixel portion 906. In this case, two of the gate side driver circuits have the same structure and share a gate wiring, so that the other can send a gate signal in place of the broken one to make the pixel portion operate normally.

The above structure is realized by manufacturing TFTs in accordance with the manufacturing process of one of Embodiments 1 to 3.

Embodiment 9

This embodiment gives a specific example of the exemplary circuit structure shown in Embodiment 8 for the display device whose pixel portion is composed of light emitting elements. Described in this embodiment in particular is the case where the source side driver circuit and the gate side driver circuit are all composed of the E type NTFTs of Embodiment 1. The description will be given with reference to FIGS. 25 to 27. This embodiment uses, instead of the shift register, a decoder that is comprised of only n-channel TFTs.

Figure 25:
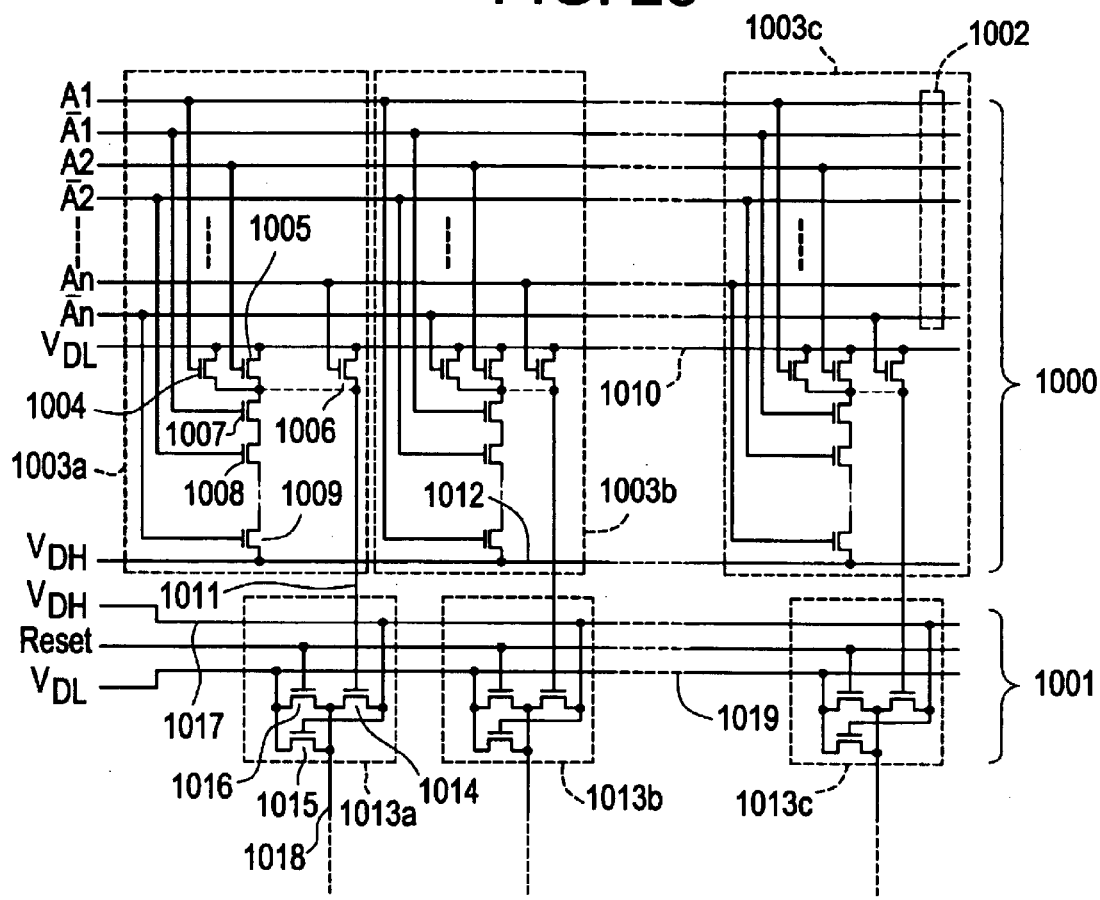
FIG. 25 is a diagram showing the structure of a gate side driver circuit composed of n-channel TFTs.

FIG. 25 shows an example of the gate side driver circuit. In FIG. 25, reference symbol 1000 denotes a decoder of the gate side driver circuit and 1001 denotes a buffer unit of the gate side driver circuit. The buffer unit refers to a part where a plurality of buffers (buffer amplifiers) are integrated. A buffer is a circuit that drives without transferring the influence of the downstream to the upstream.

First, the gate side decoder 1000 will be described. Denoted by 1002 are input signal lines (hereinafter referred to as selection lines) of the decoder 1000. Of the lines 1002, lines A1, A 1 (for a signal obtained by inverting the polarity of Al), A2, A 2 (for a signal obtained by inverting the polarity of A2), . . . , An, A n (for a signal obtained by inverting the polarity of An) are shown here. In short, 2n selection lines are arranged.

Figure 26:
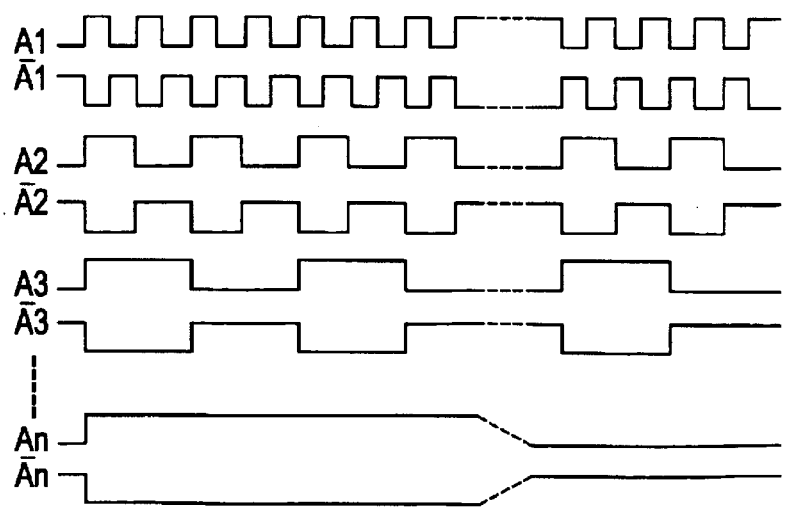
FIG. 26 is a timing chart of a decoder input signal.

The number of selection lines is determined by the number of rows of gate wirings outputted from the gate side driver circuit. For instance, if the display device has a pixel portion capable of VGA level display, the number of gate wiring is 480 and hence selection lines corresponding to 9 bits (n=9), namely, 18 selection lines in total are required. The selection lines 1002 send signals shown in a timing chart of FIG. 26. As shown in FIG. 26, when the frequency of A1 is given as 1, the frequency of A2 is $2^{-1}$ times thereof, the frequency of A3 is $2^{-2}$ times thereof, and the frequency of An is $2^{-(n-1)}$ times thereof.

Reference symbol 1003a denotes a first stage NAND circuit (also called a NAND cell), 1003b denotes a second stage NAND circuit, and 1003c denotes an n-th stage NAND circuit. The number of required NAND circuits corresponds to the number of gate wirings and n NAND circuits are needed here. In short, the decoder 1000 of the present invention is comprised of a plurality of NAND circuits.

Each of the NAND circuits 1003a to 1003c has a combination of n-channel TFTs 1004 to 1009. Actually, 2n TFTs are used in each of the NAND circuits 1003. The n-channel TFTs 1004 to 1009 each have a gate that is connected to one of the selection lines 1002 (A1, A 1 , A2, A 2 , . . . An, A n).

In the NAND circuit 1003a, the n-channel TFTs 1004 to 1006 each having a gate connected to one of the lines A1, A2, . . . An (these lines will be referred to as positive selection lines) are connected to one another in parallel, and connected to a negative power supply line ($V_{DL}$) 1010 as the common source and to an output line 1011 as the common drain. The n-channel TFTs 1007 to 1009 each having a gate connected to one of the lines A 1, A 2, . . . A n (these lines will be referred to as negative selection lines) are connected to one another in series, and the n-channel TFT 1009 positioned at an end of the circuit has its source connected to a positive power supply line ($V_{DH}$) 1012 whereas the n-channel TFT 1007 positioned at the other end of the circuit has its drain connected to the output line 1011.

As described above, each NAND circuit of the present invention includes n n-channel TFTs that are connected in series and n n-channel TFTs that are connected in parallel. However, the combination of the n-channel TFTs and the selection lines is different from one circuit to the other circuit out of the n NAND circuits 1003a to 1003c. In other words, only one output line 1011 is selected at a time and the selection lines 1002 receive signals that select the output lines 1011 one by one starting from an end.

The buffer unit 1001 is composed of a plurality of buffers 1013a to 1013c in accordance with the NAND circuits 1003a to 1003c, respectively. The buffers 1013a to 1013c may all be structured in the same way.

Each of the buffers 1013a to 1013c is composed of n-channel TFTs 1014 to 1016. The output line 1011 from the decoder is inputted as a gate of the n-channel TFT 1014 (a first n-channel TFT). The n-channel TFT 1014 uses a positive power supply line ($V_{DH}$) 1017 as its source and uses as its drain a gate wiring 1018 that leads to the pixel portion. The n-channel TFT 1015 (a second n-channel TFT) uses the positive power supply line ($V_{DH}$) 1017 as its gate, a negative power supply line ($V_{DL}$) 1019 as its source, and the gate wiring 1018 as its drain. The n-channel TFT 1015 is always kept turned ON.

In other words, each of the buffers 1013a to 1013c of the present invention has the first n-channel TFT (the n-channel TFT 1014) and the second n-channel TFT (the n-channel TFT 1015) that is connected in series to the first n-channel TFT and uses as its gate the drain of the first n-channel TFT.

The n-channel TFT 1016 (a third n-channel TFT) uses a reset signal line (Reset) as its gate, the negative power supply line ($V_{DL}$) 1019 as its source, and the gate wiring 1018 as its drain. The negative power line ($V_{DL}$) 1019 may be a ground power supply line (GND).

The channel width of the n-channel TFT 1015 (W1) and the channel width of the n-channel TFT 1014 (W2) satisfy the relation W1<W2. The channel width refers to the length of a channel formation region in the direction perpendicular to the channel length.

The buffer 1013a operates as follows. First, during a negative voltage is applied to the output line 1011, the n-channel TFT 1014 is in an OFF state (a state in which a channel is not established). On the other hand, the n-channel TFT 1015 is always in an ON state (a state in which a channel is established) and hence the voltage of the negative power supply line 1019 is applied to the gate wiring 1018.

When a positive voltage is applied to the output line 1011, the n-channel TFT 1014 is turned ON. At this point, the electric potential of the gate wiring 1018 is influenced by the output on the n-channel TFT 1014 side because the channel width of the n-channel TFT 1014 is greater than the channel width of the n-channel TFT 1015. As a result, the voltage of the positive power supply line 1017 is applied to the gate wiring 1018. The gate wiring 1018 thus outputs a positive voltage (a voltage that turns the n-channel TFT used as a switching element of a pixel ON) when a positive voltage is applied to the output line 1011. On the other hand, when a negative voltage is applied to the output line 1011, the gate wiring 1018 always outputs a negative voltage (a voltage that turns the n-channel TFT used as a switching element of a pixel OFF).

The n-channel TFT 1016 is used as a reset switch for forcedly lowering the positive voltage applied to the gate wiring 1018 to the negative voltage. Specifically, the n-channel TFT 1016 inputs a reset signal when the selection period for the gate wiring 1018 is ended so that the negative voltage is applied to the gate wiring 1018. However, the n-channel TFT 1016 may be omitted.

Figure 27:
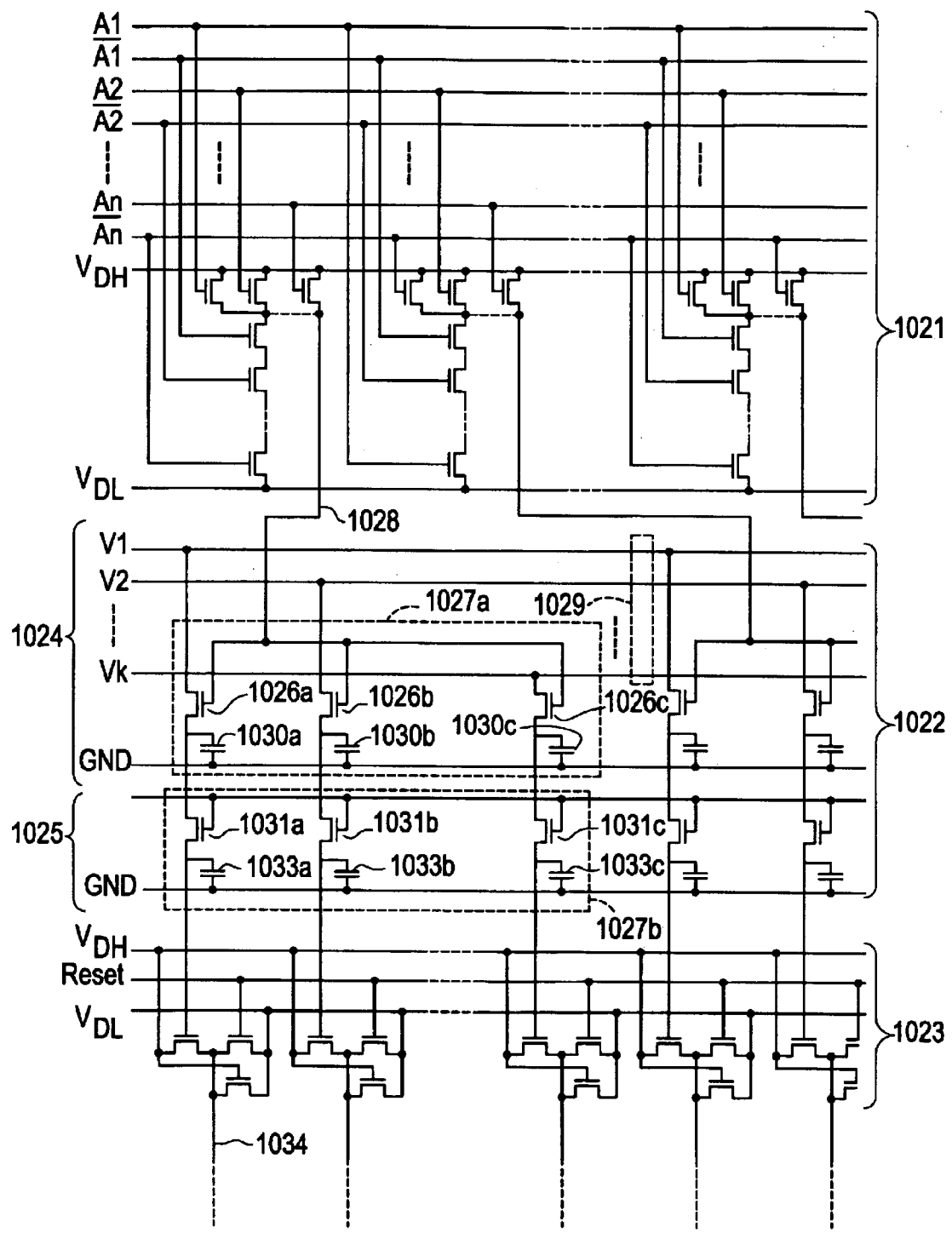
FIG. 27 is a diagram showing the structure of a source side driver circuit composed of n-channel TFTs.

The gate side driver circuit operating as above selects the gate wirings one by one. Next, the structure of the source side driver circuit is shown in FIG. 27. The source side driver circuit shown in FIG. 27 includes a decoder 1021, a latch 1022 and a buffer unit 1023. The structure of the decoder 1021 and the buffer unit 1023 are the same as the decoder and the buffer unit of the gate side driver circuit, and explanations thereof are omitted here.

In the case of the source side driver circuit of FIG. 27, the latch 1022 is composed of a first stage latch 1024 and a second stage latch 1025. The first stage latch 1024 and the second stage latch 1025 each have a plurality of basic units 1027 each of which is composed of m n-channel TFTs 1026a to 1026c. An output line 1028 from the decoder 1021 is inputted to gates of the m n-channel TFTs 1026a to 1026c that constitute each of the basic units 1027. The symbol m represents an arbitrary integer.

If the display device is capable of VGA level display, for instance, there are 640 source wirings. When m=1, the number of required NAND circuits is also 640 and 20 selection lines (corresponding to 10 bits) are needed. When m=8, required NAND circuits are 80 and 14 selection lines (corresponding to 7 bits) are needed. In short, the number of required NAND circuits is M/m given the number of source wirings is M.

Sources of the n-channel TFTs 1026a to 1026c are respectively connected to video signal lines (V1, V2, . . . Vk) 1029. Therefore, when a positive voltage is applied to the output line 1028, the n-channel TFTs 1026a to 1026c are turned ON at once and video signals associated with the respective TFTs are inputted. The video signals thus inputted are held in capacitors 1030a to 1030c that are connected to the n-channel TFTs 1026a to 1026c, respectively.

The second stage latch 1025 has a plurality of basic units 1027b. Each of the basic units 1027b is composed of m n-channel TFTs 1031a to 1031c. Gates of the n-channel TFTs 1031a to 1031c are all connected to a latch signal line 1032, so that the n-channel TFTs 1031a to 1031c are turned ON at once when a negative voltage is applied to the latch signal line 1032.

As a result, signals that have been held in the capacitors 1030a to 1030c are now held by capacitors 1033a to 1033c that are connected to the n-channel TFTs 1031a to 1031c, respectively. At the same time, the signals that have been held in the capacitors 1030a to 1030c are outputted to the buffer unit 1023. Then the signals are outputted through the buffers to a source wiring 1034 as illustrated in FIG. 25. The source side driver circuit operating as above selects the source wirings one by one.

As described above, a pixel portion and a driver circuit can all be composed of n-channel TFTs by making a gate side driver circuit and a source side driver circuit solely from n-channel TFTs.

Embodiment 10

Figure 28:
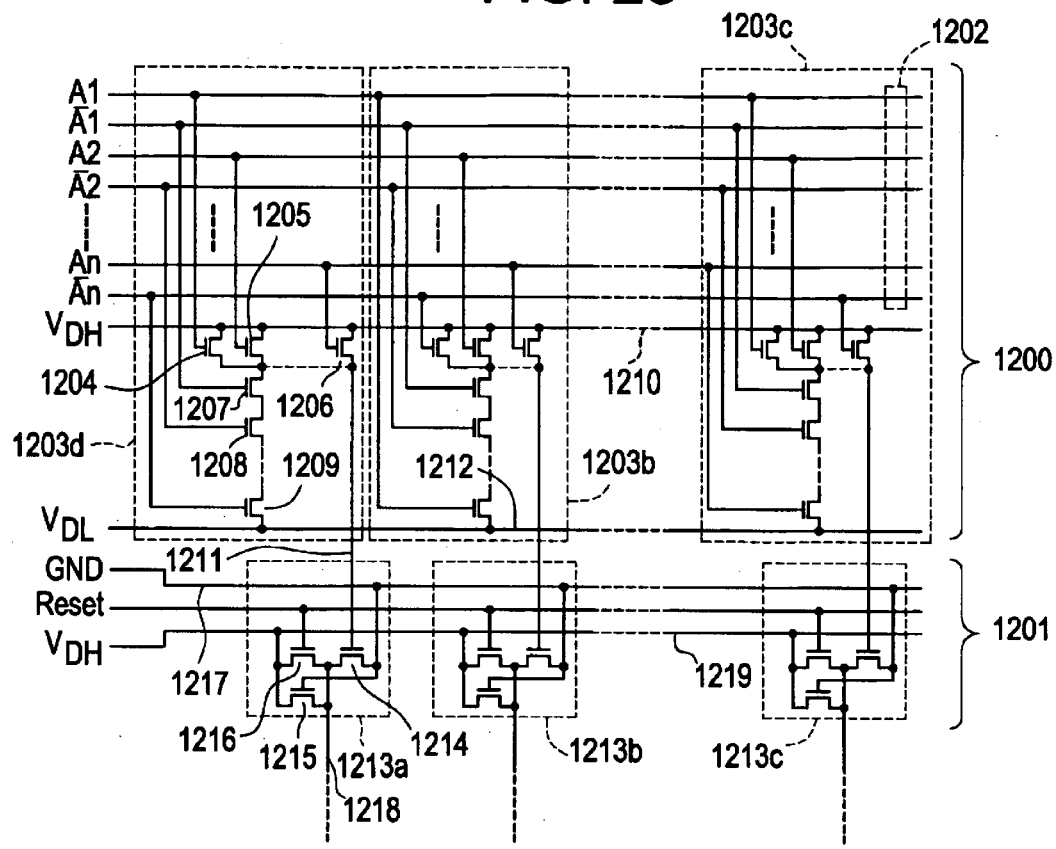
FIG. 28 is a diagram showing the structure of a gate side driver circuit composed of p-channel TFTs.

In this embodiment, the specific example of circuit structure of display device shown in Embodiment 8. Especially this embodiment is such a case that p-channel TFT which is described in Embodiment 2 is used in the source side driver circuit and the gate side driver circuit. A decoder employing p-channel TFTs as shown in FIG. 1 is used. FIG. 28 illustrates an example of a gate-side driver circuit.

In FIG. 28, reference numeral 1200 denotes a decoder in the gate-side driver circuit, and 1201 denotes a buffer section of the gate-side driver circuit. Here, the buffer section refers to a section in which a plurality of buffers (buffer amplifiers) are integrated. Furthermore, the buffer refers to a circuit capable of exhibiting the driving capability without providing any adverse effects of a subsequent stage on a previous stage.

The gate-side decoder 1200 will be now described. Reference numeral 1202 denotes input signal lines (hereinafter referred to as the selection lines) of the decoder 1200, and more specifically indicates A1, A1 bar (a signal having an inverted polarity with respect to A1), A2, A2 bar (a signal having an inverted polarity with respect to A2), . . . , An, and An bar (a signal having an inverted polarity with respect to An). In other word, it can be considered that the 2n selection lines are arranged.

Figure 29:
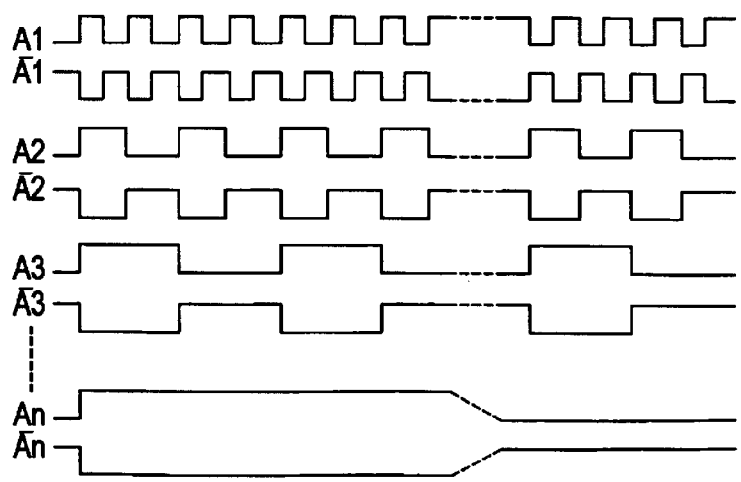
FIG. 29 is a timing chart of a decoder input signal.

The number of the selection lines is determined based on the number of gate wirings to be output from the gate-side driver circuit. For example, in the case where a pixel section for VGA display is provided, 480 gate wirings are required, which in turn requires a total of 18 selection lines to be provided for 9 bits (corresponding to the case where n=9). The selection lines 1202 transmit signals shown in the timing chart in FIG. 29. As shown in FIG. 29, assuming that a frequency of A1 is normalized to be 1, a frequency of A2 can be expressed as $2^{-1}$, a frequency of A3 can be expressed as $2^{-2}$, and a frequency of An can be expressed as $2^{-(n-1)}$.

Reference numeral 1203a denotes a first-stage NAND circuit (also referred to as the NAND cell), while 1203b and 1203c denote a second-stage and an n-th stage NAND circuits, respectively. The required number of the NAND circuits is equal to the number of the gate wirings, and specifically, n NAND circuits are required here. In other word, the decoder 1200 in accordance with the present invention is composed of a plurality of the NAND circuits.

In each of the NAND circuits 1203a to 1203c, p-channel TFTs 1204 to 1209 are combined to form a NAND circuit. Actually, 2n TFTs are employed in each of the NAND circuits 1203. Furthermore, a gate of each of the p-channel TFTs 1204 to 1209 is connected to either one of the selection lines 1202 (A1, A1 bar, A2, A2 bar, . . . , An, An bar).

In this case, in the NAND circuit 1203a, the p-channel TFTs 1204 to 1206 that respectively have the gates connected to any of A1, A2, . . . , An (which are referred to as the positive selection lines) are connected to each other in parallel, and further connected to a positive power source wiring ($V_{DH}$) 1210 as a common source, as well as to an output line 1211 as a common drain. On the other hand, the remaining p-channel TFTs 1207 to 1209 that respectively have the gates connected to any of A1 bar, A2 bar, . . . , An bar (which are referred to as the negative selection lines) are connected to each other in series, and a source of the p-channel TFT 1209 positioned at one end of the circuit is connected to a negative power source wiring ($V_{DL}$) 1212 while a drain of the p-channel TFT 1207 positioned at the other end of the circuit is connected to the output line 1211.

As described in the above, the NAND circuit in accordance with the present invention includes the n TFTs of one conductivity type (the p-channel TFTs in this case) connected in series and the other n TFTs of the one conductivity type (the p-channel TFTs in this case) connected in parallel. It should be noted that in the n NAND circuits 1203a to 1203c, all of combinations among the p-channel TFTs and the selection lines are different from each other. In other word, the output lines 1211 are configured so that only one of them is selected, and signals are input to the selection lines 1202 such that the output lines 1211 are sequentially selected from one side thereof.

Then, the buffer 1201 is composed of a plurality of buffers 1213a to 1213c so as to respectively correspond to the NAND circuits 1203a to 1203c. It should be noted that the buffers 1213a to 1213c may have the same structure.

Furthermore, the buffers 1213a to 1213c are formed with p-channel TFTs 1214 to 1216 as TFTs of one conductivity type. The output line 1211 from the decoder is input as a gate of the corresponding p-channel TFT 1214 (a first TFT of the one conductivity type). The p-channel TFT 1214 utilizes a ground power source wiring (GND) 1217 as its source, and a gate wiring 1218 as its drain. Moreover, the p-channel TFT 1215 (a second TFT of the one conductivity type) utilizes the ground power source line 1217 as its gate, a positive power source line ($V_{DH}$) 1219 as its source, and the gate wiring 1218 as its drain. The p-channel TFT 1215 is always in the ON state.

In other words, each of the buffers 1213a to 1213c in accordance with the present invention includes the first TFT of the one conductivity type (the p-channel TFT 1214), and further includes the second TFT of the one conductivity type (the p-channel TFT 1215) that is connected to the first TFT of the one conductivity type in series and utilizes the gate of the first TFT of the one conductivity type as the drain.

Furthermore, the p-channel TFT 1216 (a third TFT of the one conductivity type) employs a reset signal line (Reset) as its gate, the positive power source line 1219 as its source, and the gate wiring 1218 as its drain. It should be noted that the ground power source line 1217 may be replaced with a negative power source line (which is a power source line for providing a voltage that causes a p-channel TFT, to be used as a switching element of a pixel, to be in the ON state).

In this case, a channel width (indicated as W1) of the p-channel TFT 1215 and a channel width (indicated as W2) of the p-channel TFT 1214 satisfy the relationship of W1<W2. The channel width refers to a length of a channel formation region measured in the direction perpendicular to a channel length.

The buffer 1213a operates as follows. During a time period in which a positive voltage is being applied to the output line 1211, the p-channel TFT 1214 is in the OFF state (i.e., its channel is not formed). On the other hand, since the p-channel TFT 1215 is always in the ON state (i.e., its channel is formed), a voltage of the positive power source line 1219 is applied to the gate wiring 1218.

On the other hand, in the case where a negative voltage is applied to the output line 1211, the p-channel TFT 1214 comes into the ON state. In this case, since the channel width of the p-channel TFT 1214 is wider than that of the p-channel TFT 1215, the electrical potential of the gate wiring 1218 is pulled by an output on the side of the p-channel TFT 1214, thereby resulting in the electrical potential of the ground power source line 1217 being applied to the gate wiring 1218.

Accordingly, the gate wiring 1218 outputs a negative voltage (that causes the p-channel TFT, to be used as the switching element of the pixel, to be in the ON state) when a negative voltage is being applied onto the output line 1211, while always outputting a positive voltage (that causes the p-channel TFT, to be used as the switching element of the pixel, to be in the OFF state) when a positive voltage is being applied onto the output line 1211.

The p-channel TFT 1216 is used as a reset switch for forcing the gate wiring 1218, to which the negative voltage is being applied, to be pulled up to a positive voltage. Namely, after a selection period of the gate wiring 1218 is completed, a reset signal is input so that a positive voltage is applied to the gate wiring 1218. It should be noted that the p-channel TFT 1216 may be omitted.

Figure 30:
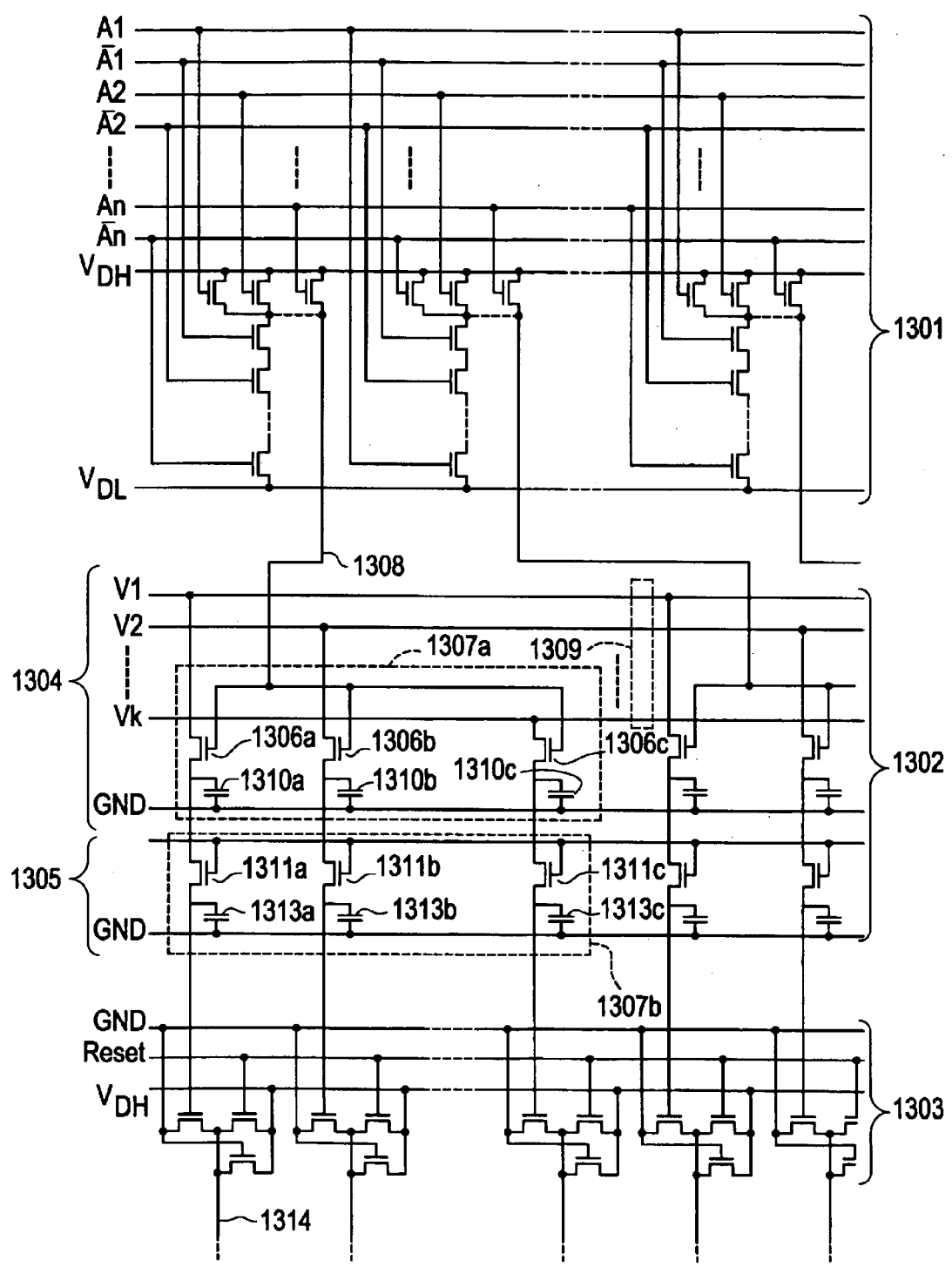
FIG. 30 is a diagram showing the structure of a source side driver circuit composed of p-channel TFTs.

With the gate-side driver circuit that operates in the above-described manner, the gate wirings are sequentially selected. Then, the structure of a source-side driver circuit is shown in FIG. 30. The source-side driver circuit as shown in FIG. 30 includes a decoder 1301, a latch 1302, and a buffer 1303. Since the decoder 1301 and the buffer 1303 have the identical structures with those of the gate-side driver circuit, respectively, descriptions therefore are omitted here.

In the case of the source-side driver circuit shown in FIG. 30, the latch 1302 is composed of a first-stage latch 1304 and a second-stage latch 1305. Each of the first-stage latch 1304 and the second-stage latch 1305 includes a plurality of basic units 1307 each composed of m p-channel TFTs 1306a to 1306c. An output line 1308 from the decoder 1301 is input to gates of the respective m p-channel TFTs 1306a to 1306c that form the basic unit 1307. It should be noted that the number m is any integer.

For example, in the case of the VGA display, the number of the source wirings is 640. In the case where m=1, the number of the NAND circuits required to be provided is also 640, while 20 selection lines (corresponding to 10 bits) are required to be provided. On the other hand, however, when m=8, the number of the necessary NAND circuits is 80 and the number of the necessary selection lines is 14 (corresponding to 7 bits). Namely, assuming that the number of the source wirings is M, the number of necessary NAND circuits can be expressed as M/m.

Sources of the p-channel TFTs 1306a to 1306c are connected to video signal lines (V1, V2, . . . , Vk) 1309, respectively. Namely, when a negative voltage is applied to an output line 1308, all of the p-channel TFTs 1306a to 1306c are simultaneously put into the ON state, so that video signals are taken into the corresponding p-channel TFTs 1306a to 1306c, respectively. The video signals thus taken in are retained in capacitors 1310a to 1310c, respectively, connected thereto.

Furthermore, the second-stage latch 1305 also includes a plurality of basic units 1307b each composed of m p-channel TFTs 1311a to 1311c. All of gates of the p-channel TFTs 1311a to 1311c are connected to a latch signal line 1312, so that when a negative voltage is applied to the latch signal line 1312, all of the p-channel TFTs 1311a to 1311c are simultaneously turned on.

As a result, the signals retained in the capacitors 1310a to 1310c, are then retained respectively in capacitors 1313a to 1313c connected to the p-channel TFTs 1311a to 1311c, and simultaneously output to the buffer 1303. Then, as described with reference to FIG. 30, those signals are output to the source wirings 1314 via the buffer. With the source-side driver circuit that operates in the above-described manner, the source wirings are sequentially selected.

As described in the above, by composing the gate-side driver circuit and the source-side driver circuit only of the p-channel TFTs, all of the pixel sections and the driver circuits can be entirely formed of the p-channel TFTs. Accordingly, upon fabrication of an active-matrix type display device, a fabrication yield and a throughput of the TFT steps can be significantly improved, thereby resulting in a reduced fabrication cost.

Embodiment 11

The semiconductor device of the present invention can be applied to the display device of various kind of electronic devices and various integrated circuit, or circuit usage substituted for heretofore integrated circuit. The following can be given as examples of this type of semiconductor devices: a portable information terminal (such as an electronic diary, a mobile computer, and a portable telephone), a video camera, a still camera, a personal computer, a television and a projector. Examples of these are shown in FIGS. 31 to 33.

Figure 31A:
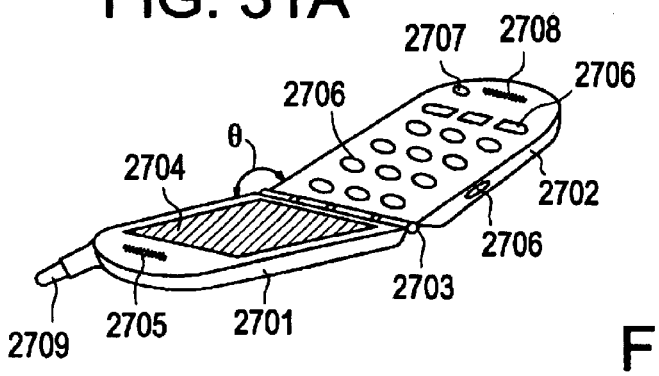
FIGS. 31A to 31E are diagrams showing examples of a semiconductor device.

FIG. 31A is a portable telephone, and is composed of a display panel 2701, an operation panel 2702, a connection portion 2703. A display panel 2701 is composed of a display device 2704, a sound output portion 2705 and an antenna 2709. An operation panel 2702 is composed of an operation key 2706, a power source switch 2702 and a sound input portion 2705. The present invention can form a display device 2704.

Figure 31B:
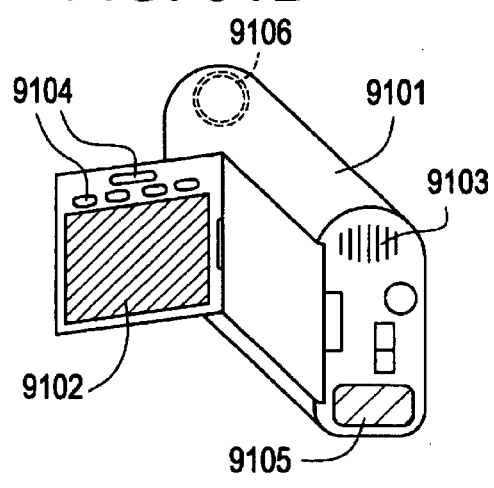

FIG. 31B is a video camera, and is composed of a main body 9101, a display device 9102, an audio input portion 9103, operation switches 9104, a battery 9105, and an image receiving portion 9106. The present invention can be applied to the display device 9102.

Figure 31C:
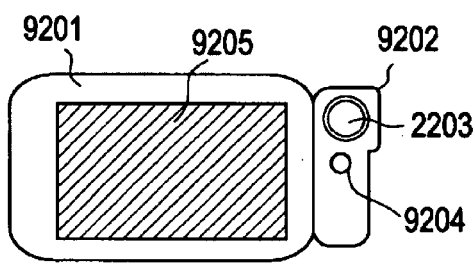
Figure 31D:
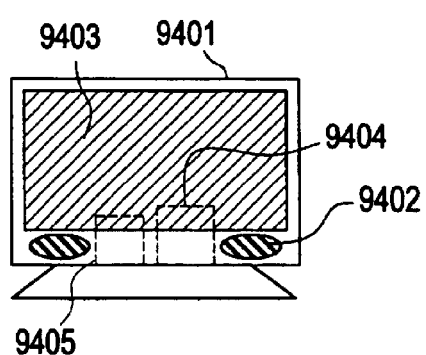

FIG. 31C is a mobile computer, or a portable type information terminal, and is composed of a main body 9201, a camera portion 9202, an image receiving portion 9203, operation switches 9204, and a display device 9205. The present invention can be applied to the display device 9205. FIG. 31D is a television, and is composed of components such as a main body 9401, speakers 9402, a display portion 9403, a signal receiving device 9404, and an amplifying device 9405. The present invention can be applied to the display portion 9403.

Figure 31E:
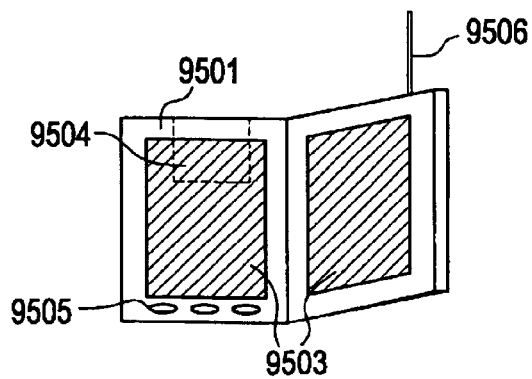

FIG. 31E is a portable book, and is composed of a main body 9501, a display device 9502, 9503, a recording medium 9504, operation switches 9504, and an antenna 9506, and is used for displaying data recorded on a mini-disk (MD) or a DVD (digital versatile disc), and for displaying data received by the antenna. The present invention can be applied to the display device 9502, 9503 and a recording medium 9504.

Figure 32A:
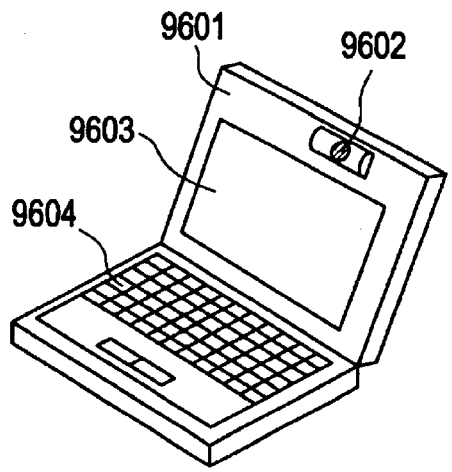
FIGS. 32A to 32C are diagrams showing examples of the semiconductor device.

FIG. 32A is a personal computer, and is composed of a main body 9601, an image input portion 9602, a display portion 9603, and a keyboard 9604. The present invention can be applied to the display portion 9601 and various kinds of incorporated integrated circuit.

Figure 32B:
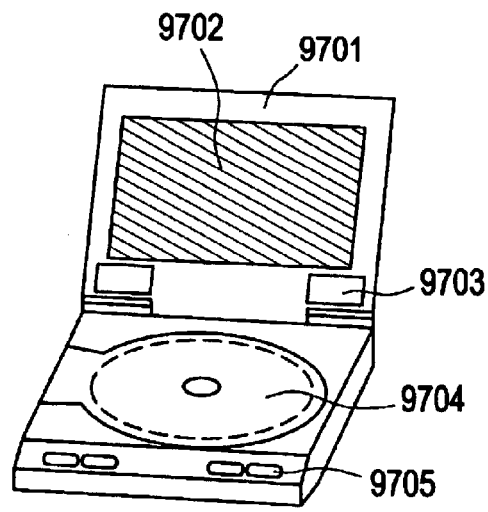

FIG. 32B is a player using a recording medium on which a program is recorded (hereafter referred to as a recording medium), and is composed of a main body 9701, a display device 9702, a speaker portion 9703, a recording medium 9704, and operation switches 9705. Note that media such as a DVD and a CD can be used as the recording medium for this device, and that the player can be used for music appreciation, film appreciation, games, and the Internet. The present invention can be applied to the display device 9702.

Figure 32C:
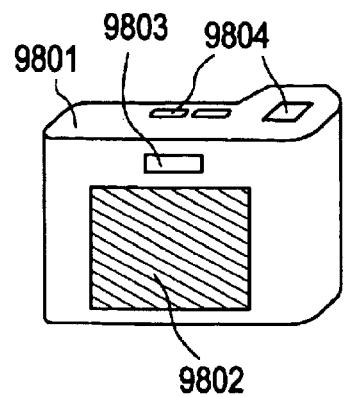

FIG. 32C is a digital camera, and is composed of a main body 9801, a display device 9802, an eyepiece portion 9803, operation switches 9804, and an image receiving portion (not shown in the figure). The present invention can be applied to the display device 9802.

Figure 33A:
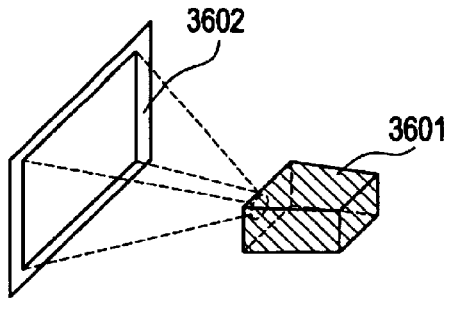
FIGS. 33A to 33D are diagrams showing examples of a projector.

FIG. 33A is a front type projector, and is composed of a projecting apparatus 3601 and a screen 3602. The present invention can be applied to the projecting apparatus 3601 and ather signal control circuit.

Figure 33B:
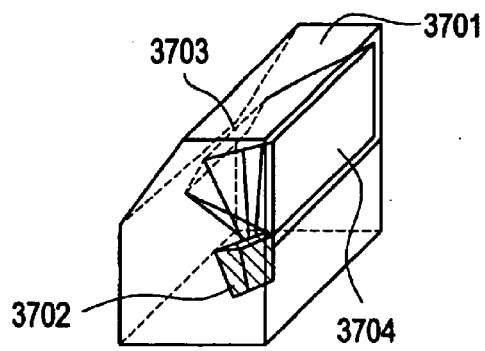

FIG. 33B is a rear type projector, and is composed of a main body 3701, a projecting apparatus 3702, a mirror 3703, and a screen 3704. The present invention can be applied to the projecting apparatus 3702 and other signal control circuit.

Figure 33C:
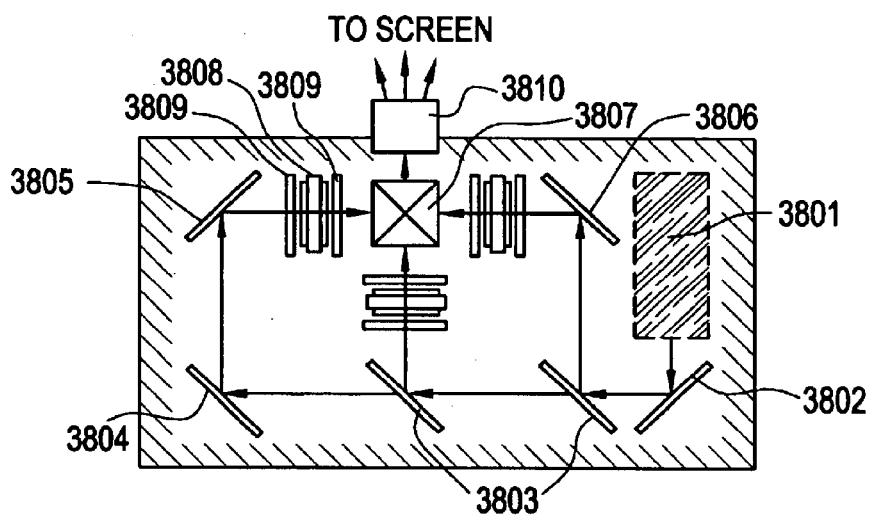

Note that an example of the structure of the projecting apparatuses 3601 and 3702 of FIG. 33A and FIG. 33B is shown in FIG. 33C. The projecting apparatuses 3601 and 3702 are composed of a light source optical system 3801, mirrors 3802 and 3804 to 3806, a dichroic mirror 3803, abeam splitter 3807, a liquid crystal display portion 3808, a phase difference plate 3809, and a projecting optical system 3810. The projecting optical system 3810 is an optical system including a plurality of projecting lenses. A three plate type example is shown in Embodiment 11, but there are no particular limitations, and a single plate type may also be used, for example. Further, optical systems such as an optical lens, a film having a light polarizing function, a film for regulating the phase, and an IR film may be suitably placed in the optical path shown by the arrow in FIG. 33C by the operator.

Figure 33D:
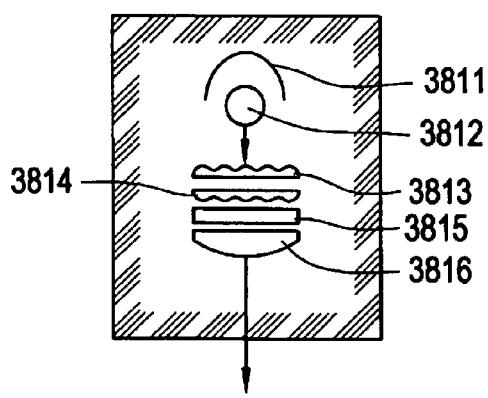

Furthermore, FIG. 33D is a diagram showing one example of the light source optical system 3801 in FIG. 33C. In Embodiment 11, the light source optical system 3801 is composed of a reflector 3811, a light source 3812, lens arrays 3813 and 3814, a polarizing transformation element 3815, and a condenser lens 3816. Note that the light source optical system shown in FIG. 33D is one example, and the light source optical system is not particularly limited to the structure shown in the figure. For example, optical systems such as an optical lens, a film having a light polarizing function, a film for regulating the phase, and an IR film may be suitably added by the operator to the light source optical system.

Though not shown in the figure, the present invention can be implemented when manufacturing a navigation system, a refrigerator, an electronic washing machine, a micro waved oven, telephone etc. using the image display device. The applicable scope of the present invention of this specification is thus extremely wide, and the present invention can be implemented various electronic devices.

Embodiment 12

An example of gettering method is shown in Embodiment Mode 3 in which a semiconductor film doped with phosphorus elements is used as a gettering site. In Embodiment 12, an example of another gettering method will be described below which uses as the gettering site a semiconductor film containing a noble gas element or a semiconductor film doped with a noble gas element. Gettering is generally known as a technique for lowering the impurity concentration in an active region of an element by segregation of a metal impurity element that has been taken into a semiconductor to a gettering site through some sort of energy.

Hereinafter descriptions will be given with reference to FIGS. 37A to 37E. First, a crystalline silicon film in which the ratio of the {101} plane orientation is high is obtained in accordance with Embodiment Mode 1.

Following Embodiment Mode 1, a substrate 2000 having an insulating surface is prepared. On the substrate 2000, a base insulating film 2001 is formed from an insulating film such as a silicon oxide film, a silicon nitride film, or a silicon oxynitride film ($SiO_xN_y$). Used here as the substrate 2000 and the base insulating film 2001 are a glass substrate and a two-layer structure laminate. The laminate consists of a first silicon oxynitride film formed to a thickness of 50 to 100 nm using as reaction gas $SiH_4$, $NH_3$ and $N_2O$ and a second silicon oxynitride film formed to a thickness of 100 to 150 nm using as reaction gas $SiH_4$ and $N_2O$. A single layer of silicon nitride film is preferably used as the base insulating film 2001. When a silicon nitride film is chosen, the base insulating film can have an effect of improving gettering efficiency in a later gettering step in addition to an effect of a blocking layer for preventing an alkaline metal contained in the glass substrate from diffusing into a semiconductor film to be formed later. During gettering, nickel tends to move toward a region having a high oxygen concentration, and hence to use a silicon nitride film as the base insulating film that is in contact with the semiconductor film is very effective. The base insulating film may have a laminate structure in which a silicon oxynitride film and a silicon nitride film are layered in order. Alternatively, it may take a three-layer structure in which a first silicon oxynitride film, a second silicon oxynitride film and a silicon nitride film are layered in order.

Figure 37A:
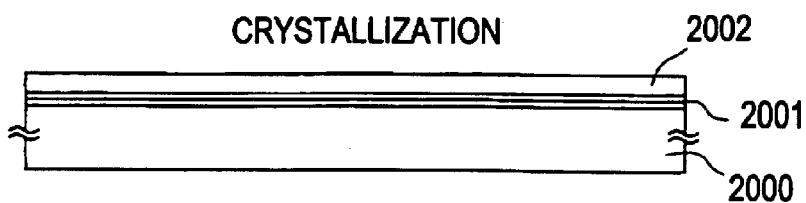
FIGS. 37A to 37E are diagrams illustrating a method of manufacturing a crystalline semiconductor film according to the present invention.
Figure 37B:
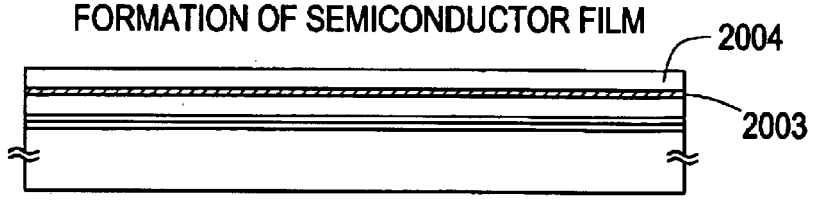
Figure 37C:
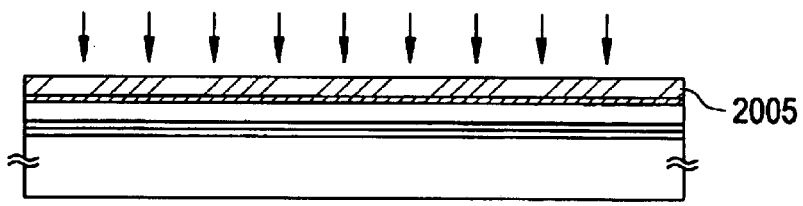

Subsequently, an amorphous semiconductor film is formed on the base insulating film by plasma CVD, low pressure CVD or sputtering. The amorphous semiconductor film is then crystallized as shown in Embodiment Mode 1 to form a crystalline silicon film 2002 containing germanium. (FIG. 37A)

In this embodiment, an amorphous silicon film containing germanium is formed by plasma CVD, where $SiH_4$ gas and $GeH_4$ gas which is diluted by $H_2$ to 10% is introduced in a reaction chamber and decomposed through glow discharge to be deposited on the base insulating film 2001. On the surface of the thus obtained amorphous silicon film containing germanium, a very thin oxide film is formed from an aqueous solution containing ozone. The oxide film is etched using a mixture of hydrofluoric acid and hydrogen peroxide to form a clean surface, and a very thin oxide film is again formed by treatment using an aqueous solution containing ozone. Thereafter, a nickel acetate solution containing 10 ppm of nickel by weight is applied to the entire surface by a spinner to form a nickel containing layer. Next, heat treatment is conducted at 500° C. for an hour so that hydrogen is released from the amorphous silicon film containing germanium. Then the film is subjected to heat treatment at 550° C. for four hours to crystallize the film. Note that, although the film is crystallized by heat treatment here, the crystallization may be achieved by irradiation with intense light emitted from a lamp light source. Examples of the lamp light source include a halogen lamp, a metal halide lamp, a xenon arc lamp, a carbon arc lamp, a high-pressure sodium lamp, and a high-pressure mercury lamp. If a lamp light source as given above is used, the lamp light source for heating is lit for 1 to 60 seconds, preferably 30 to 60 seconds, which is repeated 1 to 10 times, preferably 2 to 6 times. The intensity of light emitted from the lamp light source is set at discretion but the light has to heat up the semiconductor film instantly to 600 to 1000° C., preferably 650 to 750° C. Although the temperature is high, it only heats the semiconductor film in a minute and the substrate 2000 itself is not deformed.

Thus the amorphous silicon film containing germanium is crystallized and the crystalline silicon film 2002 containing germanium is obtained.

Since nickel tends to move toward a region having a high oxygen concentration during the later gettering treatment, the crystalline silicon film 2002 containing germanium is desirably formed so as to have an oxygen concentration of $5\times10^{18}$ atoms/cm$^3$ or less (by SIMS).

After the crystallization, the segregated metal element may be removed or reduced by an etchant containing hydrofluoric acid, such as diluted hydrofluoric acid or FPM (a mixture of hydrofluoric acid, hyperoxide and pure water). When the surface is etched using an etchant containing hydrofluoric acid, the surface is desirably leveled by irradiating it with intense light from one of the above lamp light sources.

Further irradiation of intense light may be performed using laser light or intense light from a lamp light source after the above crystallization in order to improve the crystallinity. For the laser light, excimer laser light having a wavelength of 400 nm or less, or the second harmonic or the third harmonic of a YAG laser can be used. The removal or reduction of the segregated metal element by an etchant containing hydrofluoric acid may be conducted after this laser light irradiation or irradiation of intense light from a lamp light source in order to improve the crystallinity. Then the surface may be leveled by irradiating it with intense light from a lamp light source.

Next, gettering treatment is conducted to remove the metal element in the crystalline silicon film 2002 containing germanium. First, a barrier layer 2003 is formed on the crystalline silicon film containing germanium. Formed as the barrier layer 2003 is a porous film through which the metal element (here, mainly nickel) can move to a gettering site but an etchant for use in the step of removing the gettering site cannot permeate. A chemical oxide film formed through treatment with ozone water, namely, a silicon oxide film (SiOx) is used here. In this specification, the film having the above property is particularly called a porous film. The barrier layer 2003 can be very thin, and it may be a naturally oxidized film or an oxide film obtained by generating ozone through irradiation of ultraviolet ray in an atmosphere containing oxygen.

Next, a semiconductor film 2004 to function as the gettering site in the subsequent gettering treatment is formed on the barrier layer 2003. (FIG. 37B) The semiconductor film 2004 may be a semiconductor film having an amorphous structure which is formed by plasma CVD, reduced pressure CVD or sputtering, or a semiconductor film having a crystal structure. The thickness of the semiconductor film 2004 is set to 5 to 50 nm, preferably 10 to 20 nm. Since nickel tends to move toward a region having a high oxygen concentration during the subsequent gettering treatment, the semiconductor film 2004 is desirably formed so as to have an oxygen concentration of $5\times10^{18}$ atoms/cm$^3$ or more, preferably $1\times10^{19}$ atoms/cm$^3$ or more (by SIMS) and improve the gettering efficiency. A semiconductor film formed under a condition that requires the presence of a noble gas element may also be used.

Here a semiconductor film 2005 containing a noble gas element (the gettering site) is formed by forming the film through plasma CVD or sputtering and then doping the film with a noble gas element through ion doping or ion implantation. (FIG. 37C) The semiconductor film here contains the noble gas element in a concentration of $1\times10^{17}$ to $5\times10^{21}$ atoms/cm , preferably $1\times10^{20}$ to $1\times10^{21}$ atoms/cm$^3$.

The noble gas element is one or more elements selected from the group consisting of He, Ne, Ar, Kr and Xe. These ions are accelerated by electric field and implanted in the semiconductor film, so that dangling bonds and lattice distortion are caused to form the gettering site. Of those, Ar is inexpensive and therefore desirable. The treatment time for doping of the noble gas element is short, about 1 or 2 minutes, yet the semiconductor film can be doped with a high concentration of noble gas element. Therefore, the throughput is remarkably improved compared with the gettering that uses phosphorus.

In addition to the noble gas element, the semiconductor film may be doped with one or more elements selected from the group consisting of H, $H_2$, O, $O_2$ and P. Doping using a plurality of elements provides synergetic effect for gettering. Though a noble gas element hardly diffuses, if the element used for doping in addition to the noble gas element easily diffuses, the semiconductor film containing the noble gas element is preferably formed rather thick so that the other element does not diffuse into the crystalline silicon film in heat treatment later. The barrier layer also has a function of preventing the other element from diffusing.

Then the gettering is conducted through heat treatment or irradiation of intense light from a lamp light source. If the film is gettered by heat treatment, the film is heated in a nitrogen atmosphere at 450 to 800° C. for one to twenty-four hours, for example, at 550° C. for fourteen hours. If the gettering is performed by irradiation of intense light from a lamp light source, the lamp light source is lit for heating is lit for 1 to 60 seconds, preferably 30 to 60 seconds, which is repeated 1 to 10 times, preferably 2 to 6 times. The intensity of light emitted from the lamp light source is set at discretion but the light has to heat up the semiconductor film instantly to 600 to 1000° C., preferably 700 to 750° C. The heat treatment and the irradiation of intense light from a lamp light source may be carried out simultaneously.

Figure 37D:

Through the gettering, nickel moves in the direction indicated by the arrow in FIG. 37D (longitudinal direction) to remove the metal element in the crystalline silicon film 2002 containing germanium which is covered with the barrier layer 2003 or reduce the concentration of the metal element. Compared with the gettering that uses phosphorus, the gettering including doping of a noble gas element is very effective. Furthermore, the film can be doped with a high concentration of noble gas element, e.g., $1 \times 10^{20}$ to $5 \times 10^{21}$ atoms/cm$^3$, thereby making it possible to increase the dose of the metal element used for crystallization. By increasing the dose of the metal element used for crystallization, the time required for crystallization can further be cut short. If not changing the crystallization treatment time, the increase in dose of the metal element used for crystallization lowers the temperature required for crystallization. Moreover, generation of natural nuclei can be reduced and a crystalline semiconductor film of excellent quality can be formed by increasing the dose of the metal element used for crystallization.

After the gettering treatment, the gettering site 2005 made of semiconductor film is removed by selective etching. The film may be etched by dry etching that uses $ClF_3$ but not plasma, or by wet etching that uses an alkaline solution such as an aqueous solution containing tetraethyl ammonium hydroxide (chemical formula: $(CH_3)_4NOH$). At this point, the barrier layer 2003 functions as an etching stopper. Then the barrier layer 2003 is removed using hydrofluoric acid.

Figure 37E:
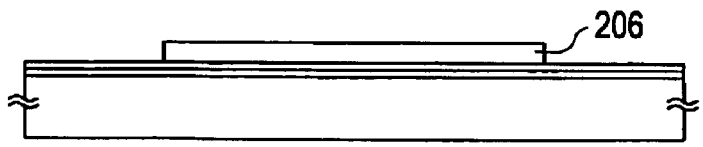

The obtained crystalline silicon film containing germanium is then etched to have a desired shape. Semiconductor films 2006 divided into island-like sections are thus formed. (FIG. 37E)

Figure 38:
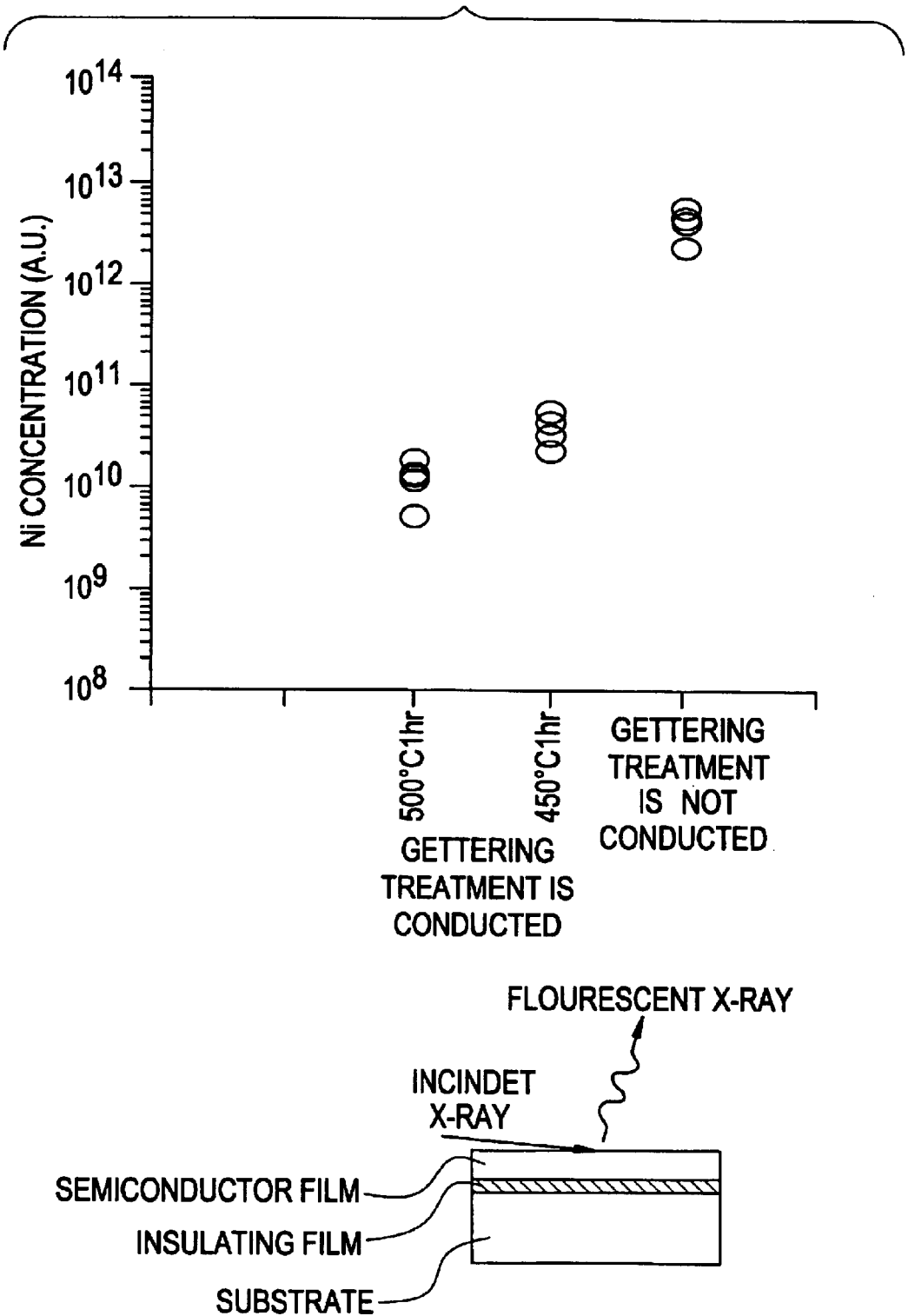
FIG. 38 is a graph showing the concentration of a metal element measured by TXRF before and after gettering treatment.

FIG. 38 shows the results of measuring the concentration of the metal element (here, nickel) before and after the gettering treatment by total reflection X-ray fluorescence spectroscopy (TXRF). TXRF is a measurement method in which an X-ray beam enters the film at a very small angle with respect to the film surface to detect a fluorescent X-ray emitted from impurities such as a metal element. TXRF provides information about the state of the film 3 to 5 nm deep from the surface, which can be used to estimate the concentration of nickel remaining in the crystalline silicon film. The detection sensibility is approximately $10^{10}$ atoms/cm$^2$.

In FIG. 38, the axis of ordinates shows the concentration of nickel. A sample that does not receive the gettering treatment has remaining nickel of $5 \times 10^{12}$ (arbitrary unit) whereas samples that receive the gettering treatment have a smaller amount of nickel. Thus the graph shows that the nickel concentration in the crystalline semiconductor film is reduced by the gettering treatment down to $\frac{1}{100}$. Comparing the heat treatment temperature for the gettering treatment, heat treatment at 500° C. can reduce nickel more than the heat treatment at 450° C.

As to the subsequent steps, follow the corresponding steps of Embodiment 1 and then a TFT can be completed. The crystalline silicon film containing germanium in accordance with this embodiment is high in {101} orientation ratio and sufficiently low in concentration of the metal element within the film. Therefore, when used as an active layer of a TFT, the crystalline silicon film can provide the TFT with excellent electric characteristics.

The example shown in this embodiment employs the crystallization of Embodiment Mode 1. However, the crystallization method is not particularly limited and the film may be crystallized in accordance with Embodiment Mode 2.

The gettering treatment shown in Embodiment Mode 3 may be conducted in addition to the gettering treatment of this embodiment.

An alternative gettering method may be employed in which nickel elements are sprayed on the base insulating film (e.g., a silicon nitride film) by sputtering, an amorphous silicon film containing germanium is formed, a barrier layer is formed, a semiconductor film containing a noble gas element is formed, and the amorphous silicon film is subjected to heat treatment or irradiation of intense light so that the crystallization and gettering are achieved simultaneously.

This embodiment may be combined freely with any one of Embodiments 1 through 11.

Embodiment 13

In the example of gettering method using phosphorus, which is shown in Embodiment Mode 3, phosphorus may be replaced by a noble gas element. Embodiment 13 is identical with Embodiment Mode 3 except for conditions of the doping, and therefore detailed descriptions are omitted here.

In this embodiment, the crystalline silicon film obtained in accordance with Embodiment Mode 1 or Embodiment Mode 2 is selectively doped with a noble gas element. Here, the film is doped with argon by ion doping (with a dose of $5 \times 10^{15}$ atoms/cm$^2$, for example) to form a region doped with argon (a gettering site). The concentration of the noble gas element doped into the gettering site is desirably set to $1 \times 10^{20}$ to $5 \times 10^{21}$ atoms/cm$^3$.

After the gettering site is formed, the crystalline silicon film is subjected to heat treatment or irradiation of intense light from a lamp light source to reduce or remove the metal element in the film.

This embodiment may be combined freely with any one of Embodiments 1 through 12.

According to the present invention, an amorphous semiconductor film containing silicon as its main ingredient and germanium in equal to and more than 0.1 atomic percent and equal to and less than 10 atomic percent is doped with a metal element. The amorphous semiconductor film is then crystallized by heat treatment to form a crystalline semiconductor film. 20% or more of the crystalline semiconductor film is the {101} lattice plane that forms an angle of equal to or less than 10 degree with respect to the surface of the crystalline semiconductor film, the plane being detected by the EBSP method, 3% or less of the crystalline semiconductor film is the {001} lattice plane that forms an angle of equal to or less than 10 degree with respect to the surface of crystalline semiconductor film, and 5% or less of the crystalline semiconductor film is the {111} lattice plane that forms an angle of equal to or less than 10 degree with respect to the surface of crystalline semiconductor film. The crystalline semiconductor film can be used to form a channel formation region of a thin film transistor.

A TFT formed from such a crystalline semiconductor film that is high in ratio of the {110} lattice plane orientation can be used as a TFT for manufacturing an active matrix liquid crystal display device or a display device whose pixel portion is composed of light emitting elements. The TFT according to the present invention can also be used as a TFT constituting a thin film integrated circuit that is to replace the conventional LSI formed from a semiconductor substrate.

What is claimed is:

1. A semiconductor device comprising:
   a crystalline semiconductor film;
   a channel formation region provided in the crystalline semiconductor film, the crystalline semiconductor film comprising silicon and germanium at least in the channel formation region;
   a source region and a drain region sandwiching the channel formation region therebetween;
   a gate electrode provided adjacent to the channel formation region with a gate insulating film therebetween; and
   an impurity region provided between the channel formation region and at least one of the source region and the drain region and comprising a part overlapping the gate electrode,
   wherein 20% or more of the channel formation region is the {101} lattice plane that forms an angle of equal to or less than 10 degree with respect to the surface of the crystalline semiconductor film, the plane being detected by an electron backscatter diffraction pattern method;
   3% or less of the channel formation region is the {001} lattice plane that forms an angle of equal to or less than 10 degree with respect to the surface of the crystalline semiconductor film;
   5% or less of the channel formation region is the {111} lattice plane that forms an angle of equal to or less than 10 degree with respect to the surface of the crystalline semiconductor film; and
   secondary ion mass spectroscopy is conducted on the channel formation region to reveal that the region contains less than $5 \times 10^{18}$ nitrogen atoms per $cm^3$, less than $5 \times 10^{18}$ carbon atoms per $cm^3$, and less than $1 \times 10^{19}$ oxygen atoms per $cm^3$.

2. A device according to claim 1, wherein the crystalline semiconductor film contains germanium in a concentration of equal to or more than 0.1 atomic percent and equal to or less than 10 atomic percent.

3. A device according to claim 1, wherein the crystalline semiconductor film has a thickness of 20 to 100 nm.

4. A device according to claim 1, wherein the spacing in the lattice plane that is horizontal to the surface of the crystalline semiconductor film is different from the spacing in the lattice plane inclined 60 degree with respect to the surface of the crystalline semiconductor film, and the difference is more than 0 and equal to or less than 0.002 nm in terms of lattice constant.

5. A device according to claim 1, wherein the semiconductor device is a device selected from the group consisting of a cellular phone, a video camera, a portable information terminal, a television broadcasting receiving unit, an electronic book, a personal computer, a DVD player and a digital still camera.

6. A device according to claim 1, wherein the channel formation region contains the metal element in a concentration of less than $1 \times 10^{17}$ atoms/$cm^3$.

7. A device according to claim 6, wherein one or more elements are selected, as the metal element, from the group consisting of Fe, Co, Ni, Ru, Rh, Pd, Os, Ir, Pt, Cu and Au.

8. A semiconductor device comprising:
   a crystalline semiconductor film;
   a channel formation region provided in the crystalline semiconductor film, the crystalline semiconductor film comprising silicon and germanium at least in the channel formation region;
   a source region and a drain region sandwiching the channel formation region therebetween;
   a gate electrode provided adjacent to the channel formation region with a gate insulating film therebetween; and
   an impurity region provided between the channel formation region and at least one of the source region and the drain region and comprising a part overlapping the gate electrode,
   wherein 20% or more of the channel formation region is the {101} lattice plane that forms an angle of equal to or less than 10 degree with respect to the surface of the crystalline semiconductor film, the plane being detected by an electron backscatter diffraction pattern method;
   3% or less of the channel formation region is the {001} lattice plane that forms an angle of equal to or less than 10 degree with respect to the surface of the crystalline semiconductor film;
   5% or less of the channel formation region is the {111} lattice plane that forms an angle of equal to or less than 10 degree with respect to the surface of the crystalline semiconductor film; and
   secondary ion mass spectroscopy is conducted on the channel formation region to reveal that the region contains less than $5 \times 10^{18}$ nitrogen atoms per $cm^3$, less than $5 \times 10^{18}$ carbon atoms per $cm^3$, and less than $1 \times 10^{19}$ oxygen atoms per $cm^3$,
   the crystalline semiconductor film contains germanium in a concentration of equal to or more than 0.1 atomic percent and equal to or less than 10 atomic percent at least in the channel region.

9. A device according to claim 8, wherein the crystalline semiconductor film has a thickness of 20 to 100 nm.

10. A device according to claim 8, wherein the spacing in the lattice plane that is horizontal to the surface of the crystalline semiconductor film is different from the spacing in the lattice plane inclined 60 degree with respect to the surface of the crystalline semiconductor film and the difference is more than 0 and equal to or less than 0.002 nm in terms of lattice constant.

11. A device according to claim 8, wherein the semiconductor device is a device selected from the group consisting of a cellular, phone, a video camera, a portable information terminal, a television broadcasting receiving unit, an electronic book, a personal computer a DVD player and a digital still camera.

12. A device according to claim 8, wherein the channel formation region contains the metal element in a concentration of less than $1 \times 10^{17}$ atoms/$cm^3$.

13. A device according to claim 12, wherein one or more elements are selected, as the metal element, from the group consisting of Fe, Co, Ni. Ru, Rh, Pd, Os, Ir, Pt, Cu and Au.

14. A semiconductor device whose pixel portion and driver circuit are formed over a same insulator, the driver circuit is composed of an n-channel thin film transistor and a p-channel thin film transistor;

at least the n-channel thin film transistor comprising;

a crystalline semiconductor film;

a channel formation region provided in the crystalline semiconductor film, the crystalline semiconductor film comprising silicon and germanium at least in the channel formation region;

a source region and a drain region sandwiching the channel formation region therebetween;

a gate electrode provided adjacent to the channel formation region with a gate insulating film therebetween; and an impurity region provided between the channel formation region and at least one of the source region and the drain region and comprising a part overlapping the gate electrode, wherein 20% or more of the crystalline semiconductor film is the {101} lattice plane that forms an angle of equal to or less than 10 degree with respect to the surface of the crystalline semiconductor film, the plane being detected by an electron backscatter diffraction pattern method;

3% or less of the crystalline semiconductor film is the {001} lattice plane that forms an angle of equal to or less than 10 degree with respect to the surface of the crystalline semiconductor film;

5% or less of the crystalline semiconductor film is the {111} lattice plane that forms an angle of equal to or less than 10 degree with respect to the surface of the crystalline semiconductor film; and secondary ion mass spectroscopy is conducted on the crystalline semiconductor film to reveal that the film contains less than $5 \times 10^{18}$ nitrogen atoms per cm$^3$, less than $5 \times 10^{18}$ carbon atoms per cm$^3$, and less than $1 \times 10^{19}$ oxygen atoms per cm$^3$.

15. A device according to claim 14, wherein the crystalline semiconductor film contains germanium in a concentration of equal to or more than 0.1 atomic percent and equal to or less than 10 atomic percent.

16. A device according to claim 14, wherein the crystalline semiconductor film has a thickness of 20 to 100 nm.

17. A device according to claim 14, wherein the spacing in the lattice plane that is horizontal to the surface of the crystalline semiconductor film is different from the spacing in the lattice plane inclined 60 degree with respect to the surface of the crystalline semiconductor film, and the difference is more than 0 and equal to or less than 0.002 nm in terms of lattice constant.

18. A device according to claim 14, wherein the semiconductor device is a device selected from the group consisting of a cellular phone, a video camera, a portable information terminal, a television broadcasting receiving unit, an electronic book, a personal computer, a DVD player and a digital still camera.

19. A device according to claim 14, wherein the driver circuit includes a decoder composed of a plurality of NAND circuits.

20. A device according to claim 14, wherein the channel formation region contains the metal element in a concentration of less than $1 \times 10^{17}$ atoms/cm$^3$.

21. A device according to claim 20, wherein one or more elements are selected, as the metal element, from the group consisting of Fe, Co, Ni, Ru, Rh, Pd, Os, Ir, Pt, Cu and Au.

22. A semiconductor device having a pixel thin film transistor over an insulator, said pixel thin film transistor comprising:

a crystalline semiconductor film;

a channel formation region provided in the crystalline semiconductor film, the crystalline semiconductor film comprising silicon and germanium at least in the channel formation region;

a source region and a drain region sandwiching the channel formation region therebetween;

a gate electrode provided adjacent to the channel formation region with a gate insulating film therebetween; and an impurity region provided between the channel formation region and at least one of the source region and the drain region and comprising a part overlapping the gate electrode, wherein 20% or more of the channel formation region is the {101} lattice plane that forms an angle of equal to or less than 10 degree with respect to the surface of the crystalline semiconductor film, the plane being detected by an electron backscatter diffraction pattern method;

3% or less of the channel formation region is the {001} lattice plane that forms an angle of equal to or less than 10 degree with respect to the surface of the crystalline semiconductor film;

5% or less of the channel formation region is the {111} lattice plane that forms an angle of equal to or less than 10 degree with respect to the surface of the crystalline semiconductor film; and secondary ion mass spectroscopy is conducted on the channel formation region to reveal that the region contains less than $5 \times 10^{18}$ nitrogen atoms per cm$^3$, less than $5 \times 10^{18}$ carbon atoms per cm$^3$, and less than $1 \times 10^{19}$ oxygen atoms per cm$^3$.

23. A device according to claim 22, wherein the crystalline semiconductor film contains germanium in a concentration of equal to or more than 0.1 atomic percent and equal to or less than 10 atomic percent.

24. A device according to claim 22, wherein the crystalline semiconductor film has a thickness of 20 to 100 nm.

25. A device according to claim 22, wherein the spacing in the lattice plane that is horizontal to the surface of the crystalline semiconductor film is different from the spacing in the lattice plane inclined 60 degree with respect to the surface of the crystalline semiconductor film, and the difference is more than 0 and equal to or less than 0.002 nm in terms of lattice constant.

26. A device according to claim 22, wherein the semiconductor device is a device selected from the group consisting of a cellular phone, a video camera, a portable information terminal, a television broadcasting receiving unit, an electronic book, a personal computer, a DVD player and a digital still camera.

27. A device according to claim 22, wherein the channel formation region contains the metal element in a concentration of less than $1 \times 10^{17}$ atoms/cm$^3$.

28. A device according to claim 27, wherein one or more elements are selected, as the metal element, from the group consisting of Fe, Co, Ni, Ru, Rh, Pd, Os, Zr, Pt, Cu and Au.

* * * * *